(12) United States Patent
Misaka

(10) Patent No.: US 7,361,436 B2
(45) Date of Patent: Apr. 22, 2008

(54) PATTERN FORMATION METHOD

(75) Inventor: Akio Misaka, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 350 days.

(21) Appl. No.: 11/298,741

(22) Filed: Dec. 12, 2005

(65) Prior Publication Data
US 2006/0121366 A1 Jun. 8, 2006

Related U.S. Application Data

(62) Division of application No. 10/399,762, filed as application No. PCT/JP02/03976 on Apr. 22, 2002, now Pat. No. 7,060,395.

(30) Foreign Application Priority Data

| May 1, 2001 | (JP) | ............................ 2001-133802 |
| Jan. 8, 2002 | (JP) | ............................ 2002-001033 |

(51) Int. Cl.
*G03F 1/00* (2006.01)
(52) U.S. Cl. .......................................... 430/5
(58) Field of Classification Search .................... 430/5, 430/311, 320, 322; 716/19
See application file for complete search history.

(56) References Cited

U.S. PATENT DOCUMENTS 5,718,829 A 2/1998 Pierrat

FOREIGN PATENT DOCUMENTS

| JP | 3-11345 | 1/1991 |
| JP | 3-177841 | 8/1991 |
| JP | 05-297565 | 11/1993 |
| JP | 05-297566 | 11/1993 |
| JP | 9-115809 | 5/1997 |
| JP | 09-115809 A | 5/1997 |
| JP | 9-127676 | 5/1997 |
| JP | 9-127677 | 5/1997 |
| JP | 2000-10255 | 1/2000 |
| JP | 2000-10255 A | 1/2000 |
| JP | 2000-105451 | 4/2000 |
| WO | WO 01/35166 A1 | 5/2001 |

OTHER PUBLICATIONS

Liu et al., "The Application of Alternating Phase-shifting Masks to 140 nm Gate Patterning (II): Mask Design and Manufacturing Tolerances", SPIE, vol. 3334, pp. 2-14, Feb. 25-27, 1998.

*Primary Examiner*—S. Rosasco
(74) *Attorney, Agent, or Firm*—McDermott Will & Emery LLP

(57) ABSTRACT

A mask pattern 40 including a light-shielding portion 41 constituted by a light-shielding film made of a chromium film or the like and phase shifters 42 and 43 is formed on a transparent substrate 30. The phase shifters 42 and 43 generate a phase difference of 180 degrees with respect to exposure light between the phase shifters and the transparent substrate 30. A first light intensity generated in a light-shielded image formation region corresponding to the mask pattern 40 on an exposed material by the exposure light transmitted through the phase shifters 42 and 43 is not more than four times a second light intensity generated in the light-shielded image formation region by the exposure light that is transmitted through the periphery of the mask pattern 40 on the transparent substrate 30 and goes into the back side of the mask pattern 40.

26 Claims, 56 Drawing Sheets

Fig. 6
(a)
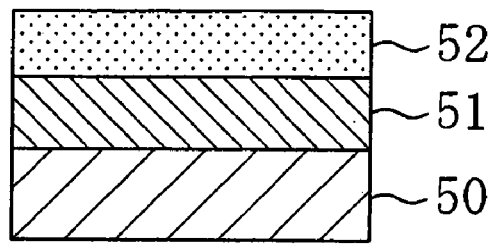
(b)
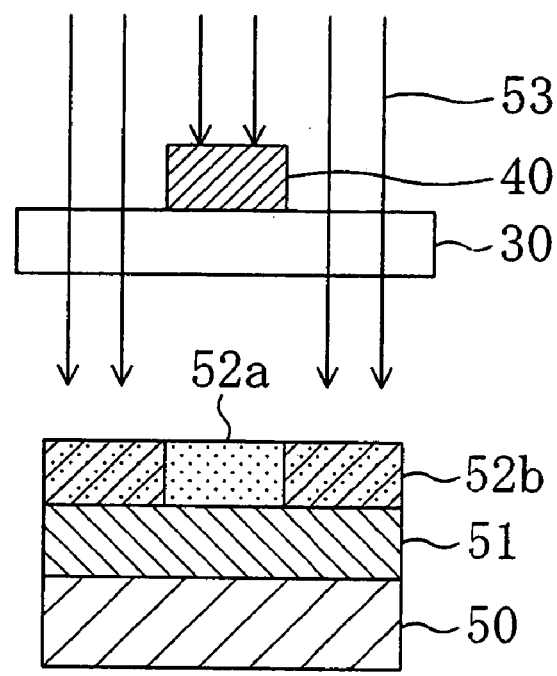
(c)
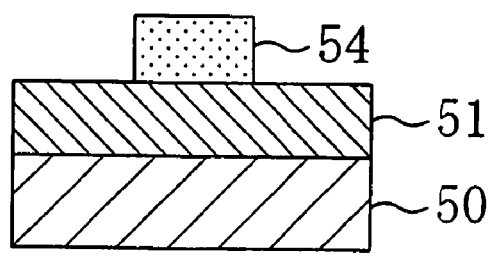

Fig. 8
(a)
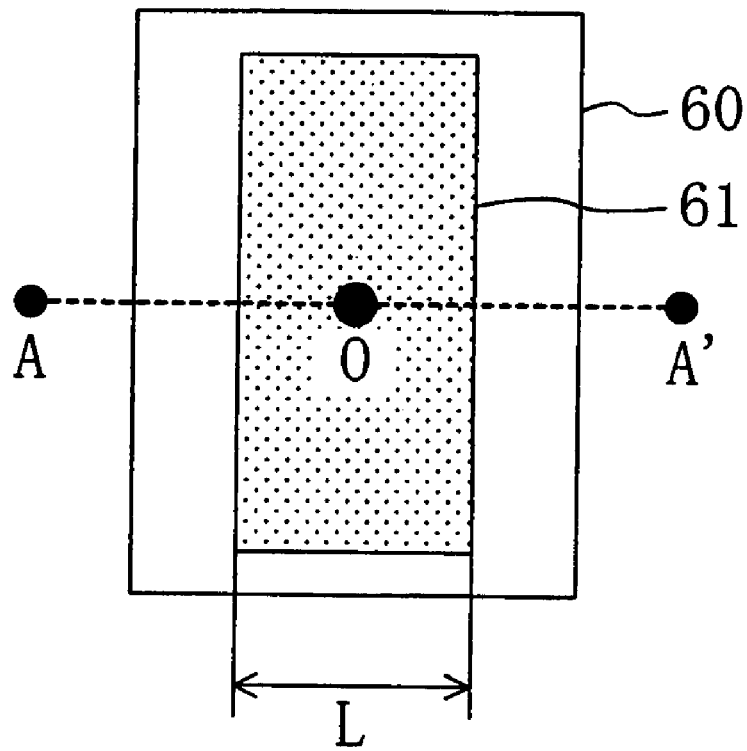
(b)
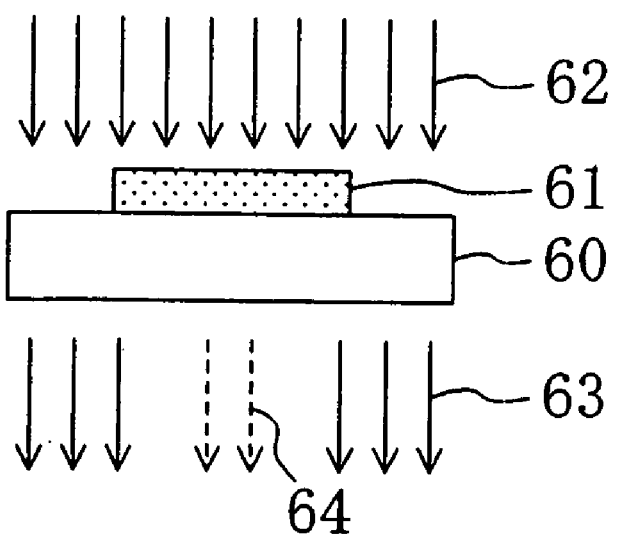

Fig. 9
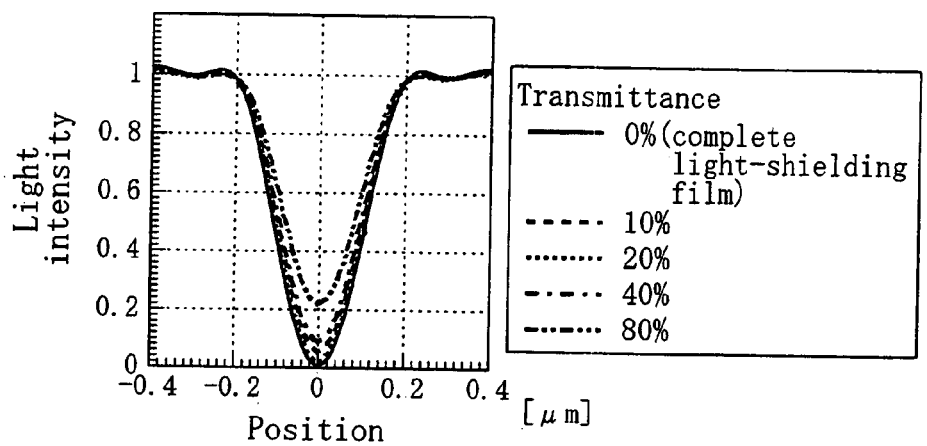
(a)
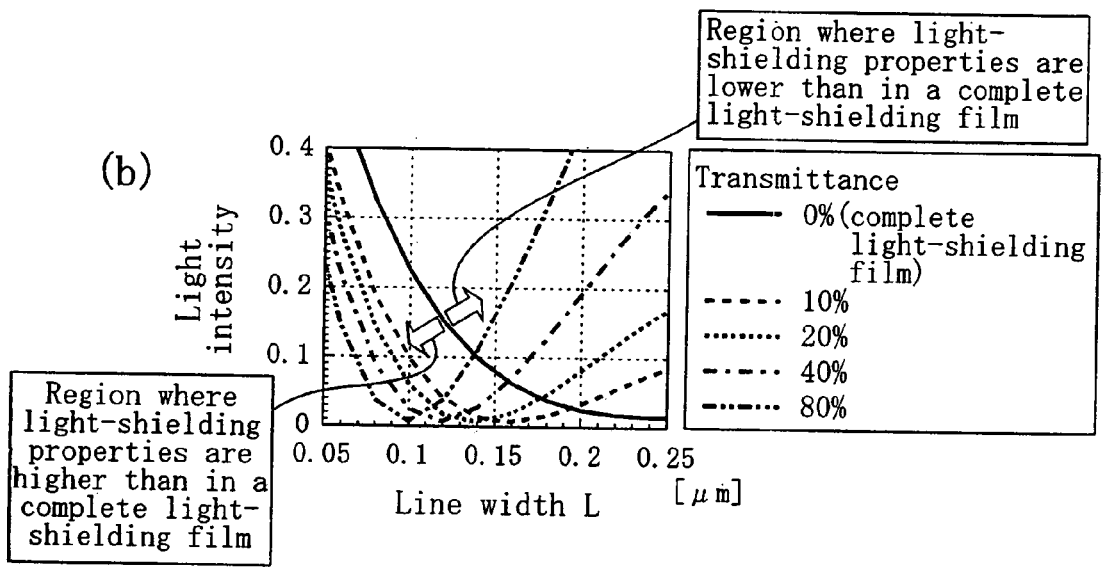
(b)
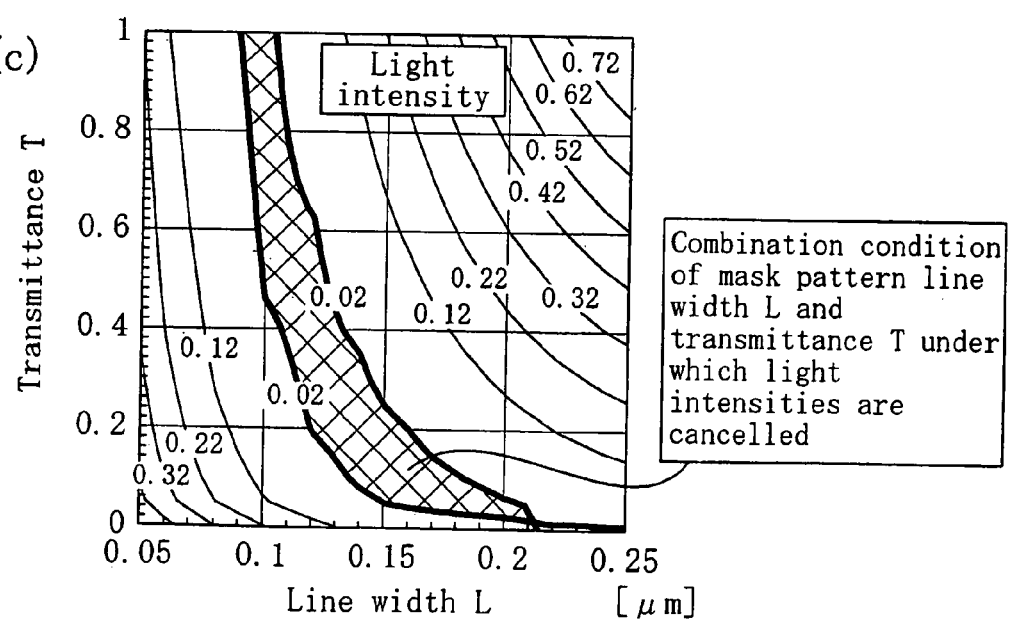
(c)

Fig. 11
(a) Regular exposure (Light source shape)
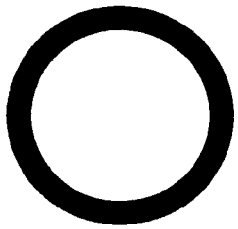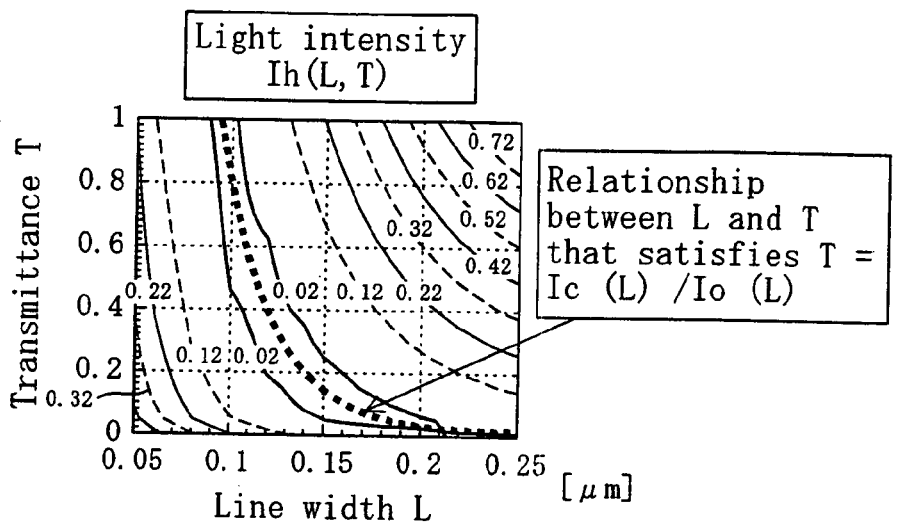
(b) Annular exposure (Light source shape)
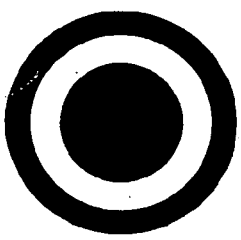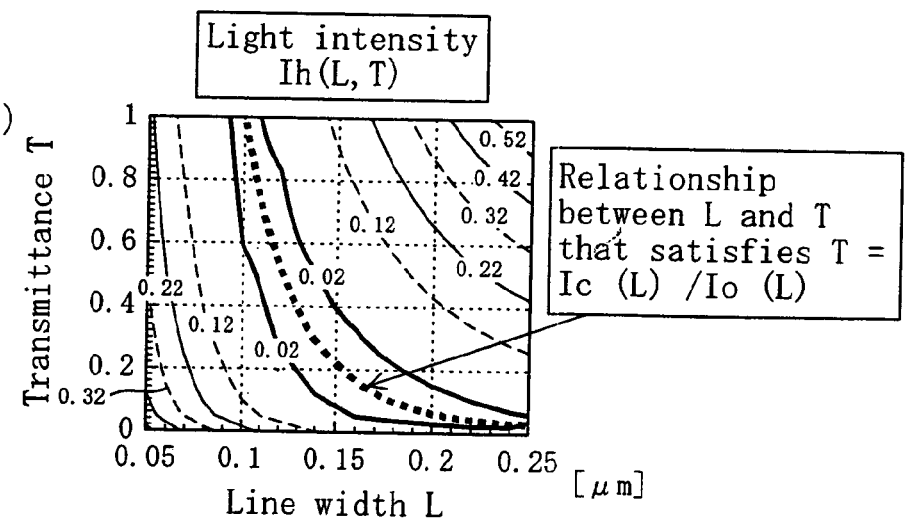
(c) Quadrupole exposure (Light source shape)
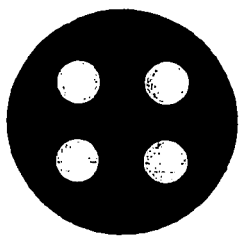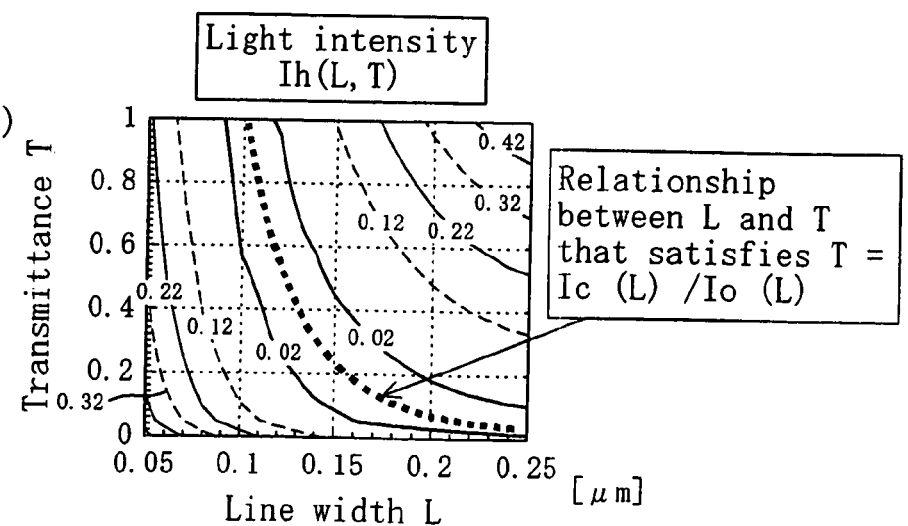

Fig. 13
(a) Regular exposure (Light source shape)
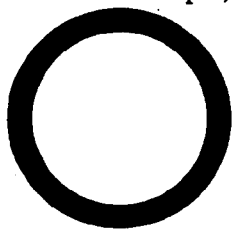
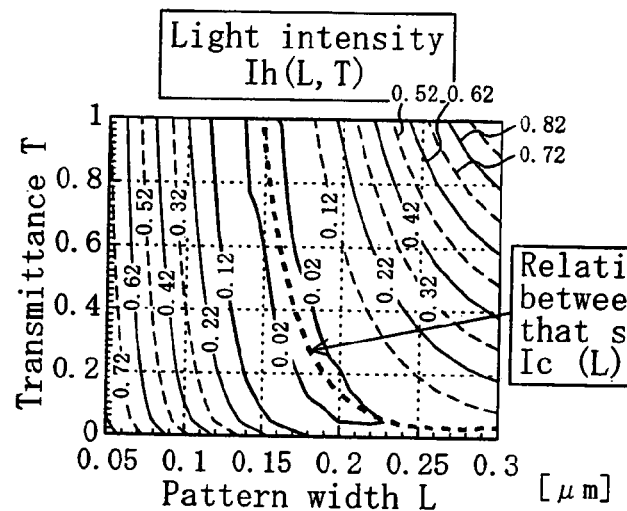
(b) Annular exposure (Light source shape)
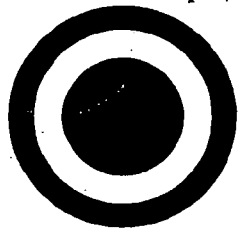
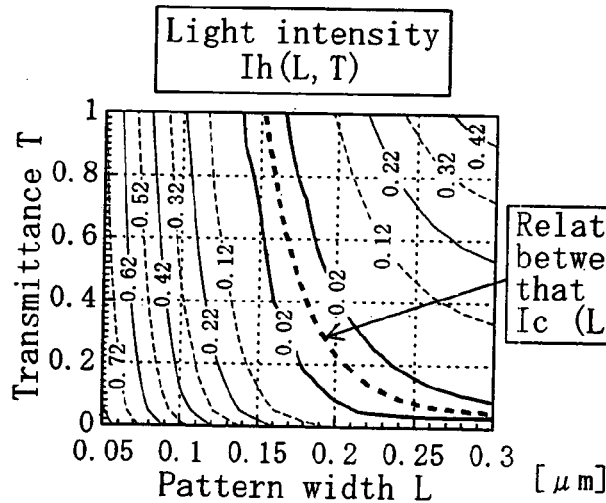
(c) Quadrupole exposure (Light source shape)
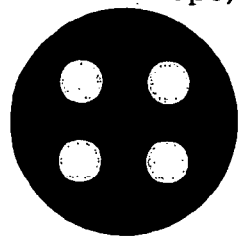
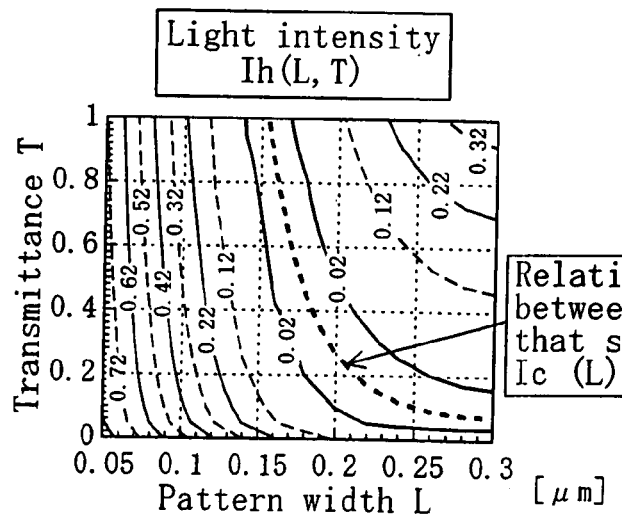

Fig. 14
(a) Regular exposure (Light source shape)
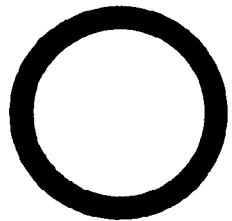
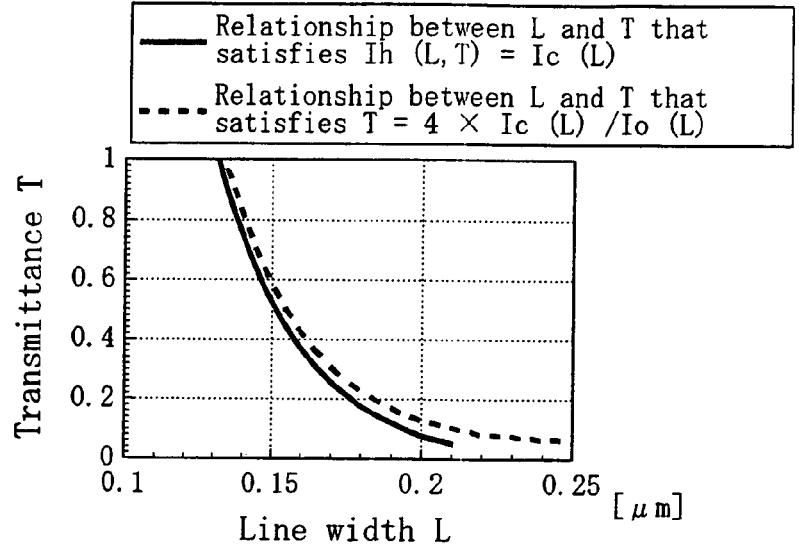
(b) Annular exposure (Light source shape)
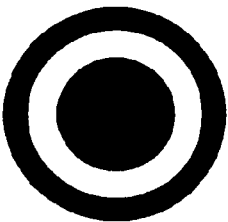
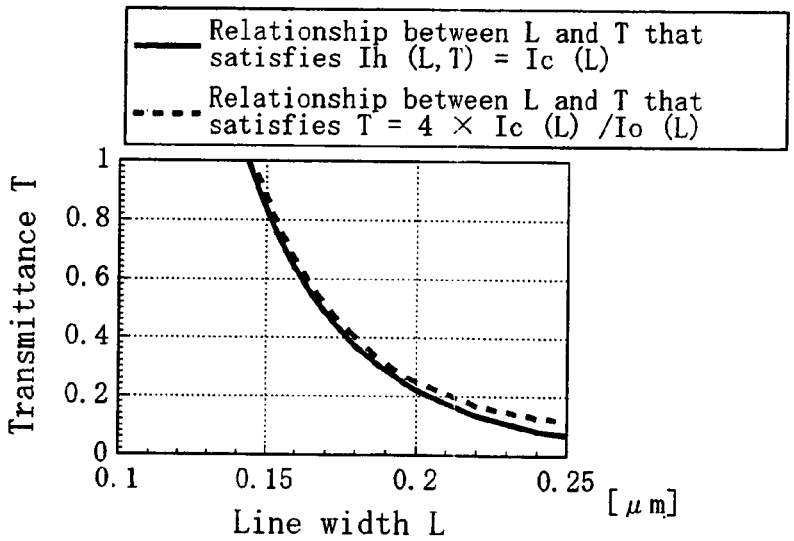
(c) Quadrupole exposure (Light source shape)
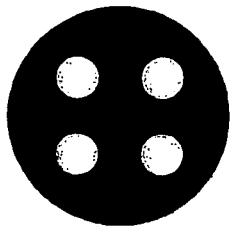
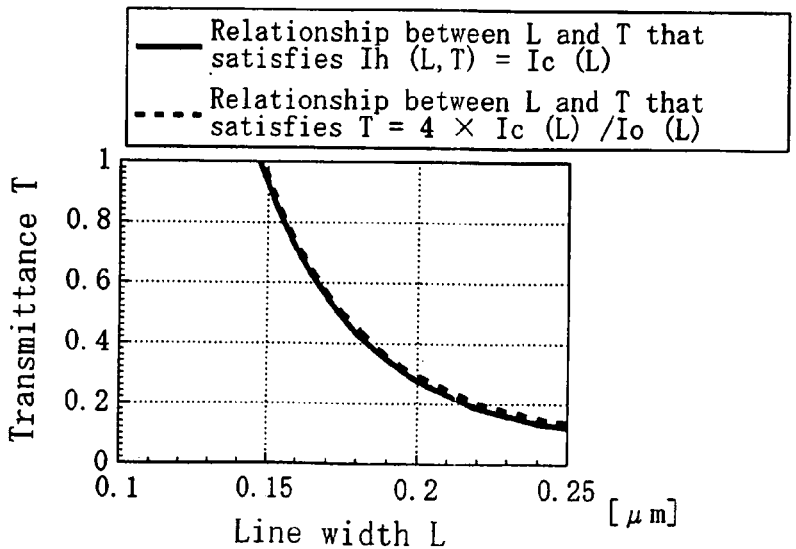

Fig. 16
(a) 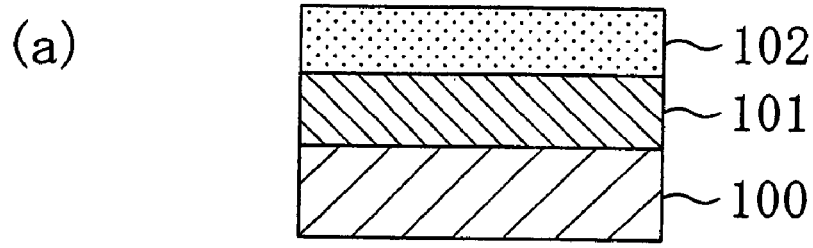
(b) 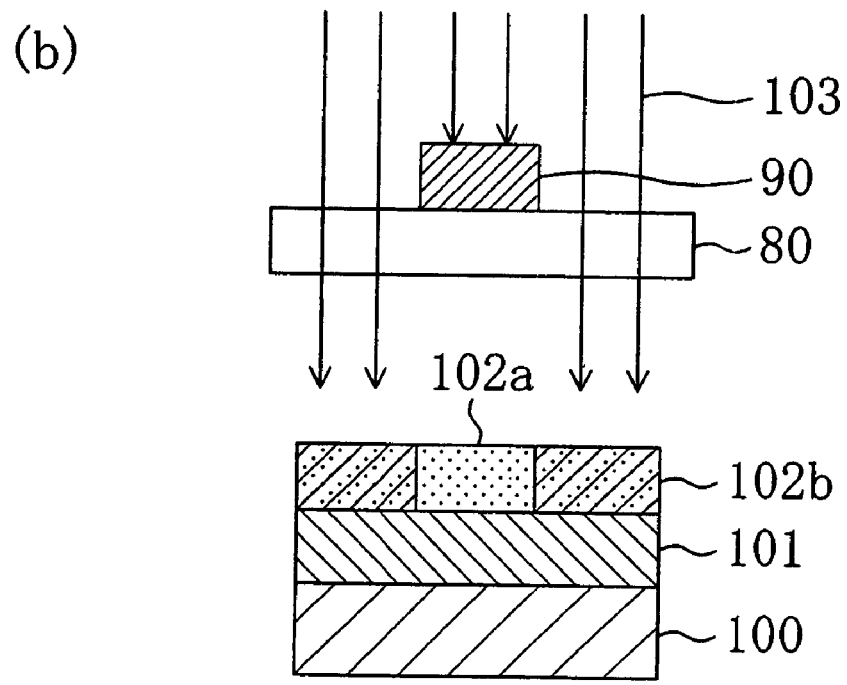
(c) 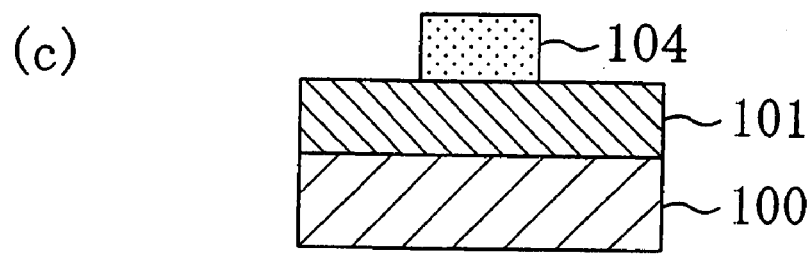

Fig. 17
(a) 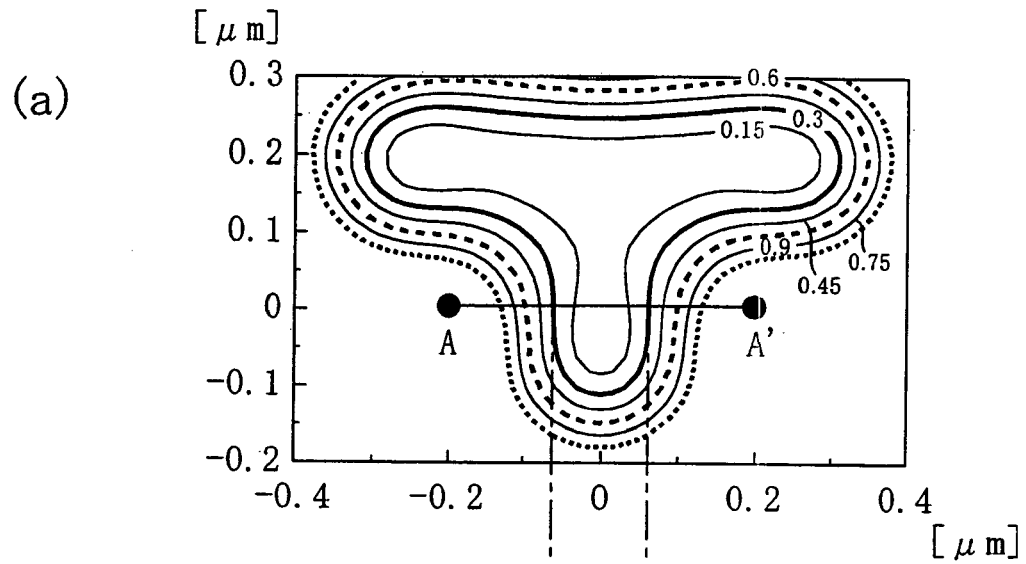
(b) 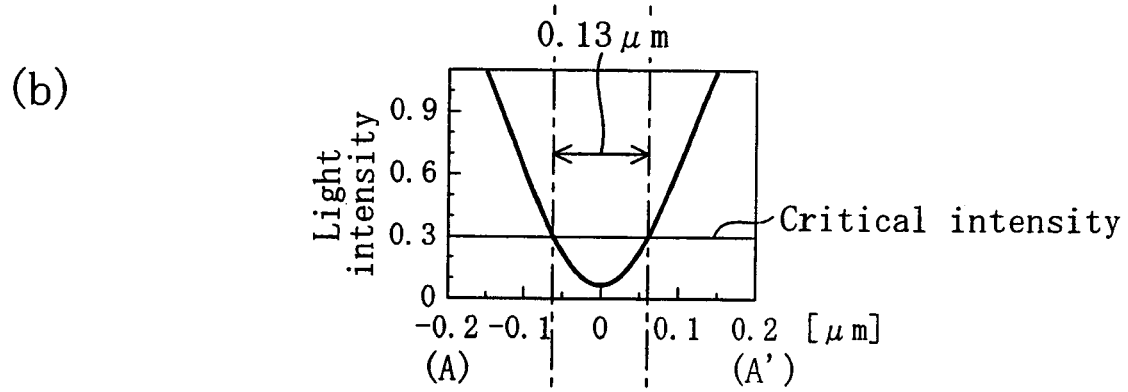
(c) 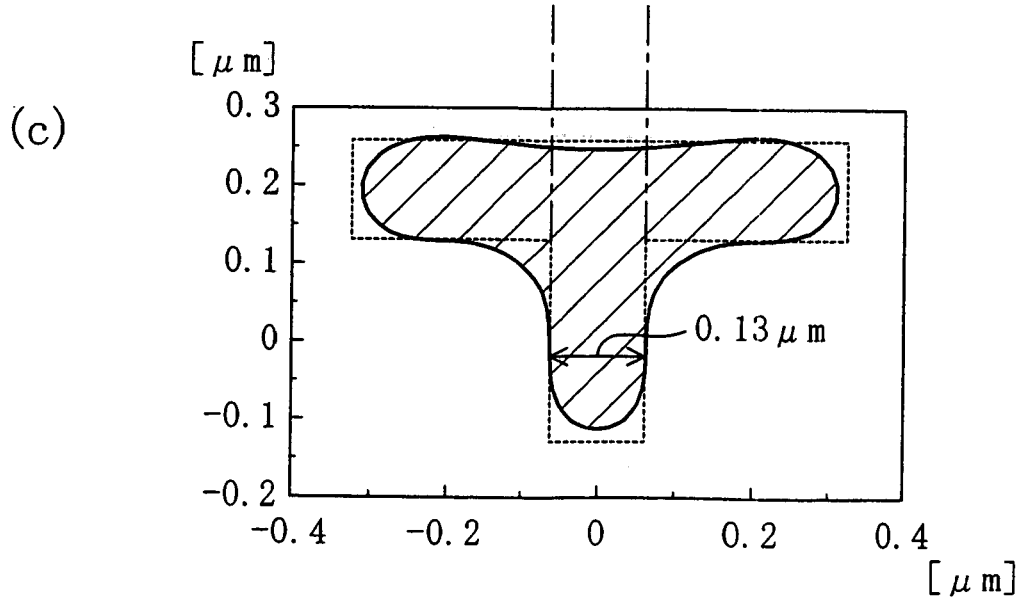

Fig. 18
(a)
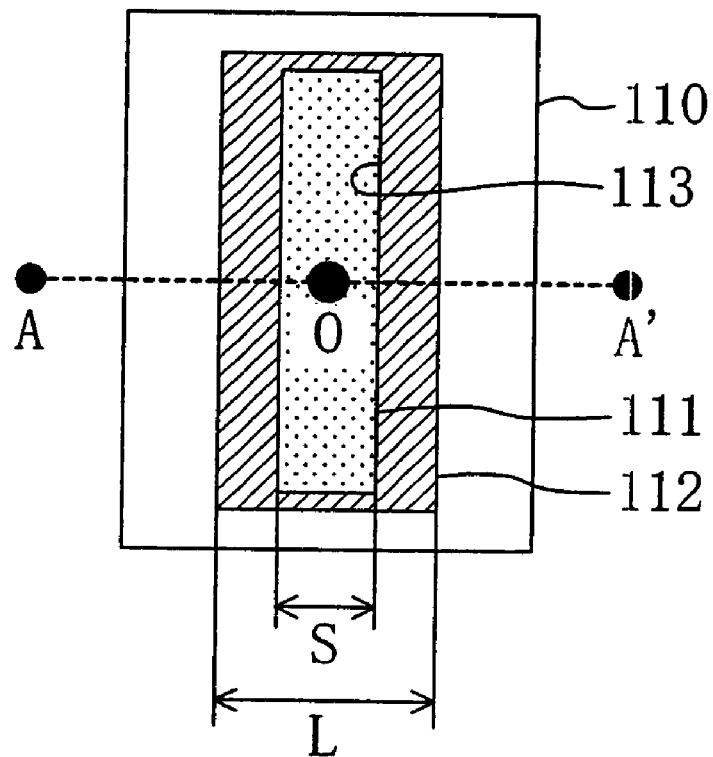
(b)
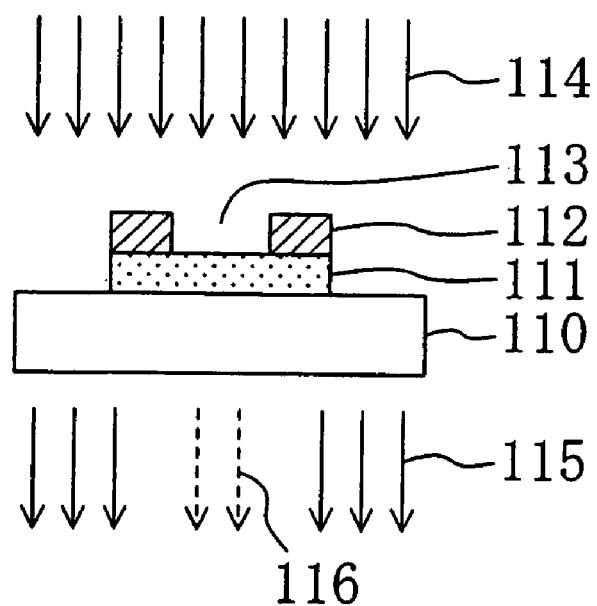

Fig. 19
(a)
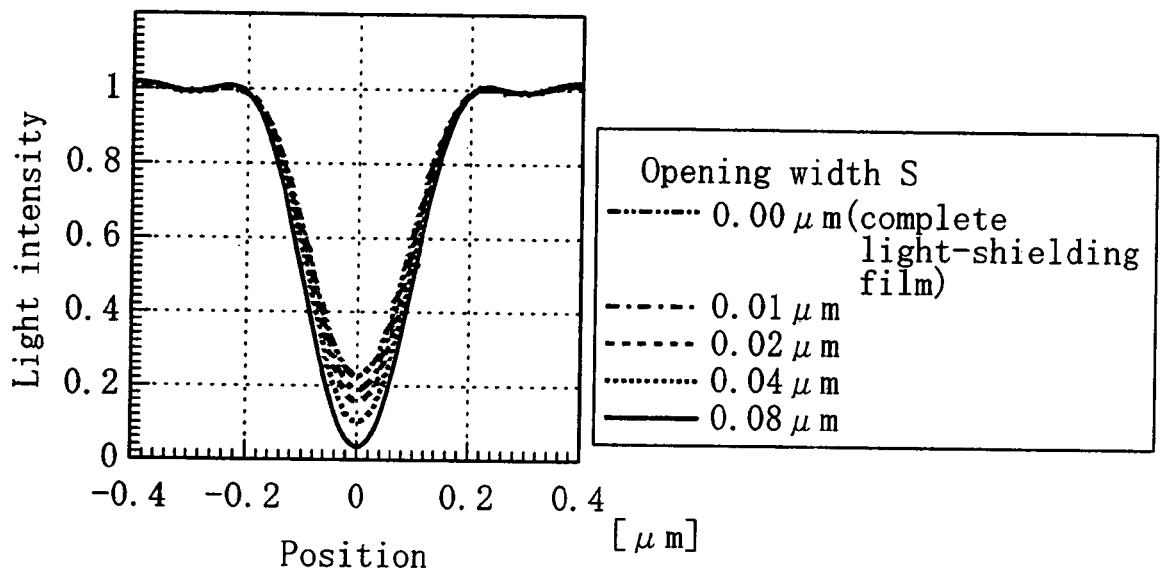
(b)
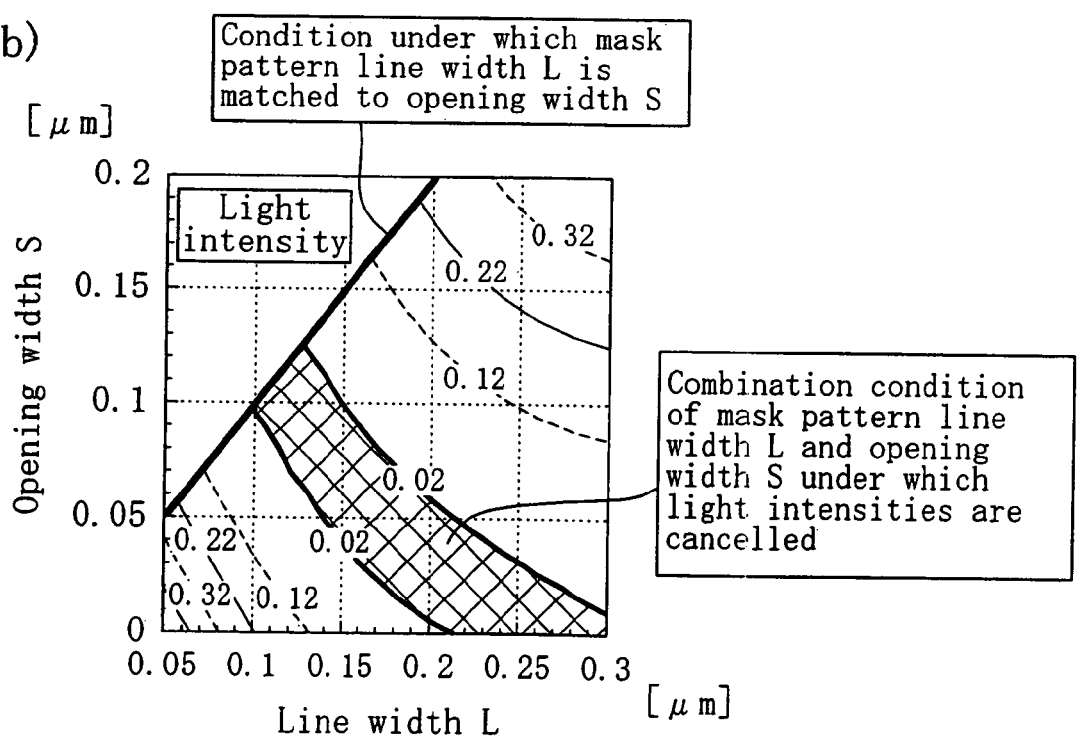

Fig. 20
(a)
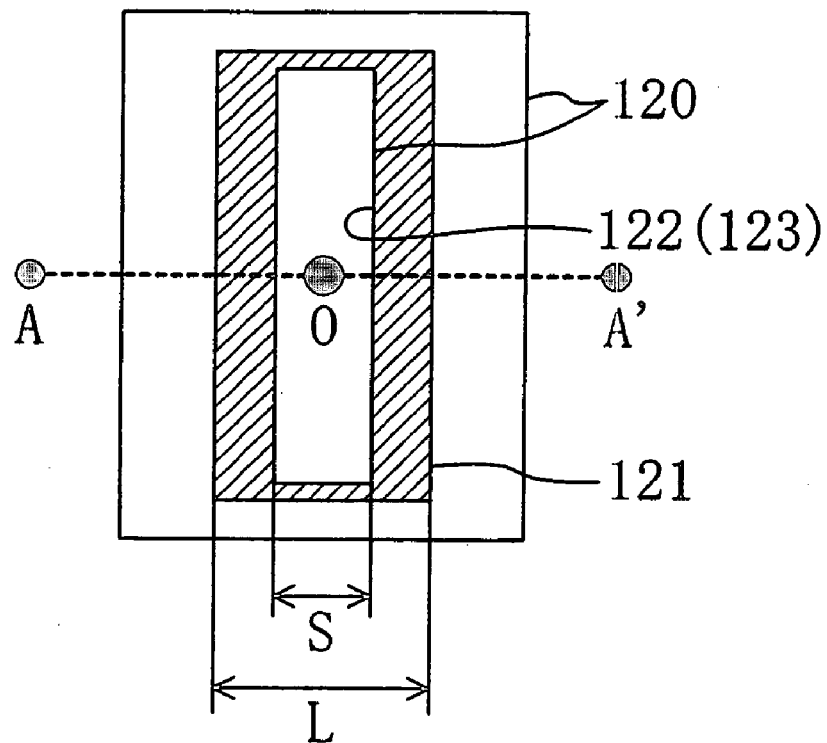
(b)
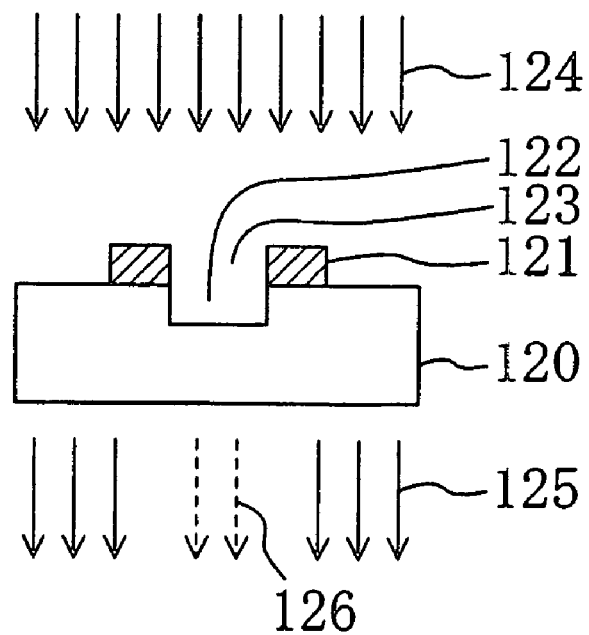

Fig. 25
(a)
Regular exposure
(Light source shape)
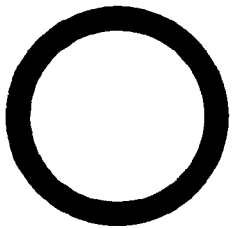
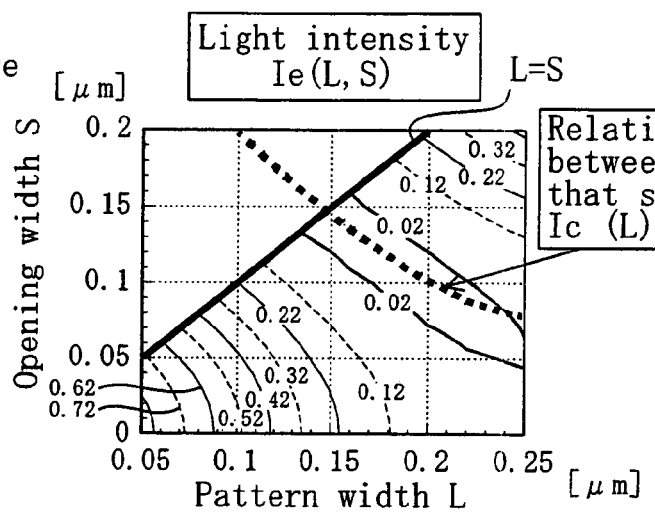
(b)
Annular exposure
(Light source shape)
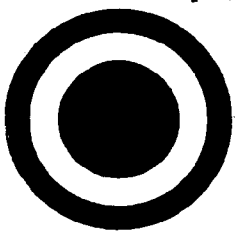
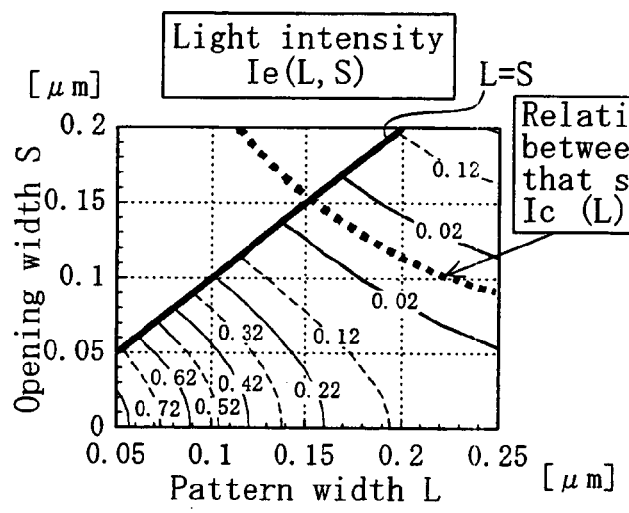
(c)
Quadrupole exposure
(Light source shape)
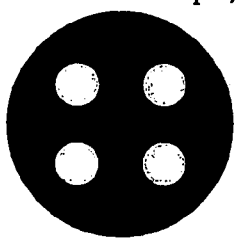
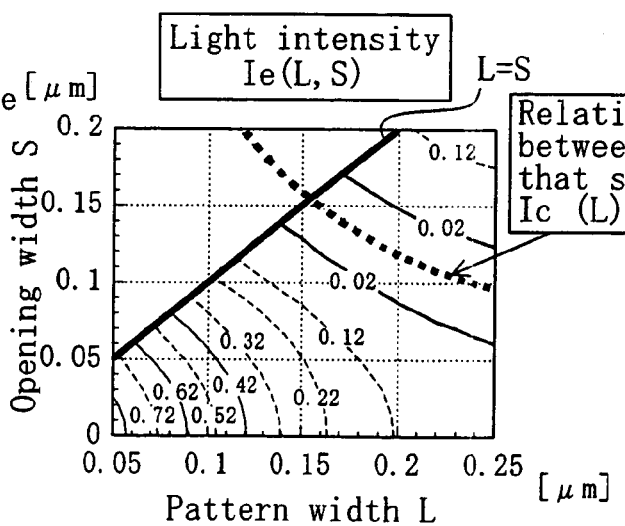

Fig. 30
(a) [Complete light-shielding pattern]
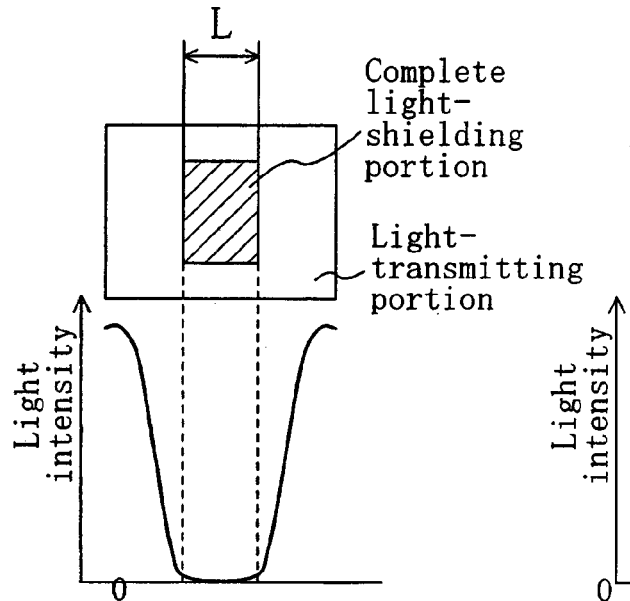
(b) [Semi-light-shielding pattern]
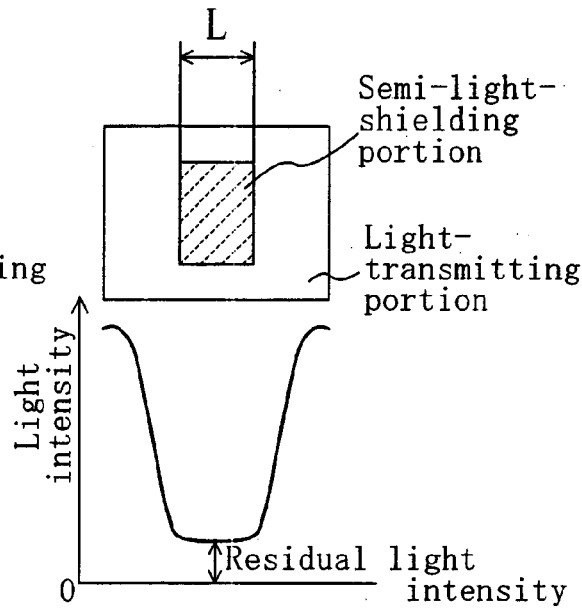
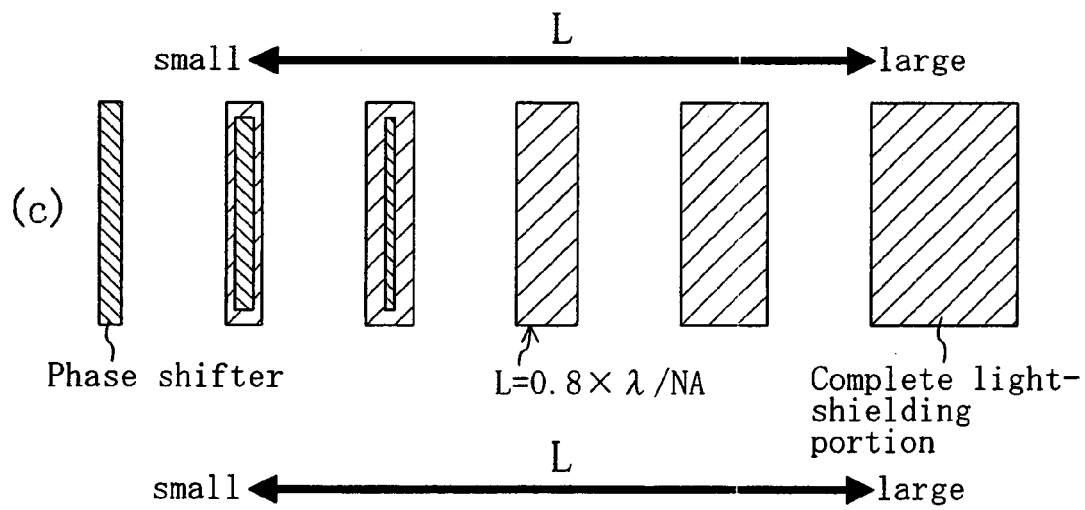
(c)
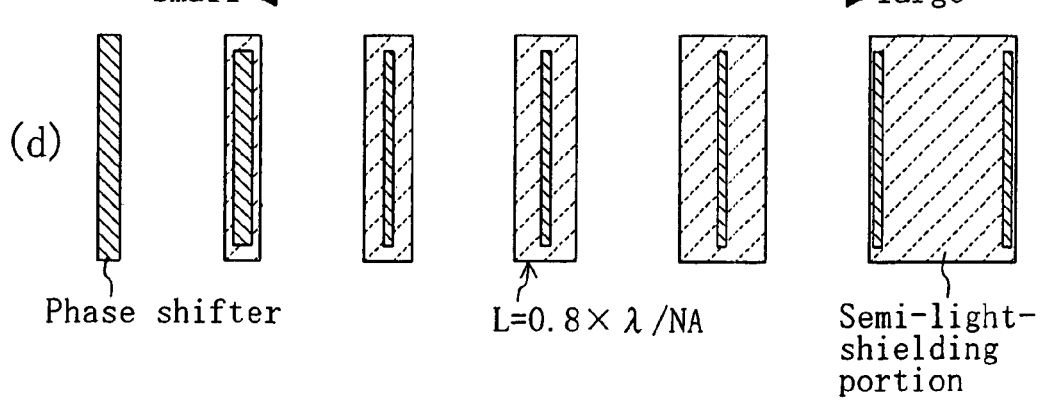
(d)

Fig. 31
(a) [Mask enhancer]
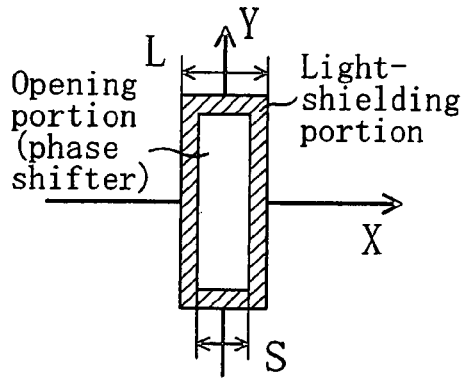
(b) Incidence from central direction
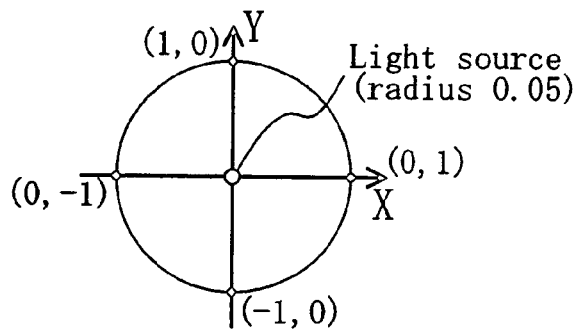
(c) Oblique incidence from axis direction
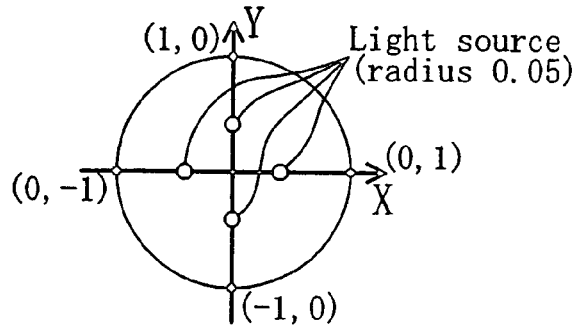
(d) Oblique incidence from 45 degree direction
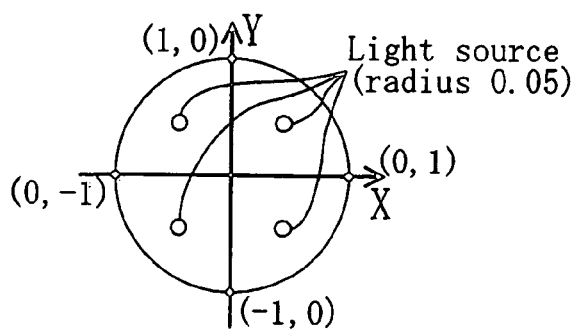
(e)
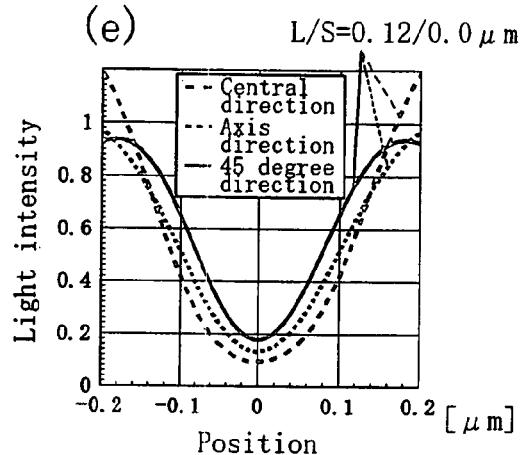
L/S=0.12/0.0 μm
(f)
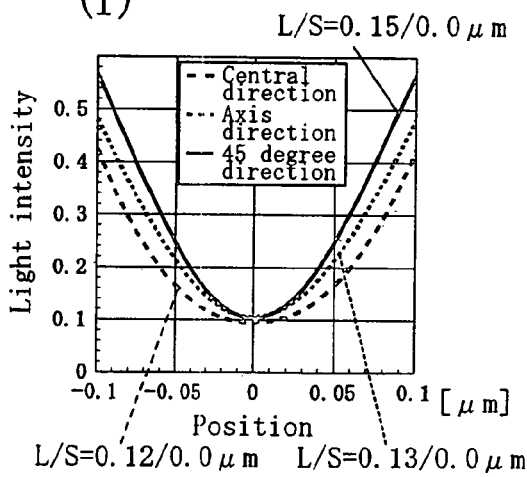
L/S=0.15/0.0 μm
L/S=0.12/0.0 μm   L/S=0.13/0.0 μm
(g)
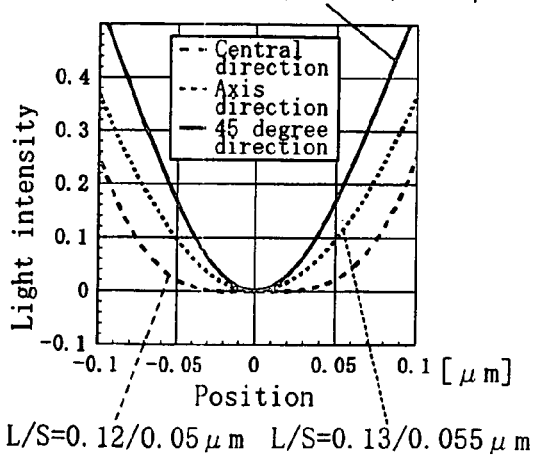
L/S=0.15/0.06 μm
L/S=0.12/0.05 μm   L/S=0.13/0.055 μm Fig. 33
(a)
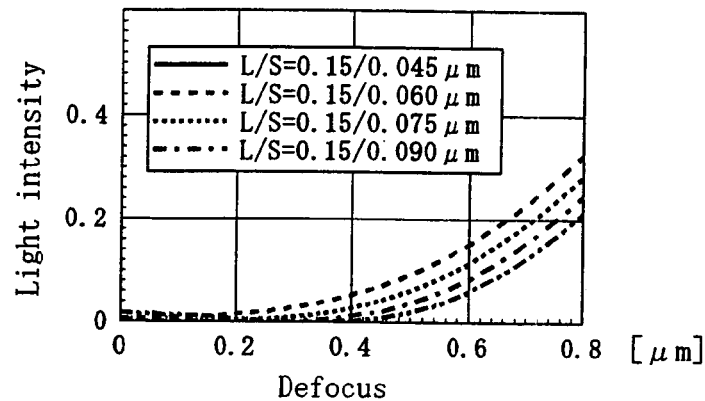
(b)
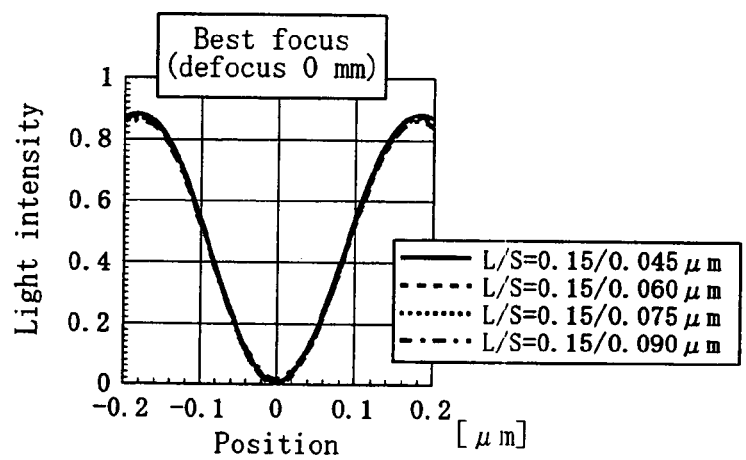
(c)
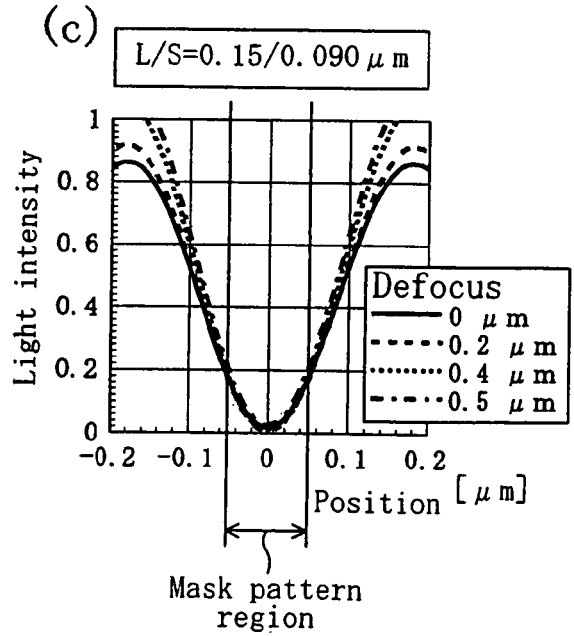
(d)
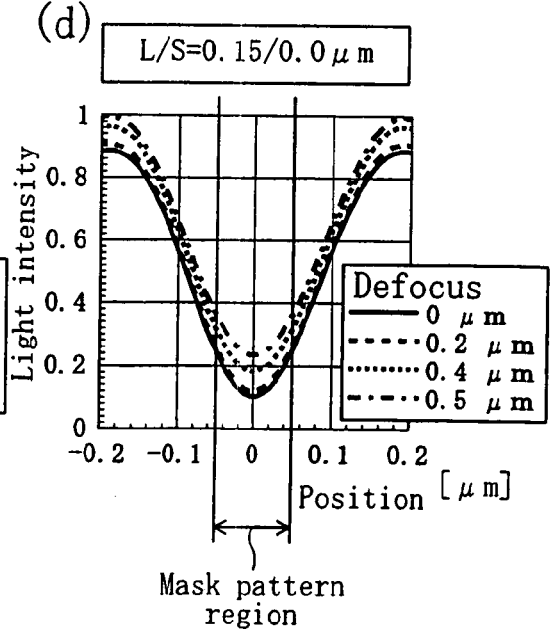

Fig. 34
(a)
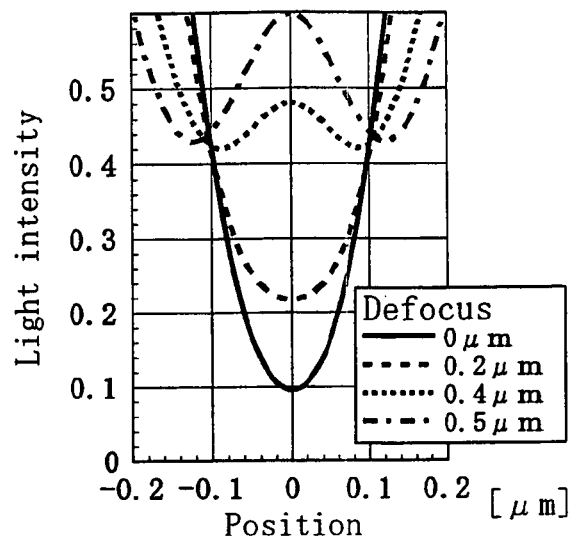
Incidence from central direction Light-shielding pattern with a width of 0.12 μm
(b)
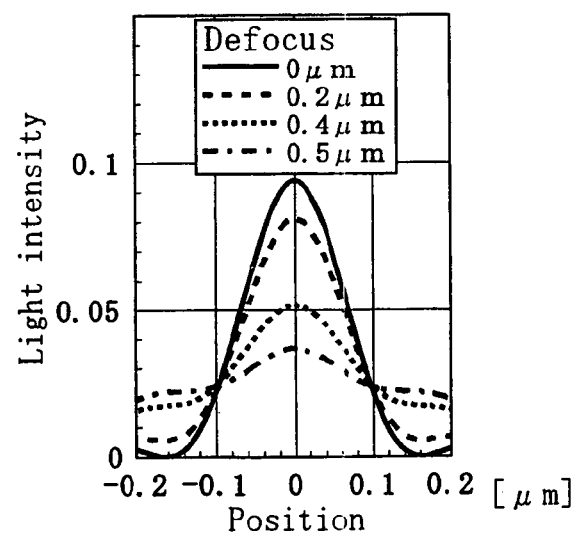
Incidence from central direction Opening pattern with a width of 0.05 μm
(c)
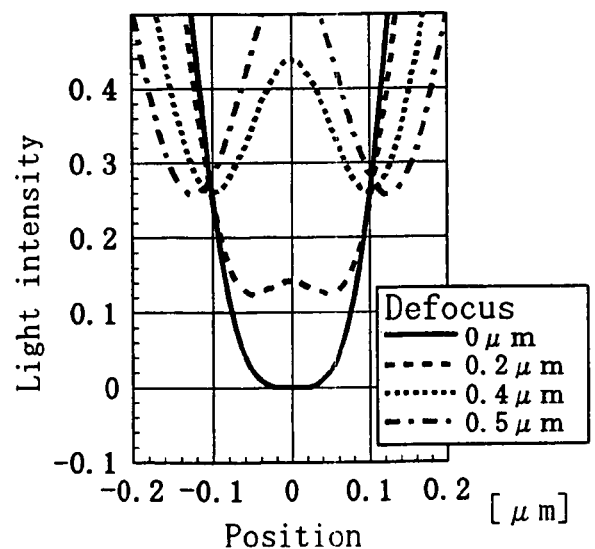
Incidence from central direction Mask enhancer with L/S = 0.12/0.05 μm Fig. 35
(a) Oblique incidence from axis direction Light-shielding pattern with a width of 0.13 μm
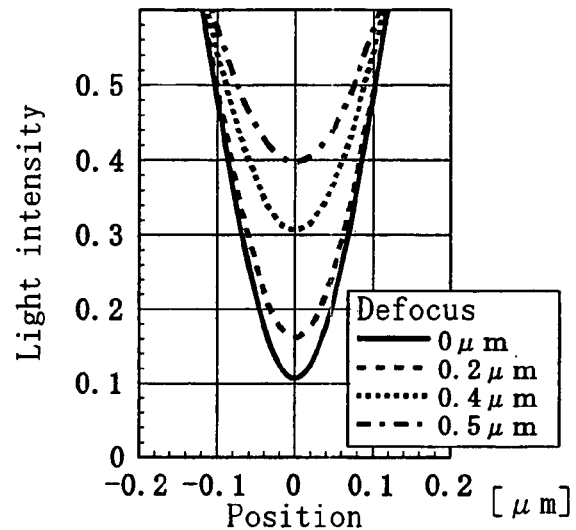
(b) Oblique incidence from axis direction Opening pattern with a width of 0.055 μm
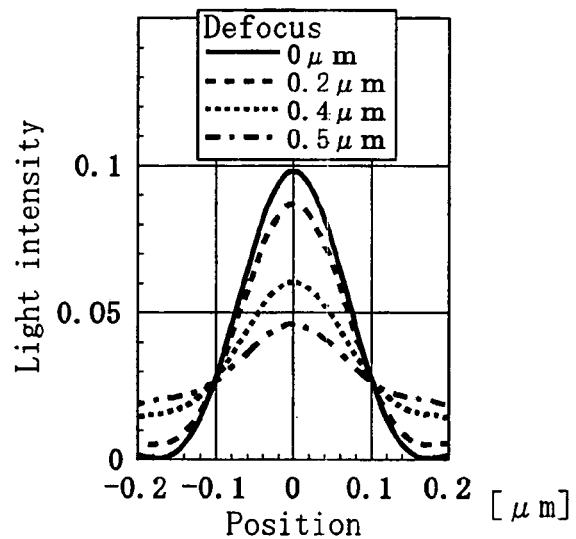
(c) Oblique incidence from axis direction Mask enhancer with L/S = 0.13/0.055 μm
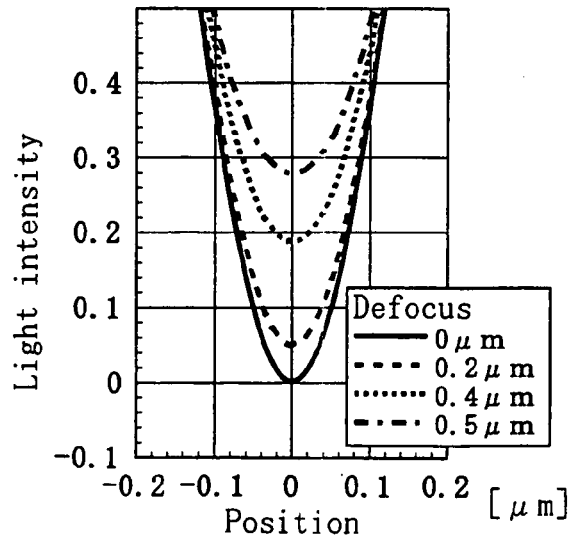

Fig. 36
(a)
Oblique incidence from 45 degree direction Light-shielding pattern with a width of 0.15 μm
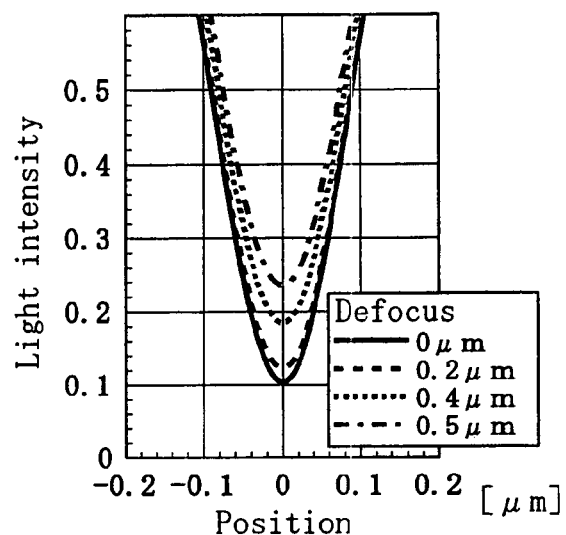
(b)
Oblique incidence from 45 degree direction Opening pattern with a width of 0.06 μm
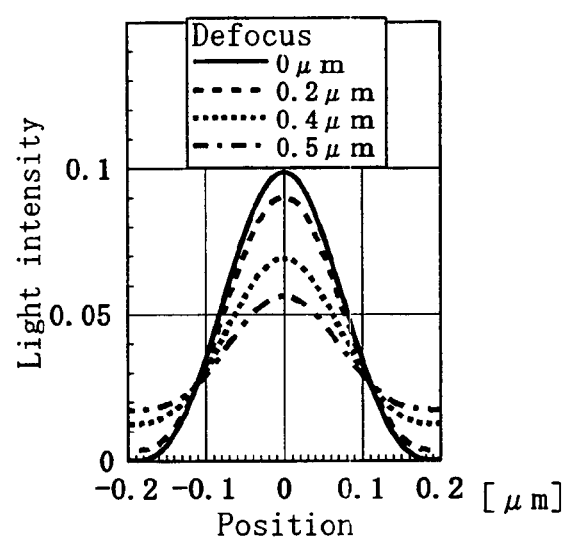
(c)
Oblique incidence from 45 degree direction Mask enhancer with L/S = 0.15/0.06 μm
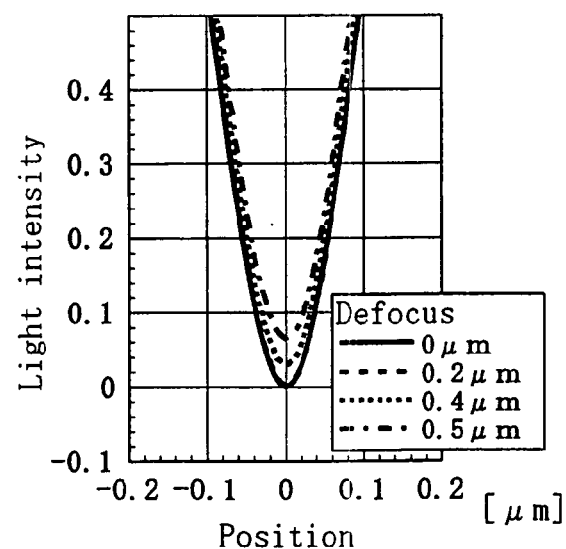

Fig. 38
(a)
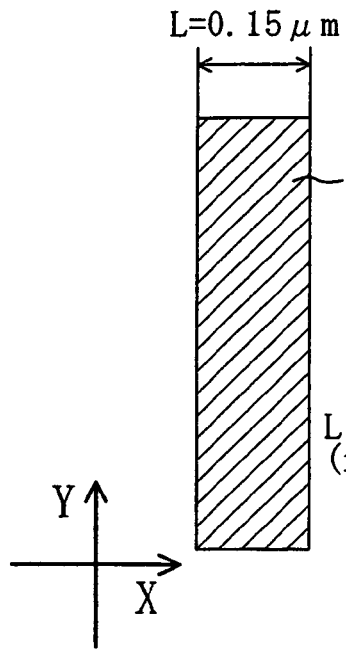
(b)
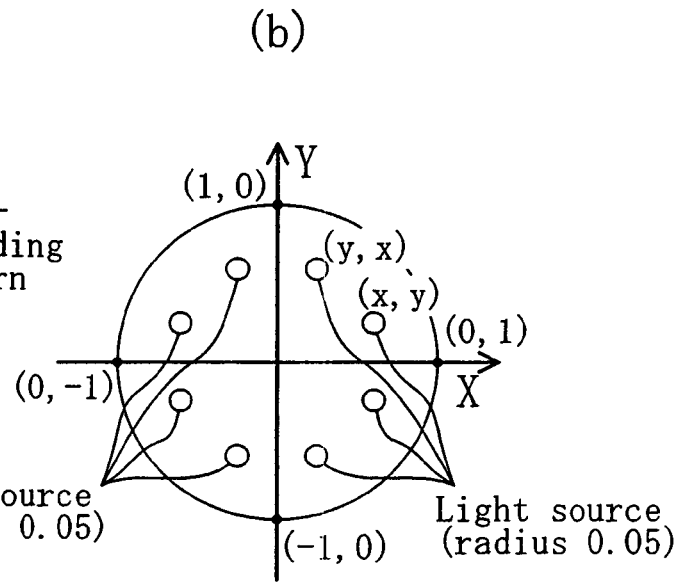
(c)
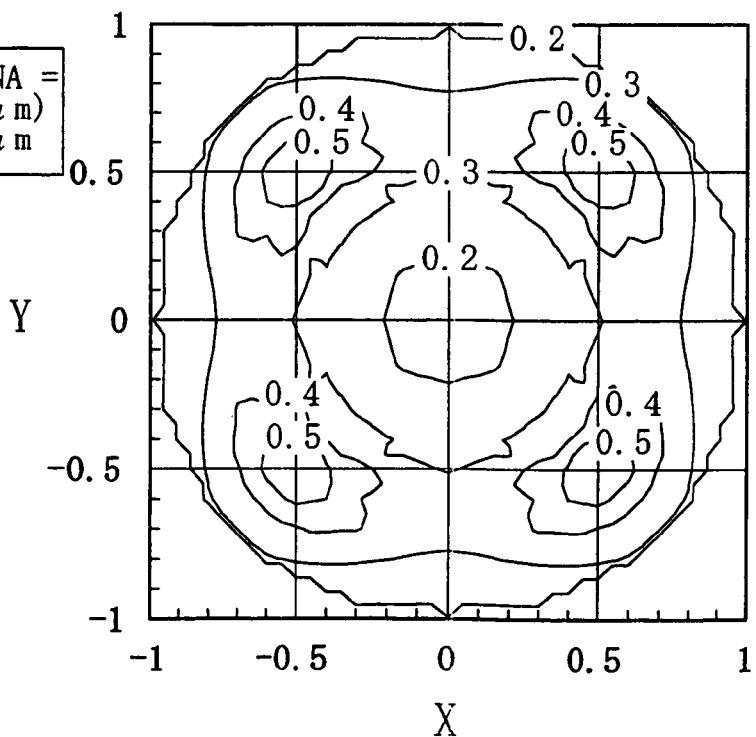

Fig. 39
(a) [Mask enhancer]
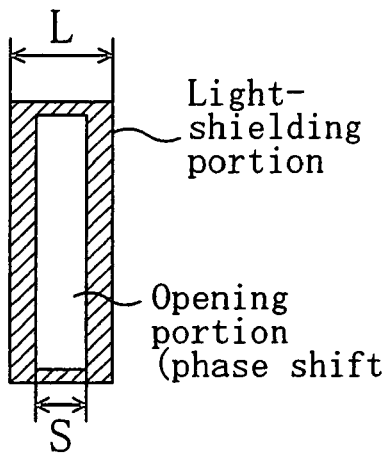
(b) DOF (unit: μm) at L/S = 0.15/0.04 μm
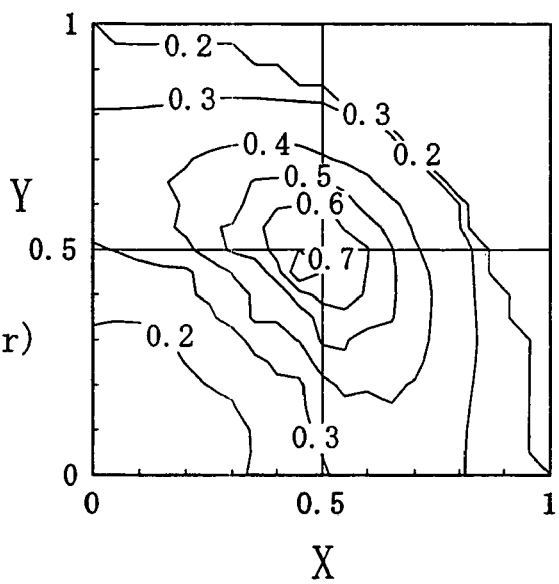
(c) DOF (unit: μm) at L/S = 0.15/0.08 μm
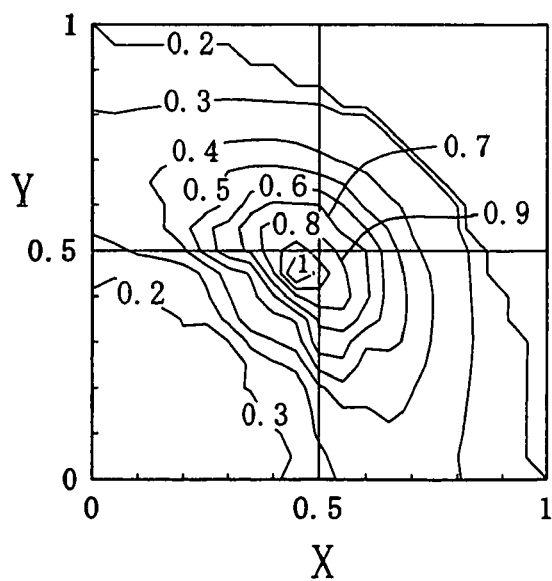
(d) DOF (unit: μm) at L/S = 0.15/0.10 μm
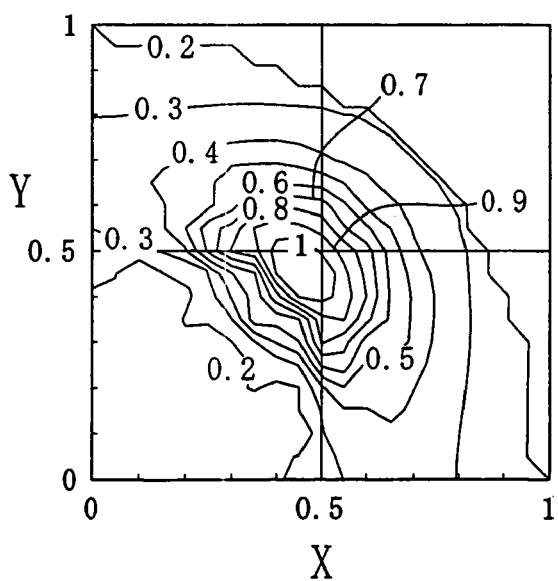

Fig. 41
(a)
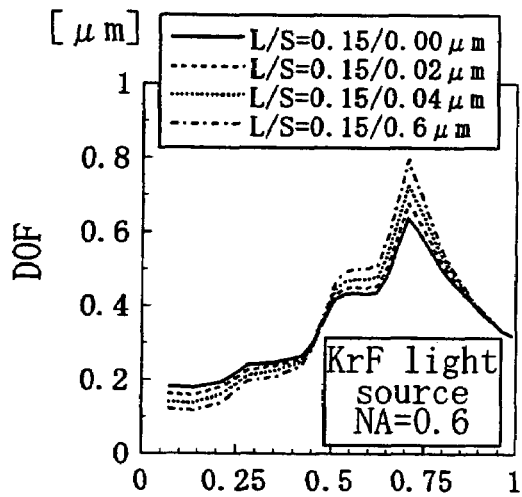
(b)
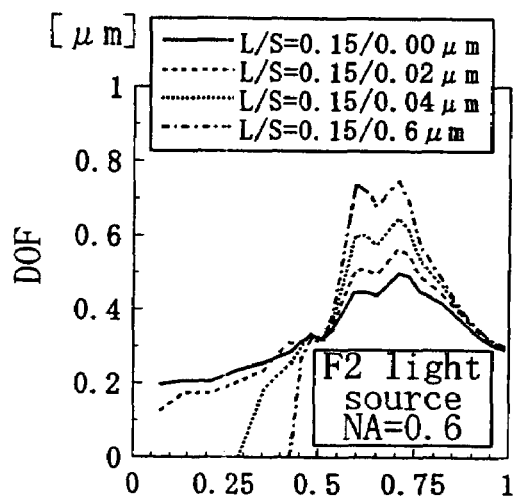
(c)
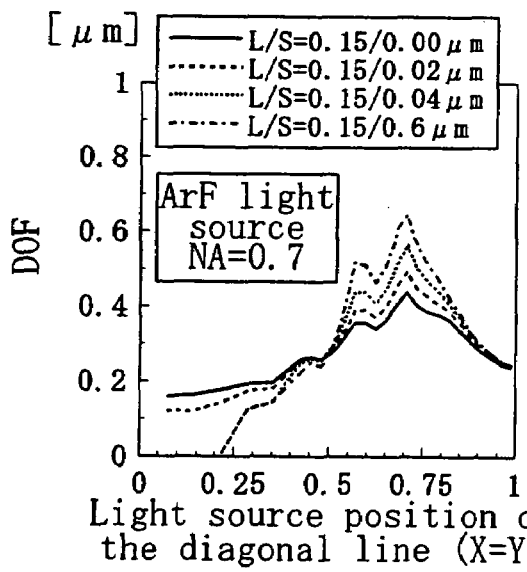
(d)

Fig. 52
(a)
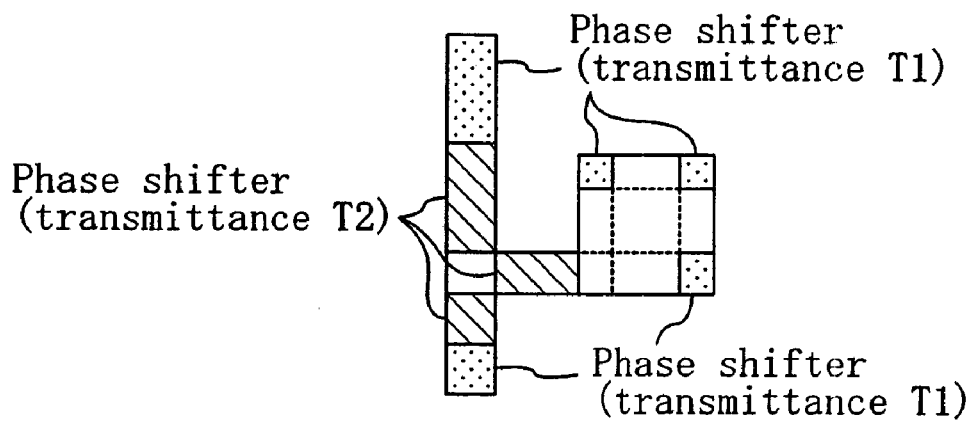
(b)
[Mask pattern data]
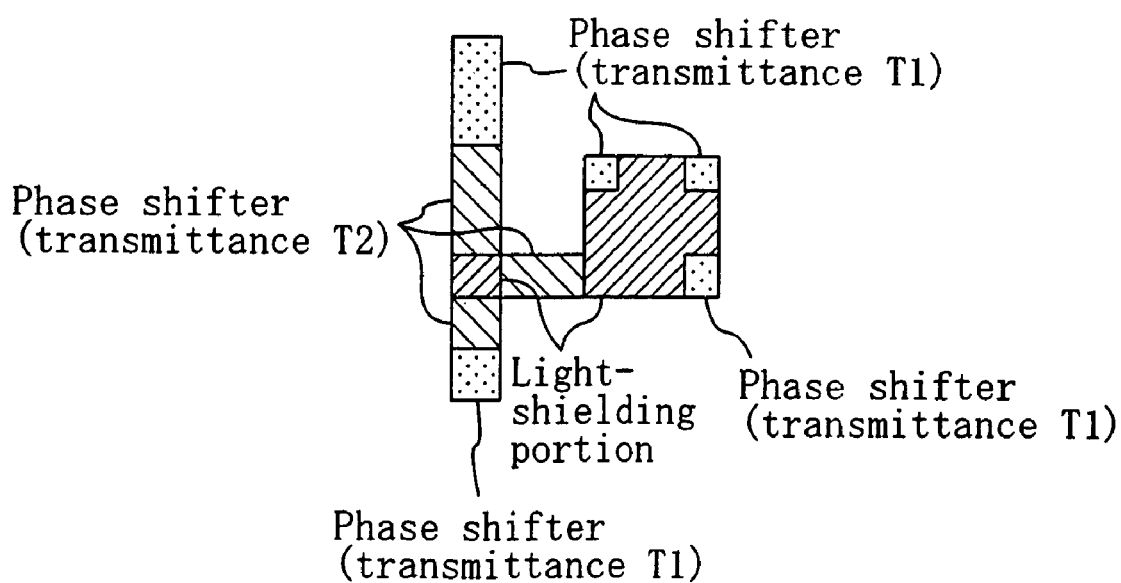

Fig. 53
PRIOR ART
(a) 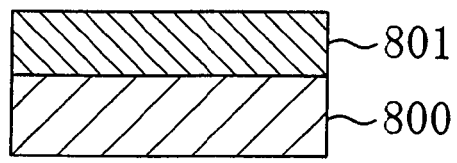
(b) 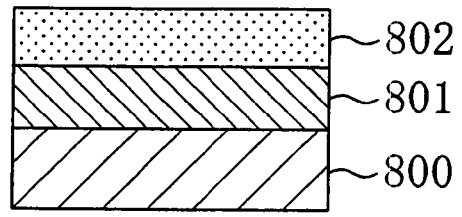
(c) 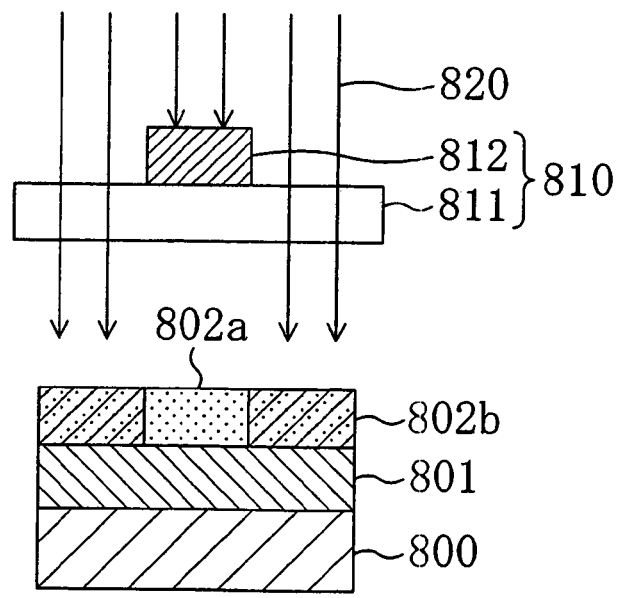
(d) 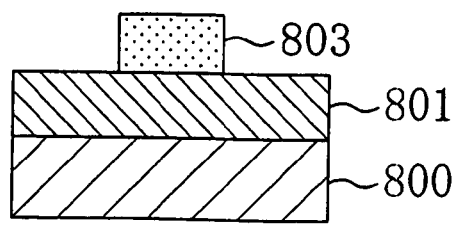

Fig. 54
PRIOR ART
(a) 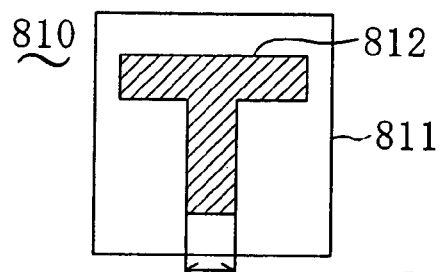
(b) 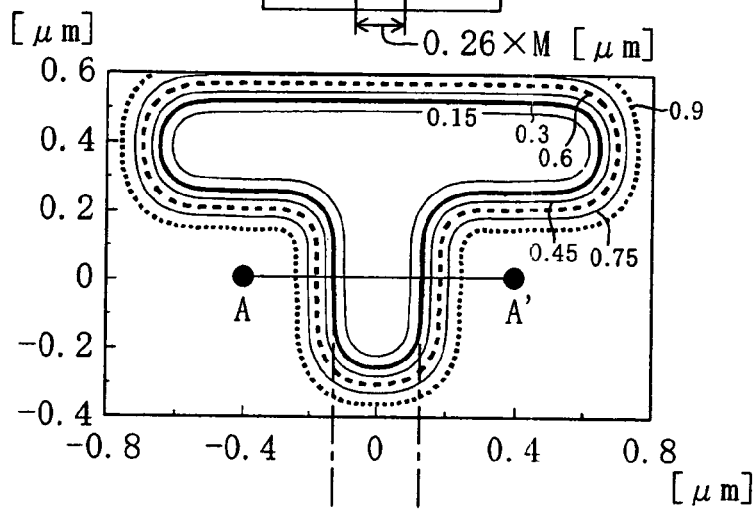
(c) 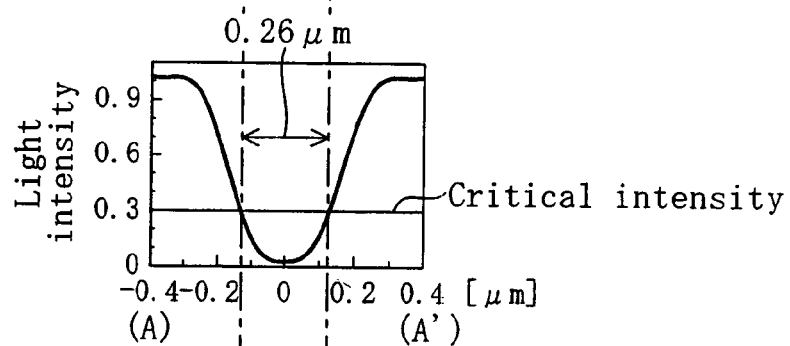
(d) 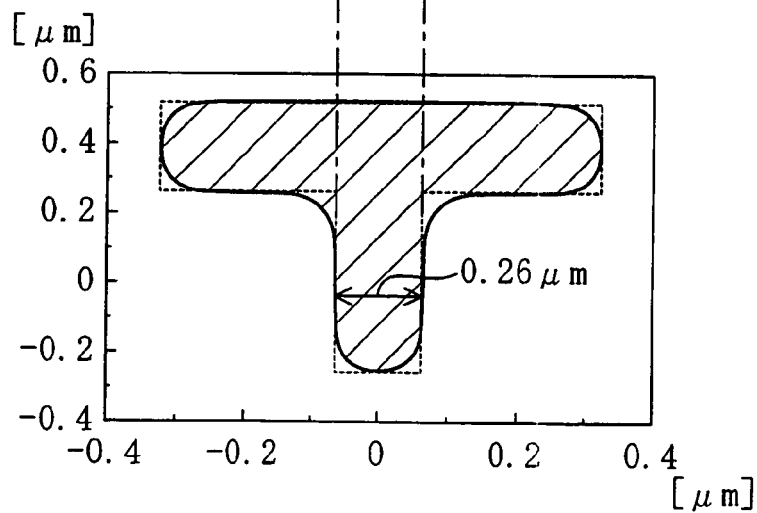

Fig. 55
PRIOR ART
(a) 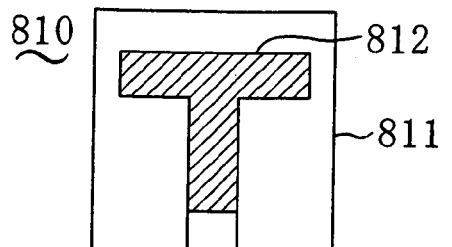
(b) 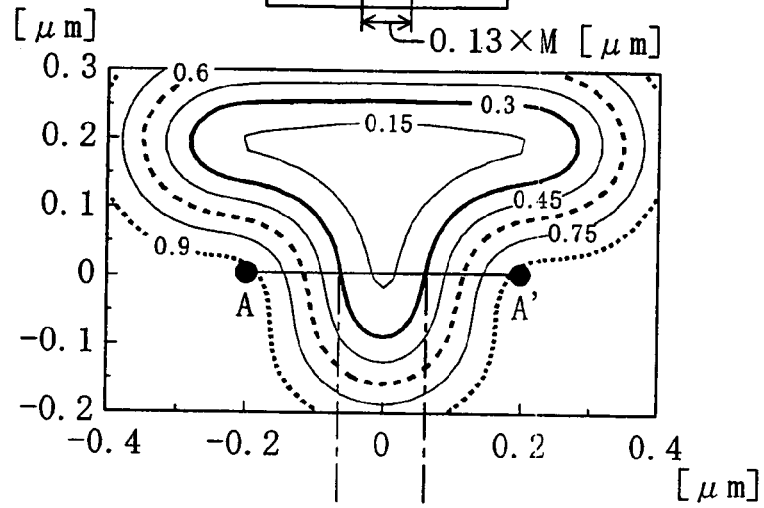
(c) 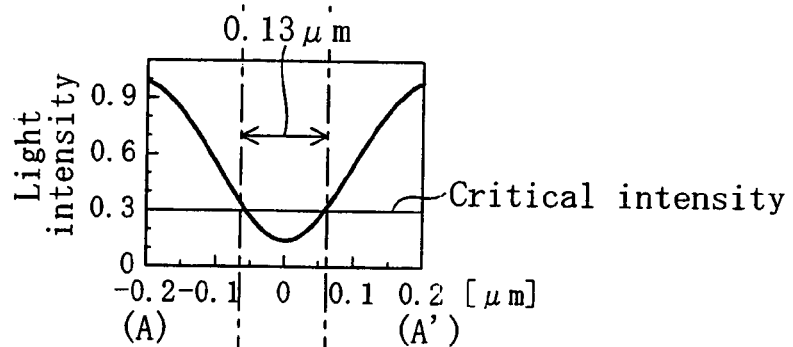
(d) 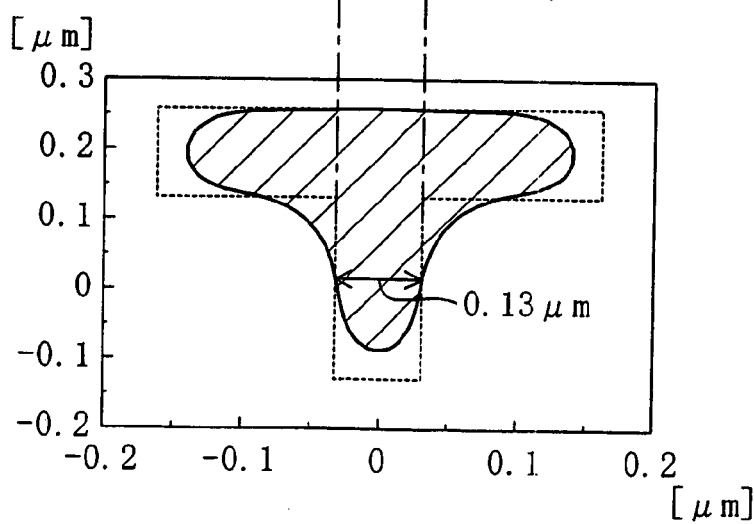

Fig. 56
PRIOR ART
(a)
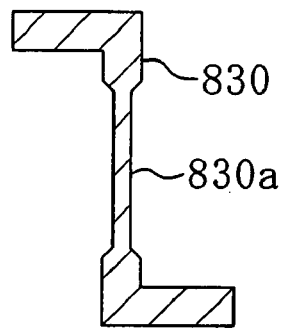
(b)
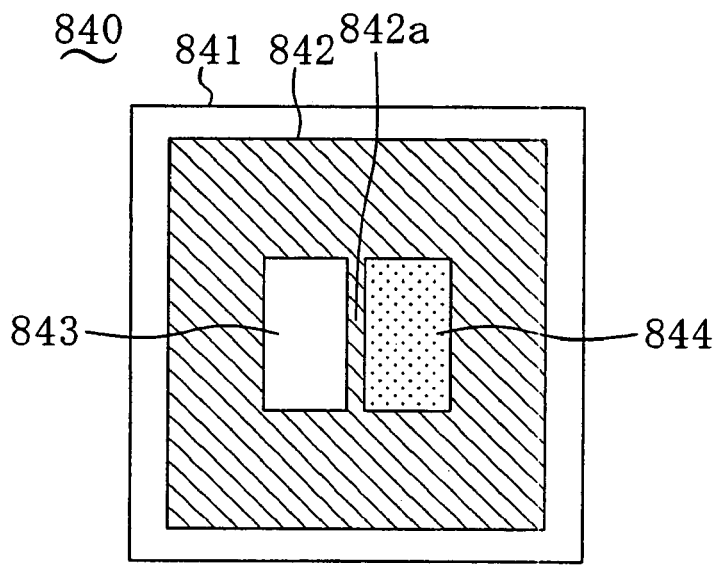
(c)
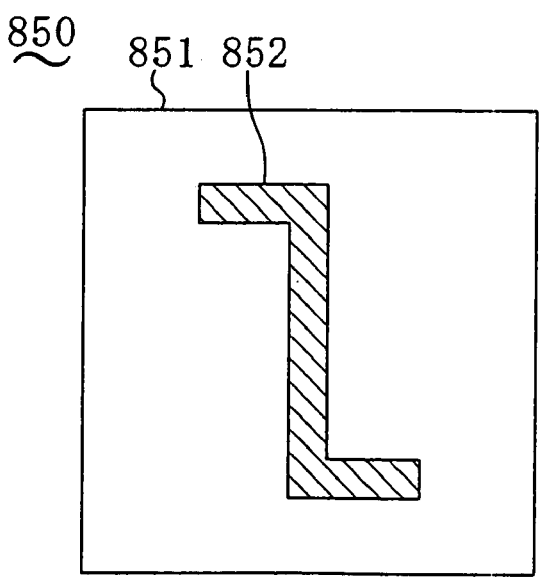

Fig. 57
PRIOR ART
(a) 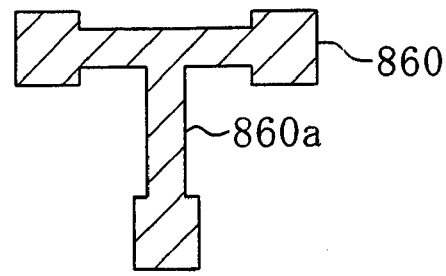
(b) 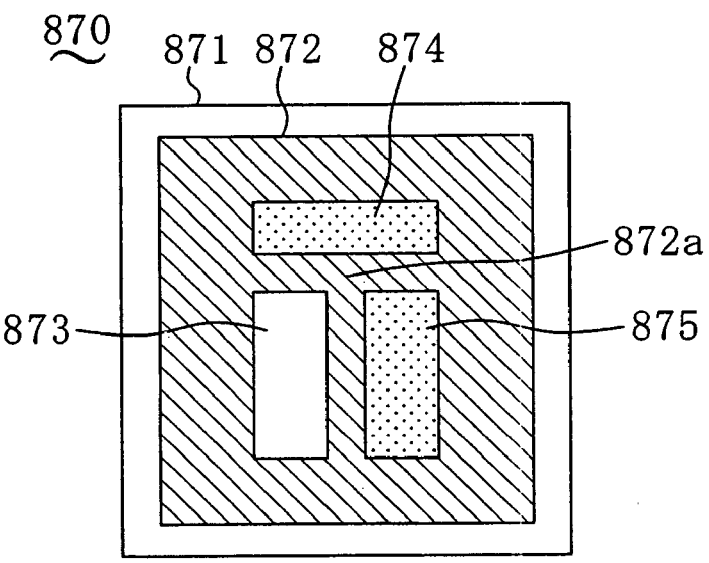
(c) 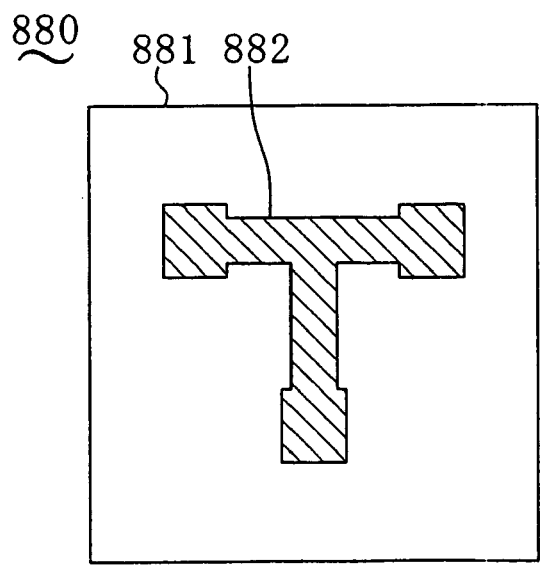

PATTERN FORMATION METHOD

RELATED APPLICATIONS

This application is a divisional of application Ser. No. 10/399,762, filed Apr. 22, 2003 now U.S. Pat. No. 7,060,395, which is a 371 of International Application No. PCT/JP02/03976, filed Apr. 22, 2002, which claims priority of Japanese Application No. 2001-133802, filed May 1, 2001 and Japanese Application No. 2002-1033, filed Jan. 8, 2002, the contents of which are hereby incorporated by reference.

TECHNICAL FIELD

The present invention relates to a photomask for pattern exposure used for producing a semiconductor device or a liquid crystal display apparatus, a method for forming the same and a method for forming patterns using the photomask. The present invention further relates to a method for designing a mask pattern.

BACKGROUND ART

In recent years, as a result of development of miniaturization of large-scale integrated circuit devices (hereinafter, referred to as "LSI") that are realized by using semiconductors, a discrepancy in the shape or the size between a mask pattern and a processed pattern (e.g., a resist pattern formed by pattern transfer onto a resist film) cannot be ignored any more in a lithography process, which is one process for LSI production.

The miniaturization of a pattern size of LSIs has developed to the extent that the limit of resolution defined by the wavelength of exposure light or the numerical aperture of a projecting optical system of an exposure apparatus has been reached, so that production margin regarding the yield in LSI production, for example, a depth of focus, has been significantly reduced.

When forming a pattern having a desired shape as a resist pattern on a wafer by a conventional pattern forming method, a light-shielding pattern, that is, a mask pattern, having a desired shape is formed on a transparent substrate with a light-shielding film made of a metal such as chromium, and then the wafer coated with a resist film is exposed to light, using the transparent substrate on which the mask pattern is formed as a mask. In this exposure process, a light intensity distribution having a shape similar to the mask pattern formed of the light-shielding film is projected into the resist film. Furthermore, this light intensity distribution generates stored energy in the resist film, and a reaction is effected in a portion of the resist film in which the stored energy becomes larger than a predetermined magnitude. Herein, the light intensity corresponding to the stored energy having a magnitude that causes a reaction in the resist film is referred to as "critical intensity,".

In the case where, for example, a positive resist is used as the resist film, the portion having a light intensity more than the critical intensity in the resist film is removed by developing the resist film. Thus, a resist pattern having a desired shape can be formed by matching a distribution shape or dimension of the critical intensity value in the light intensity distribution occurring in an exposed material by pattern exposure to a desired pattern.

FIGS. 53(a) to 53(d) are cross-sectional views showing processes in a conventional method for forming a pattern.

First as shown in FIG. 53(a), a film 801 to be processed made of a metal film or an insulating film is formed on a substrate 800, and then as shown in FIG. 53(b), a positive resist film 802 is formed on the film 801 to be processed. Thereafter, as shown in FIG. 53(c), the resist film 802 is irradiated with exposure light 820 via a photomask 810 including a transparent substrate 811 and a mask pattern 812 having a predetermined shape made of a chromium film or the like formed thereon. Thus, a portion corresponding to the mask pattern 812 in the resist film 802 (a portion having a light intensity of not more than the critical intensity) becomes a non-exposed portion 802a, and other portions (portions having a light intensity of the critical intensity or more) become an exposed portion 802b. Thereafter, as shown in FIG. 53(d), a resist pattern 803 constituted by the non-exposed portion 802a is formed by developing the resist film 802.

In the method for forming a pattern as described above, in general, a reduced size projection exposure apparatus is used. The reduced size projection exposure apparatus performs pattern formation by, for example, subjecting a resist film made of a photosensitive resin formed on a wafer serving as a substrate to reduced size projection exposure, using a photomask which is a transparent substrate on which a mask pattern magnified to a size of several times larger than the size of a resist pattern to be formed. In the description of this specification, the following letters are defined as follows:

NA: the numerical aperture of a projecting optical system of an exposure apparatus (e.g., 0.6);

$\lambda$: the wavelength of exposure light (light source) (e.g., 0.193 µm)

M: the magnification factor of the exposure apparatus (the inverse number of the reduction ratio, e.g., 4 or 5); and L: the pattern size (designed value) on a wafer (an exposed material).

For example, in the case where a desired pattern size (designed value) on a wafer is 0.1 µm, L=0.1 µm, and in this case, the mask pattern size on a photomask used in an exposure apparatus having a magnification factor M=4 is 0.1×4=0.4 µm. For simplification of the following description, when indicating a mask pattern size on a photomask, a designed value on a wafer, that is, a calculated value (a value obtained as a result of multiplication by a reduction ratio) is used, unless otherwise specified.

As well known, in the case where light is shielded by a pattern having a size of not more than a half of the wavelength of the light, the contrast of a light-shielded image is reduced by diffraction of light. This means that when the mask pattern is smaller than a half of a value defined by M×$\lambda$/NA, where $\lambda$ is the wavelength of exposure light in a reduction projection optical system, M is the magnification factor, and NA is the numerical aperture, then the contrast of an image transferred by the mask pattern, that is, a light-shielded image is degraded.

FIG. 54(a) shows an example of a layout of the mask pattern 812 on the photomask 810 used in the exposure process shown in FIG. 53(c). As shown in FIG. 54(a), the mask pattern 812 has a size (actual size) of 0.26×M [µm] (M: the magnification factor of an exposure apparatus used in the exposure process).

FIG. 54(b) shows the simulation results of a light intensity distribution projected on the resist film 802 by the photomask 810 shown in FIG. 54(a). The simulation conditions are such that the wavelength $\lambda$ of the exposure light 820=193 nm, and the numerical aperture NA of the projecting optical system of the exposure apparatus=0.6. In this case, 0.26×M [µm]≈0.8×M×$\lambda$/NA. FIG. 54(b) shows a light intensity distribution, using contour lines of relative light intensity (light intensity when the light intensity of exposure light is taken as 1) in a two-dimensional relative coordination system. As shown in 54(b), the light intensity distribution transferred onto the resist film 802 is equal to substantially 0 at a position corresponding to the vicinity of the center of the mask pattern 812. That is, the light shielding properties of the mask pattern 812 is very good.

FIG. 54(c) shows the simulation results of the light intensity distribution along line AA' of FIG. 54(b), and FIG. 54(d) shows the results of estimating the shape of the resist pattern 803 from the simulation results of the light intensity distribution shown in FIG. 54(b). If the critical intensity is 0.3 as shown in FIG. 54(c), the distribution shape of the critical intensity value in the light intensity distribution shown in FIG. 54(b) is substantially matched to the shape of the mask pattern 812, so that the resist pattern 803 (hatched portion) having a substantially desired shape (shape indicated by a broken line) can be formed, as shown in FIG. 54(d).

FIG. 55(a) shows another example of the layout of the mask pattern 812 on the photomask 810 used in the exposure process shown in FIG. 53(c). As shown in FIG. 55(a), the mask pattern 812 has a size (actual size) of 0.13×M [μm] (M: the magnification factor of an exposure apparatus used in the exposure process).

FIG. 55(b) shows the simulation results of a light intensity distribution projected on the resist film 802 by the photomask 810 shown in FIG. 55(a). The simulation conditions are such that the wavelength λ of the exposure light 820=193 nm; and the numerical aperture NA of the projecting optical system of the exposure apparatus=0.6, which are the same as in the case of FIG. 54(b). In this case, 0.13×M [μm]≈0.4× M×λ/NA. FIG. 55(b) also shows a light intensity distribution using contour lines of relative light intensity in a two-dimensional relative coordination system. As shown in FIG. 55(b), the light intensity distribution transferred onto the resist film 802 reaches a value of about a half of the critical intensity value (0.3) at a position corresponding to the vicinity of the center of the mask pattern 812. That is, the light shielding properties of the mask pattern 812 are deteriorated because of an influence of diffraction of the exposure light 820.

FIG. 55(c) shows the simulation results of the light intensity distribution along line AA' of FIG. 55(b), and FIG. 55(d) shows the results of estimating the shape of the resist pattern 803 from the simulation results of the light intensity distribution shown in FIG. 55(b). If the critical intensity is 0.3 as shown in FIG. 55(c), the distribution shape of the critical intensity value in the light intensity distribution shown in FIG. 55(b) is not similar to the shape of the mask pattern 812, so that the shape of the resist pattern 803 (hatched portion) is distorted from a desired shape (shape indicated by a broken line), as shown in FIG. 55(d).

Summing up, in the conventional method for forming a pattern shown in FIGS. 53(a) to 53(d), even if a mask pattern is formed with, for example, a complete light-shielding film, it is difficult to form a desired pattern having a size of a half of λ/NA or less, using the mask pattern. Therefore, there is a limitation regarding the size of a resist pattern that can be formed on a wafer.

In order to form a desired pattern having a size of a half of λ/NA or less by emphasizing the contrast of the light intensity distribution generated by a mask pattern, the following method is proposed by H. Y Liu et al (Proc. SPIE, Vol. 3334, p. 2 (1998)): Not only a pattern constituted by a light-shielding film is formed on a transparent substrate as a mask pattern, but also a phase shifter for generating a phase difference of 180° with respect to exposure light between the phase shifter and a light-transmitting portion (a portion on which the mask pattern is not formed) on the transparent substrate is formed. In this method, when the light-transmitting portion and the phase shifter are arranged while sandwiching the pattern (which may be referred to as "light-shielding pattern) constituted by the light-shielding film having a size of a half of λ/NA or less, lights transmitted through the light-transmitting portion and the phase shifter and diffracted to the back side of the light-shielding pattern cancel each other, so that the light shielding properties of the light-shielding pattern can be improved.

Hereinafter, the method of H. Y Liu et al. will be described with reference to the accompanying drawings.

FIG. 56(a) shows an example of the layout of a desired pattern (resist pattern) to be formed. As shown in FIG. 56(a), a pattern 830 has a partial pattern 830a having a size of a half of λ/NA or less.

FIGS. 56(b) and 56(c) show plan views of conventional two photomasks used for forming the pattern shown in FIG. 56(a). As shown in FIG. 56(b), a light-shielding film 842 is formed on a transparent substrate 841 constituting a first photomask 840, and a first opening 843 serving as the light-transmitting portion and a second opening 844 serving as the phase shifter are provided in the light-shielding film 842 while sandwiching a light-shielding pattern 842a for forming the partial pattern 830a. Furthermore, as shown in FIG. 56(c), a light-shielding pattern 852 for forming the pattern 830 (see FIG. 56(a)) in combination with the light-shielding pattern 842a of the first photomask 840 is formed on a transparent substrate 851 constituting a second photomask 850.

The method for forming a pattern using the two photomask shown in FIGS. 56(b) and 56(c) is as follows.

First, a substrate coated with a resist film made of a positive resist is exposed to light, using the first photomask shown in FIG. 56(b). Thereafter, alignment is performed such that a pattern shown in FIG. 56(a) is formed with a latent image formed by the exposure using the first photomask and a latent image to be formed by exposure using the second photomask shown in FIG. 56(c). Thereafter, exposure is performed using the second photomask shown in FIG. 56(c), and then the resist film is developed so as to form a resist pattern. Thus, an unwanted pattern (pattern other than the pattern shown in FIG. 56(a)) that is formed when development is performed after the exposure using the first photomask is removed by the exposure using the second photomask. As a result, a pattern having a size of a half of λ/NA or less can be formed.

In the method of H. Y Liu et al., the contrast of the light-shielded image created by a light-shielding pattern is improved by interposing the light-shielding pattern between the light-transmitting portion and the phase shifter. However, in order to provide this effect, the light-transmitting portion and the phase shifter should be disposed adjacent with a gap of a half of λ/NA or less. In the case where the light-transmitting portion and the phase shifter are disposed continuously on the photomask without interposing the light-shielding pattern, the light intensity corresponding to the boundary of the light-transmitting portion and the phase shifter is smaller than the critical intensity. In other words, a light-shielded image corresponding to the boundary of the light-transmitting portion and the phase shifter is formed. In the case where only a photomask as shown in FIG. 56(b) is used, a light-shielding distribution having an arbitrary shape (distribution of a region having a smaller intensity than the critical intensity in the light intensity distribution) cannot be formed, so that a pattern having an arbitrary shape cannot be formed. As a results, in order to form a pattern having a complicated shape such as a pattern layout of a regular LSI, it is essential to perform exposure using the photomask (second photomask) as shown in FIG. 56(c), in addition to exposure using the photomask (first photomask) as shown in FIG. 56(b). Consequently, the costs of masking is increased, the through-put is reduced because of an increase of the number of processes in lithography, or the production cost is increased.

The method of H. Y Liu et al. has another problem as described below.

FIG. 57(a) shows another example of the layout of a desired pattern (resist pattern) to be formed. As shown in FIG. 57(a), a pattern 860 has a T-shaped partial pattern 860a having a size of a half of λ/NA or less.

FIGS. 57(b) and 56(c) show plan views of conventional two photomasks used for forming the pattern shown in FIG. 57(a). As shown in FIG. 57(b), a light-shielding film 872 is formed on a transparent substrate 871 constituting a first photomask 870, and a first opening 873 serving as the light-transmitting portion and a second opening 874 and a third opening 875 serving as the phase shifters are provided in the light-shielding film 872 while sandwiching a light-shielding pattern 872a for forming the partial pattern 860a. Furthermore, as shown in FIG. 57(c), a light-shielding pattern 882 for forming the pattern 860 (see FIG. 57(a)) in combination with the light-shielding pattern 872a of the first photomask 870 is formed on a transparent substrate 881 constituting a second photomask 880.

However, as shown in FIG. 57(b), in the first photomask 870, a part of the light-shielding pattern 872a is sandwiched between the phase shifters (the second opening 874 and the third opening 875), in other words, the entire light-shielding pattern 872a cannot be provided only between the light-transmitting portion and the phase shifter, which have opposite phases to each other, so that the light-shielding properties of the light-shielding pattern 872a cannot be improved. Thus, there is a limitation regarding the pattern layout that can utilize the effect of the phase shifter.

DISCLOSURE OF INVENTION

In view of the above, the present invention has an object of forming a pattern having an arbitrary size or shape by exposure using one photomask.

In order to achieve the above object, a first photomask according to the present invention is a photomask including a mask pattern having light-shielding properties with respect to exposure light provided on a transparent substrate having light-transmitting properties with respect to the exposure light. The mask pattern includes a phase shifter that generates a phase difference of (150+360×n) degrees or more and (210+360×n) degrees or less, where n=an integer, with respect to the exposure light between the phase shifter and a light-transmitting portion in which the mask pattern is not formed on the transparent substrate. A first light intensity generated in a light-shielded image formation region corresponding to the mask pattern on an exposed material by the exposure light transmitted through the phase shifter is not more than four times a second light intensity generated in the light-shielded image formation region by the exposure light that is transmitted through the periphery of the mask pattern on the transparent substrate and goes into the back side of the mask pattern.

According to the first photomask, a first light intensity generated in a light-shielded image formation region by the exposure light transmitted through the phase shifter (hereinafter, referred to as "shifter transmitted light") provided in the mask pattern on the transparent substrate is not more than four times a second light intensity generated in the light-shielded image formation region by the exposure light that is transmitted through the periphery of the mask pattern on the transparent substrate and goes into the back side of the mask pattern (hereinafter, referred to as "mask pattern diffracted light"). In this case, the shifter transmitted light and the mask pattern diffracted light have a phase difference of 180 degrees from each other, so that the first light intensity and the second light intensity are cancelled each other. Thus, the light intensity eventually generated in the light-shielded image formation region becomes smaller than the second light intensity. Therefore, the light-shielding properties of the mask pattern can be improved from those of the mask pattern constituted only by a complete light-shielding film, so that a pattern having an arbitrary size or shape can be formed by exposure using one photomask.

A second photomask according to the present invention is a photomask including a mask pattern having light-shielding properties with respect to exposure light provided on a transparent substrate having light-transmitting properties with respect to the exposure light. The mask pattern includes a phase shifter that generates a phase difference of (150+360×n) degrees or more and (210+360×n) degrees or less, where n=an integer, with respect to the exposure light between the phase shifter and a light-transmitting portion in which the mask pattern is not formed on the transparent substrate. A first light intensity generated in a light-shielded image formation region corresponding to the mask pattern on an exposed material by the exposure light transmitted through the phase shifter is between 0.5 times and 2 times a second light intensity generated in the light-shielded image formation region by the exposure light that is transmitted through the periphery of the mask pattern on the transparent substrate and goes into the back side of the mask pattern.

According to the second photomask, a first light intensity generated in a light-shielded image formation region by the shifter transmitted light is between 0.5 times and 2 times a second light intensity generated in the light-shielded image formation region by the mask pattern diffracted light. In this case, the shifter transmitted light and the mask pattern diffracted light have a phase difference of 180 degrees from each other, so that the first light intensity and the second light intensity are cancelled each other. Thus, the light intensity eventually generated in the light-shielded image formation region becomes very small. Therefore, the light-shielding properties of the mask pattern can be improved significantly, so that a pattern having an arbitrary size or shape can be formed by exposure using one photomask.

In the first or the second photomask, the phase shifter obtained by forming a transparent film having a transmittance different from that of the transparent substrate with respect to the exposure light on the transparent substrate may be used, or the phase shifter obtained by etching the transparent substrate may be used. Alternatively, the phase shifter is disposed in an opening provided in the light-shielding film having the same outer shape as that of the mask pattern. In this case, the light-shielding film having the same outer shape as that of the mask pattern may have a transmittance of 15% or less with respect to the exposure light and may generate a phase difference of (−30+360×n) degrees or more and (30+360×n) degrees or less, where n=an integer, with respect to the exposure light between the light-shielding film and the light-transmitting portion.

A first method for forming a pattern according to the present invention is a method for forming a pattern using the first photomask according to the present invention and includes forming a positive resist film on a substrate, irradiating the resist film with the exposure light through the photomask, and forming a resist pattern by developing the resist film irradiated with the exposure light so as to remove portions other than the portion corresponding to the mask pattern in the resist film. When the width of the portion corresponding to the mask pattern in the resist film is L, $L \leq 0.4 \times \lambda/NA$ is satisfied, where $\lambda$ is a wavelength of the exposure light, and NA is a numerical aperture of a reduction projection optical system of an exposure apparatus.

According to the first method for forming a pattern, exposure is performed using the first photomask according to the present invention, so that the size precision of the resist pattern can be improved significantly, compared with a conventional method. Since defocus characteristics in the light intensity distribution eventually generated in the light-shielded image formation region can be improved, utilizing the difference in the defocus characteristics between the shifter transmitted light and the mask pattern diffracted light, and then a focus margin can be improved in the pattern formation.

A second method for forming a pattern according to the present invention is a method for forming a pattern using the first photomask according to the present invention and includes forming a negative resist film on a substrate, irradiating the resist film with the exposure light through the photomask, and forming a resist pattern by developing the resist film irradiated with the exposure light so as to remove the portion corresponding to the mask pattern in the resist film. When the width of the portion corresponding to the mask pattern in the resist film is L, $L \leq 0.4 \times \lambda/NA$ is satisfied, where $\lambda$ is a wavelength of the exposure light, and NA is a numerical aperture of a reduction projection optical system of an exposure apparatus.

According to the second method for forming a pattern, exposure is performed using the first photomask according to the present invention, so that the size precision of the resist pattern can be improved significantly, compared with a conventional method. Since defocus characteristics in the light intensity distribution eventually generated in the light-shielded image formation region can be improved, utilizing the difference in the defocus characteristics between the shifter transmitted light and the mask pattern diffracted light, and thus a focus margin can be improved in the pattern formation.

A third method for forming a pattern according to the present invention is a method for forming a pattern using the photomask according to the second photomask according to the present invention includes forming a positive resist film on a substrate, irradiating the resist film with the exposure light through the photomask, and forming a resist pattern by developing the resist film irradiated with the exposure light so as to remove portions other than the portion corresponding to the mask pattern in the resist film. Wherein when the width of the portion corresponding to the mask pattern in the resist film is L, $L \leq 0.4 \times \lambda/NA$ is satisfied, where $\lambda$ is a wavelength of the exposure light, and NA is a numerical aperture of a reduction projection optical system of an exposure apparatus.

According to the third method for forming a pattern, exposure is performed using the second photomask according to the present invention, so that the size precision of the resist pattern can be improved significantly, compared with a conventional method. Since defocus characteristics in the light intensity distribution eventually generated in the light-shielded image formation region can be improved, utilizing the difference in the defocus characteristics between the shifter transmitted light and the mask pattern diffracted light, and thus a focus margin can be improved in the pattern formation.

A fourth method for forming a pattern of the present invention is a method for forming a pattern using the second photomask according to the present invention includes forming a negative resist film on a substrate, irradiating the resist film with the exposure light through the photomask, and forming a resist pattern by developing the resist film irradiated with the exposure light so as to remove the portion corresponding to the mask pattern in the resist film. When the width of the portion corresponding to the mask pattern in the resist film is L, $L \leq 0.4 \times \lambda/NA$ is satisfied, where $\lambda$ is a wavelength of the exposure light, and NA is a numerical aperture of a reduction projection optical system of an exposure apparatus.

According to the fourth method for forming a pattern, exposure is performed using the second photomask according to the present invention, so that the size precision of the resist pattern can be improved significantly, compared with a conventional method. Since defocus characteristics in the light intensity distribution eventually generated in the light-shielded image formation region can be improved, utilizing the difference in the defocus characteristics between the shifter transmitted light and the mask pattern diffracted light, and thus a focus margin can be improved in the pattern formation.

It is preferable in the first to the fourth methods for forming a pattern that the step of irradiating with the exposure light is performed using an off-axis illumination method.

By doing this, also in forming an isolated pattern, optimal exposure can be performed in forming a pattern arranged in a small cycle, so that a fine pattern having an arbitrary layout can be formed with high precision.

When the off-axis illumination method is used, it is preferable that the direction in which the exposure light is incident to the photomask is set such that the intensity of the exposure light with which the resist film is irradiated has the minimum value in the portion corresponding to the mask pattern in the resist film. In this case, it is more preferable that the direction in which the exposure light is incident to the photomask is set such that the minimum value is smaller at a defocus position than at a best focus position.

A first method for producing a photomask according to the present invention is a method for forming a photomask including a mask pattern having light-shielding properties with respect to exposure light provided on a transparent substrate having light-transmitting properties with respect to the exposure light. The method includes forming a phase shifter that generates a phase difference of (150+360×n) degrees or more and (210+360×n) degrees or less, where n=an integer, with respect to the exposure light between the phase shifter and a light-transmitting portion in which the mask pattern is not formed on the transparent substrate in a region serving as the mask pattern. The step of forming a phase shifter includes forming a phase shifter such that a first light intensity generated in a light-shielded image formation region corresponding to the mask pattern on an exposed material by the exposure light transmitted through the phase shifter is proportional to a second light intensity generated in the light-shielded image formation region by the exposure light that is transmitted through a periphery of the mask pattern on the transparent substrate and goes into a back side of the mask pattern.

According to the first method for forming a photomask, a phase shifter is formed in a region serving as a mask pattern such that a first light intensity generated in a light-shielded image formation region by the shifter transmitted light is proportional to a second light intensity generated in the light-shielded image formation region by the mask pattern diffracted light. In this case, the shifter transmitted light and the mask pattern diffracted light have a phase difference of 180 degrees from each other, so that the first light intensity and the second light intensity are cancelled each other. Thus, the light intensity eventually generated in the light-shielded image formation region becomes smaller than the second light intensity. Therefore, the light-shielding properties of the mask pattern can be improved from those of the mask pattern constituted only by a complete light-shielding film, so that a pattern having an arbitrary size or shape can be formed by exposure using one photomask.

A second method for producing a photomask according to the present invention is a method for forming a photomask including a mask pattern having light-shielding properties with respect to exposure light provided on a transparent substrate having light-transmitting properties with respect to the exposure light. The method includes forming a phase shifter that generates a phase difference of $(150+360 \times n)$ degrees or more and $(210+360 \times n)$ degrees or less, where n=an integer, with respect to the exposure light between the phase shifter and a light-transmitting portion in which the mask pattern is not formed on the transparent substrate in a region serving as the mask pattern. The step of forming the phase shifter includes forming the phase shifter such that a first light intensity generated in a light-shielded image formation region corresponding to the mask pattern on an exposed material by the exposure light transmitted through the photomask when a periphery of the mask pattern on the transparent substrate is covered with a light-shielding film is proportional to a second light intensity generated in the light-shielded image formation region by the exposure light transmitted through the photomask when the mask pattern is constituted only by a light-shielding film.

According to the second method for forming a photomask, a phase shifter is formed in a region serving as a mask pattern such that a first light intensity generated in a light-shielded image formation region by the exposure light transmitted through the photomask (that is, the shifter transmitted light) when the periphery of the mask pattern on the transparent substrate is covered with a light-shielding film is proportional to a second light intensity generated in the light-shielded image formation region by the exposure light transmitted through the photomask (that is, the mask pattern diffracted light) when the mask pattern is constituted only by a light-shielding film. In this case, the shifter transmitted light and the mask pattern diffracted light have a phase difference of 180 degrees from each other, so that the first light intensity and the second light intensity are cancelled each other. Thus, the light intensity eventually generated in the light-shielded image formation region becomes smaller than the second light intensity. Therefore, the light-shielding properties of the mask pattern can be improved from those of the mask pattern constituted only by a complete light-shielding film, so that a pattern having an arbitrary size or shape can be formed by exposure using one photomask. Furthermore, the light intensities of the shifter transmitted light and the mask pattern diffracted light can be calculated independently from each other, which makes calculations of each light intensity easy.

In the second method for forming a photomask, the light-shielding film constituting the mask pattern may have a transmittance of 15% or less with respect to the exposure light and may generate a phase difference of $(-30+360 \times n)$ degrees or more and $(30+360 \times n)$ degrees or less, where n=an integer, with respect to the exposure light between the light-shielding film and the light-transmitting portion.

In the first and the second methods for forming a photomask, it is preferable that the phase shifter has a transmittance different from that of the transparent substrate with respect to the exposure light, and the step of forming the phase shifter includes determining a formation position and the transmittance of the phase shifter such that the first light intensity is not more than four times the second light intensity.

This ensures that the light intensity eventually generated in the light-shielded image region can be made smaller than the second light intensity, which ensures that the light-shielding properties of the mask pattern can be improved.

In the first or the second method for producing a photomask it is preferable that the phase shifter has a transmittance different from that of the transparent substrate with respect to the exposure light, and the step of forming the phase shifter includes determining a formation position and the transmittance of the phase shifter such that the first light intensity is between 0.5 times and 2 times the second light intensity.

This ensures that the light intensity eventually generated in the light-shielded image region can be made very small, so that the light-shielding properties of the mask pattern can be improved significantly.

In the first or the second method for producing a photomask, it is preferable that the mask pattern has a light-shielding film having the same outer shape, the phase shifter is disposed in an opening provided in the light-shielding film, and the step of forming the phase shifter includes determining the width of the opening such that the first light intensity is equal to a predetermined value.

This makes it possible that the transmittance of the phase shifter can be single, so that the photomask can be produced easily.

In the first or the second method for producing a photomask, it is preferable that the mask pattern has a light-shielding film having the same outer shape, the phase shifter is disposed in an opening provided in the light-shielding film, and the step of forming the phase shifter includes determining the width of the opening such that the first light intensity is not more than four times the second light intensity.

This makes it possible that the transmittance of the phase shifter can be single, so that the photomask can be produced easily and ensures that the light intensity eventually generated in the light-shielded image region can be made smaller than the second light intensity, which ensures that the light-shielding properties of the mask pattern can be improved.

In the first or the second method for producing a photomask, it is preferable the mask pattern has a light-shielding film having the same outer shape, the phase shifter is disposed in an opening provided in the light-shielding film, and the step of forming the phase shifter includes determining the width of the opening such that the first light intensity is between 0.5 times and 2 times the second light intensity.

This makes it possible that the transmittance of the phase shifter can be single, so that the photomask can be produced easily and ensures that the light intensity eventually generated in the light-shielded image region can be made very small, which ensures that the light-shielding properties of the mask pattern can be improved.

It is preferable that in the case where the phase shifter is disposed in an opening provided in a light-shielding film having the same outer shape as that of the mask pattern, when a width of the mask pattern is Lm, $$Lm \leq (0.5 \times \lambda / NA) \times M \text{ is satisfied,}$$

where $\lambda$ is a wavelength of the exposure light, NA is a numerical aperture of a reduction projection optical system of an exposure apparatus, and M is a magnification factor of the reduction projection optical system.

This makes it possible to set the shape of the opening freely in the range in which the area of the opening is kept constant, so that the reliability of the photomask can be improved by selecting the shape of the opening in view of the degree of attachment between the light-shielding film and the substrate or the like.

A third method for producing a photomask is a method for forming a photomask including a mask pattern having light-shielding properties with respect to exposure light provided on a transparent substrate having light-transmitting properties with respect to the exposure light and includes forming a phase shifter that generates a phase difference of $(150+360\times n)$ degrees or more and $(210+360\times n)$ degrees or less, where n=an integer, with respect to the exposure light between the phase shifter and a light-transmitting portion in which the mask pattern is not formed on the transparent substrate and has a transmittance T (where 0<T<1) with respect to the exposure light, the phase shifter being formed in a region serving as the mask pattern. The step of forming the phase shifter includes calculating a light intensity Ia generated in a light-shielded image formation region corresponding to the mask pattern on an exposed material by the exposure light transmitted through the photomask when the mask pattern is constituted only by a light-shielding film, calculating a light intensity Ib generated in the light-shielded image formation region by the exposure light transmitted through the photomask when the transmittance T is 1, and the periphery of the mask pattern on the transparent substrate is covered with a light-shielding film, and determining a formation position and the transmittance T of the phase shifter such that $4 \times Ia \geq T \times Ib$ is satisfied.

According to the third method for forming a photomask, the light intensity (T×Ib) of the shifter transmitted light and the light intensity (Ia) of the mask pattern diffracted light can be calculated independently from each other, so that each light intensity can be calculated easily. Furthermore, the light intensity of the shifter transmitted light is not more than four times the intensity of the mask pattern diffracted light, so that the light intensity eventually generated in the light-shielded image formation region becomes smaller than the second light intensity. Therefore, the light-shielding properties of the mask pattern can be improved from those of the mask pattern constituted only by a complete light-shielding film, so that a pattern having an arbitrary size or shape can be formed by exposure using one photomask.

A fourth method for producing a photomask of the present invention is a method for forming a photomask including a mask pattern having light-shielding properties with respect to exposure light provided on a transparent substrate having light-transmitting properties with respect to the exposure light and includes forming a phase shifter that generates a phase difference of $(150+360\times n)$ degrees or more and $(210+360\times n)$ degrees or less, where n=an integer, with respect to the exposure light between the phase shifter and the light-transmitting portion in which the mask pattern is not formed on the transparent substrate and has a transmittance T (where 0<T<1) with respect to the exposure light, the phase shifter being formed in a region serving as the mask pattern. The step of forming the phase shifter includes calculating a light intensity Ia generated in a light-shielded image formation region corresponding to the mask pattern on an exposed material by the exposure light transmitted through the photomask when the mask pattern is constituted only by a light-shielding film, calculating a light intensity Ib generated in the light-shielded image formation region by the exposure light transmitted through the photomask when the transmittance T is 1, and the periphery of the mask pattern on the transparent substrate is covered with a light-shielding film, and determining a formation position and the transmittance T of the phase shifter such that $2 \times Ia \geq T \times Ib \geq 0.5 \times Ia$ is satisfied.

According to the fourth method for forming a photomask, the light intensity (T×Ib) of the shifter transmitted light and the light intensity (Ia) of the mask pattern diffracted light can be calculated independently from each other, so that each light intensity can be calculated easily. Furthermore, the light intensity of the shifter transmitted light is 0.5 times and 2 times the intensity of the mask pattern diffracted light, so that the light intensity eventually generated in the light-shielded image formation region becomes very small. Therefore, the light-shielding properties of the mask pattern can be improved significantly, so that a pattern having an arbitrary size or shape can be formed by exposure using one photomask.

In the third or the fourth method for forming a photomask, the light-shielding film constituting the mask pattern may have a transmittance of 15% or less with respect to the exposure light and may generate a phase difference of $(-30+360\times n)$ degrees or more and $(30+360\times n)$ degrees or less, where n=an integer, with respect to the exposure light between the light-shielding film and the light-transmitting portion.

A first method for designing a mask pattern according to the present invention is a method for designing a mask pattern for forming a photomask including a mask pattern having light-shielding properties with respect to exposure light provided on a transparent substrate having light-transmitting properties with respect to the exposure light. The mask pattern has a phase shifter that generates a phase difference of $(150+360\times n)$ degrees or more and $(210+360\times n)$ degrees or less, where n=an integer, with respect to the exposure light between the phase shifter and a light-transmitting portion in which the mask pattern is not formed on the transparent substrate. More specifically, the first method for designing a mask pattern includes creating a pattern layout that is a layout of the mask pattern and determining a transmittance T of the phase shifter, generating a plurality of divided patterns by dividing the pattern layout, calculating a light intensity Ic generated in a light-shielded image formation region corresponding to each of the divided patterns on an exposed material by the exposure light transmitted through the photomask when a light-shielding film is disposed in the entire pattern layout, calculating a light intensity Io generated in the light-shielded image formation region by the exposure light transmitted through the photomask when an opening is provided in a divided pattern in which the corresponding light intensity Ic is lager than a predetermined value of the divided patterns, and a light-shielding film is provided entirely in a portion other than that portion in the photomask, and providing the phase shifter in a divided pattern in which Ic/Io>T is satisfied of the divided patterns, providing a light-shielding portion in a divided pattern in which T/4>Ic/Io is satisfied of the divided patterns, and providing a light-shielding portion having an opening serving as the phase shifter in a divided pattern in which T≧Ic/Io≧T/4 is satisfied of the divided patterns.

According to the first method for designing a mask pattern, the light intensity of the mask pattern diffracted light and the light intensity of the shifter transmitted light can be calculated independently from each other so as to obtain the transmittance of the phase shifter and the size of the opening of the mask enhancer that can maximize the light-shielding properties based on the ratio of the light intensities. Thus, the transmittance of the phase shifter and the size of the opening of the mask enhancer that can maximize the light-shielding properties can be obtained easily with respect to an arbitrary layout of the mask pattern.

A second method for designing a mask pattern according to the present invention is a method for designing a mask pattern for forming a photomask including a mask pattern having light-shielding properties with respect to exposure light provided on a transparent substrate having light-transmitting properties with respect to the exposure light. The mask pattern has a phase shifter that generates a phase difference of (150+360×n) degrees or more and (210+360×n) degrees or less, where n=an integer, with respect to the exposure light between the phase shifter and a light-transmitting portion in which the mask pattern is not formed on the transparent substrate. More specifically, the second method for designing a mask pattern of the present invention includes creating a pattern layout that is a layout of the mask pattern and determining a transmittance T of the phase shifter, generating a plurality of divided patterns by dividing the pattern layout, calculating a light intensity Ic generated in a light-shielded image formation region corresponding to each of the divided patterns on an exposed material by the exposure light transmitted through the photomask when a light-shielding film is disposed in the entire pattern layout, calculating a light intensity Io generated in the light-shielded image formation region by the exposure light transmitted through the photomask when an opening is provided in a divided pattern in which the corresponding light intensity Ic is lager than a predetermined value of the divided patterns, and a light-shielding film is provided entirely in a portion other than that portion in the photomask, and providing the phase shifter in a divided pattern in which Ic/Io≧T/4 is satisfied of the divided patterns, and providing a light-shielding portion in a divided pattern in which T/4>Ic/Io is satisfied of the divided patterns.

According to the second method for designing a mask pattern, in addition to the advantages of the first method for designing a mask pattern, the following advantages can be provided. Since only the phase shifter and the light-shielding portion are used without using the mask enhancer as the mask pattern, mask pattern data that can realize sufficient light-shielding properties can be created easily.

A third method for designing a mask pattern according to the present invention is a method for designing a mask pattern for forming a photomask including a mask pattern having light-shielding properties with respect to exposure light provided on a transparent substrate having light-transmitting properties with respect to the exposure light. The mask pattern has a phase shifter that generates a phase difference of (150+360×n) degrees or more and (210+360×n) degrees or less, where n=an integer, with respect to the exposure light between the phase shifter and a light-transmitting portion in which the mask pattern is not formed on the transparent substrate. More specifically, the third method for designing a mask pattern of the present invention includes creating a pattern layout that is a layout of the mask pattern and determining a transmittance T of the phase shifter, calculating a maximum width Lmax at which a light-shielding effect of the phase shifter with respect to the exposure light is higher than that of a light-shielding film, and providing a light-shielding portion in a partial pattern whose width is larger than Lmax in the pattern layout, and providing the phase shifter in a partial pattern whose width is Lmax or less in the pattern layout.

According to the third method for designing a mask pattern, a mask pattern can be designed such that the light-shielding properties can be improved based on the width of the pattern layout without using optical simulations using mask data, which makes the mask pattern design easy.

A fourth method for designing a mask pattern according to the present invention is a method for designing a mask pattern for forming a photomask including a mask pattern having light-shielding properties with respect to exposure light provided on a transparent substrate having light-transmitting properties with respect to the exposure light. The mask pattern has a phase shifter that generates a phase difference of (150+360×n) degrees or more and (210+360×n) degrees or less, where n=an integer, with respect to the exposure light between the phase shifter and a light-transmitting portion in which the mask pattern is not formed on the transparent substrate. More specifically, the fourth method for designing a mask pattern of the present invention includes creating a pattern layout that is a layout of the mask pattern and determining two kinds of transmittances T1 and T2 (where T1>T2) of the phase shifter, generating a plurality of divided patterns by dividing the pattern layout, calculating a light intensity Ic generated in a light-shielded image formation region corresponding to each of the divided patterns on an exposed material by the exposure light transmitted through the photomask when a light-shielding film is disposed in the entire pattern layout, calculating a light intensity Io generated in the light-shielded image formation region by the exposure light transmitted through the photomask when an opening is provided in a divided pattern in which the corresponding light intensity Ic is lager than a predetermined value of the divided patterns, and a light-shielding film is provided entirely in a portion other than that portion in the photomask, providing the phase shifter in a divided pattern in which Ic/Io≧T2/4 is satisfied of the divided patterns, and providing a light-shielding portion in a divided pattern in which T2/4>Ic/Io is satisfied of the divided patterns, and setting the transmittance of the phase shifter in a divided pattern in which Ic/Io>$(T1^{0.5}+T2^{0.5})\times(T1^{0.5}+T2^{0.5})$ is satisfied of the divided patterns where the phase shifters are provided to be T1, and setting the transmittance of the phase shifter in a divided pattern in which Ic/Io≦$(T1^{0.5}+T2^{0.5})\times(T1^{0.5}+T2^{0.5})$ is satisfied of the divided patterns where the phase shifters are provided to be T2.

According to the fourth method for designing a mask pattern, in addition to the advantages of the first method for designing a mask pattern, the following advantages can be provided. Since only the phase shifter and the light-shielding portion are used without using the mask enhancer as the mask pattern, mask pattern data that can realize sufficient light-shielding properties can be created easily. Furthermore, in the situations in which phase shifters having a plurality of transmittances can be used, the phase shifters having different transmittances can be set such that higher light-shielding properties can be realized, and therefore the phase shifters having different transmittances can be arranged in appropriate positions.

In the first to the fourth methods for designing a mask pattern, the light-shielding film or the light-shielding portion provided in the pattern layout may have a transmittance of 15% or less with respect to the exposure light and may generate a phase difference of (−30+360×n) degrees or more and (30+360×n) degrees or less, where n=an integer, with respect to the exposure light between the light-shielding film or the light-shielding portion and the light-transmitting portion.

BRIEF DESCRIPTION OF DRAWINGS

FIGS. 6(a) to (c) are cross-sectional views showing each process of the pattern forming method according to the first embodiment of the present invention.

FIG. 8(a) is a plan view of a photomask having a mask pattern constituted by a phase shifter, and FIG. 8(b) is a view showing the manner in which exposure is performed with a photomask shown in FIG. 8(a).

FIG. 9(a) is a graph showing the simulation results of the light intensity distribution transferred on an exposed material when the transmittance of a phase shifter is varied in exposure with a photomask shown in FIG. 8(a), FIG. 9(b) is a graph showing the simulation results of the light intensity generated on an exposed material when the transmittance of a phase shifter and the line width L of a mask pattern are varied in the exposure with a photomask shown in FIG. 8(a), FIG. 9(c) is a graph showing the simulation results of the light intensity generated on an exposed material when the transmittance of a phase shifter and the line width L of a mask pattern are varied in the exposure with a photomask shown in FIG. 8(a), represented by contour lines of the light intensity with the transmittance T and the line width L in the vertical axis and the horizontal axis, respectively.

FIGS. 11(a) to (c) are graphs showing the simulation results of the light intensity Ih(L,T) generated on an exposed material when the transmittance T of a phase shifter and the line width L of a mask pattern are varied in the exposure with an image enhancement mask shown in FIG. 10, represented by contour lines of the light intensity with the transmittance T and the line width L in the vertical axis and the horizontal axis, respectively.

FIGS. 13(a) to (c) are graphs showing the simulation results of the light intensity Ih(L,T) generated on an exposed material when the transmittance T of a phase shifter and the line width L of a mask pattern are varied in the exposure with an image enhancement mask shown in FIG. 12, represented by contour lines of the light intensity with the transmittance T and the line width L in the vertical axis and the horizontal axis, respectively.

FIGS. 14(a) to (c) are graphs showing the conditions that satisfy Ih(L,T)=Ic(L) when the transmittance T of a phase shifter and the line width L of a mask pattern are varied in the exposure with an image enhancement mask shown in FIG. 10.

FIGS. 16(a) to (c) are cross-sectional views showing each process of the pattern forming method according to the second embodiment of the present invention.

FIG. 17(a) is a diagram showing the simulation results of the light intensity distribution projected on a resist film by the photomask shown in FIG. 15(b), FIG. 17(b) is a diagram showing the simulation results of the light intensity distribution taken along line AA' of FIG. 17(a), and FIG. 17(c) is a diagram showing the results of estimating the shape of a resist pattern from the simulation results of the light intensity distribution shown in FIG. 17(a).

FIG. 18(a) is a plan view of a photomask having a mask pattern constituted by a light-shielding film and an opening serving as a phase shifter provided in the light-shielding film, and FIG. 18(b) is a view showing the manner in which exposure is performed with the photomask shown in FIG. 18(a).

FIG. 19(a) is a graph showing the simulation results of the light intensity distribution transferred on an exposed material when the width S of the opening is varied in exposure with a photomask shown in FIG. 18(a), and FIG. 19(b) is a graph showing the simulation results of the light intensity generated on an exposed material when the line width L of a mask pattern and the width S of the opening are varied in the exposure with a photomask shown in FIG. 18(a), represented by contour lines of the light intensity with the line width L of the mask pattern and the width S of the opening in the vertical axis and the horizontal axis, respectively.

FIG. 20(a) is a plan view of a photomask having a mask pattern constituted by a light-shielding film and an opening serving as a phase shifter provided in the light-shielding film, and FIG. 20(b) is a view showing the manner in which exposure is performed with the photomask shown in FIG. 20(a).

FIGS. 25(a) to (c) are graphs showing the simulation results of the light intensity Ie (L,S) generated on an exposed material when the line width L of a mask pattern and the opening width S are varied in the exposure with an image enhancement mask shown in FIG. 24, represented by contour lines of the light intensity with the opening width S and the mask pattern width L in the vertical axis and the horizontal axis, respectively.

FIGS. 30(a) to (d) are schematic diagrams explaining the advantages of using a semi-light-shielding portion instead of a complete light-shielding portion as the light-shielding portion constituting a mask pattern in an image enhancement mask of the present invention.

FIGS. 31(a) to (g) are diagrams explaining the dependence of the light intensity distribution generated on an exposed material by exposure with a mask enhancer on the exposure light incident direction.

FIGS. 33(a) to (d) are graphs showing the principle of a method for improving the defocus characteristics utilizing a mask enhancer.

FIGS. 34(a) to (c) are graphs explaining the dependence of the profile shape change of the light intensity distribution by defocusing on the exposure light incident direction.

FIGS. 35(a) to (c) are graphs explaining the dependence of the profile shape change of the light intensity distribution by defocusing on the exposure light incident direction.

FIGS. 36(a) to (c) are graphs explaining the dependence of the profile shape change of the light intensity distribution by defocusing on the exposure light incident direction.

FIG. 38(a) is a diagram showing a linear mask pattern parallel to the Y axis on the coordinate of the light source, FIG. 38(b) is a diagram showing the positions of the light sources that are symmetric to the X axis and the Y axis on the coordinate of the light source and are four rotational symmetric, and FIG. 38(c) is a diagram showing the results of mapping the DOF of a mask pattern constituted by a complete light-shielding film with respect to the position of each light source when exposure is performed using a circular light source having a radius of 0.05 from the positions of the light sources with the coordinates (x, y) shown in FIG. 38(b).

FIG. 39(*a*) is a diagram showing a mask enhancer having a mask pattern width of L and a width of an opening serving as a phase shifter of S, and FIGS. 39(*b*) to (*d*) are diagrams showing the results of mapping the DOF of a mask pattern constituted by the mask enhancer shown in FIG. 39(*a*) with respect to the position of each light source.

FIGS. 41(*a*) to (*d*) are diagrams showing the results of obtaining the DOF values corresponding to the position of the light source on the diagonal line based on each DOF map, by obtaining the DOF map of a mask pattern (L/S=0.15/0 μm) constituted by a complete light-shielding film and the DOF map of a mask pattern (L/S=0.15/0.02, 0.04, 0.06 μm) constituted by a mask enhancer, in each of the cases where a KrF light source and a $F_2$ light source are used with a numerical aperture of a reduction projection optical system of an exposure apparatus of 0.6 and where an ArF light source is used with a numerical aperture of a reduction projection optical system of an exposure apparatus of 0.7 and 0.8.

FIGS. 52(*a*) and (*b*) are diagrams explaining of the mask pattern design method according to the fourth variation example of the fourth embodiment of the present invention.

FIGS. 53(*a*) to (*d*) are cross-sectional views showing each process of a conventional pattern forming method.

FIG. 54(*a*) is a diagram showing an example of the layout of a mask pattern on a photomask used in an exposure process shown in FIG. 53(*c*), FIG. 54(*b*) is a diagram showing the simulation results of a light intensity distribution projected on a resist film by the photomask shown in FIG. 54(*a*), FIG. 54(*c*) is a diagram showing the simulation results of the light intensity distribution along line AA' of FIG. 54(*b*), and FIG. 54(*d*) is a diagram showing the results of estimating the shape of the resist pattern from the simulation results of the light intensity distribution shown in FIG. 54(*b*).

FIG. 55(*a*) is a diagram showing another example of the layout of a mask pattern on a photomask used in the exposure process shown in FIG. 53(*c*), FIG. 55(*b*) is a diagram showing the simulation results of a light intensity distribution projected on a resist film by the photomask shown in FIG. 55(*a*), FIG. 55(*c*) is a diagram showing the simulation results of the light intensity distribution along line AA' of FIG. 55(*b*), and FIG. 55(*d*) is a diagram showing the results of estimating the shape of the resist pattern from the simulation results of the light intensity distribution shown in FIG. 55(*b*).

FIG. 56(*a*) is a diagram showing an example of the layout of a desired pattern to be formed in the conventional pattern forming method, and FIGS. 56(*b*) and (*c*) are plan views of conventional two photomasks used for forming the pattern shown in FIG. 56(*a*).

FIG. 57(*a*) is a diagram showing another example of the layout of a desired pattern to be formed in the conventional pattern forming method, and FIGS. 57(*b*) and 56(*c*) are plan views of conventional two photomasks used for forming the pattern shown in FIG. 57(*a*).

BEST MODE FOR CARRYING OUT THE INVENTION

Hereinafter, a method for forming a more effective mask pattern having higher light-shielding properties than those of a mask pattern constituted by a complete light-shielding film using interference of light with a 0 degree phase and light with a 180 degree phase, which was devised to realize the present invention, will be described with reference of the accompanying drawings.

First, the reason why there is a lower limit for the pattern size that can be formed in the pattern formation with light exposure will be described with reference to FIGS. 1(*a*) to (*d*).

Figure 1:
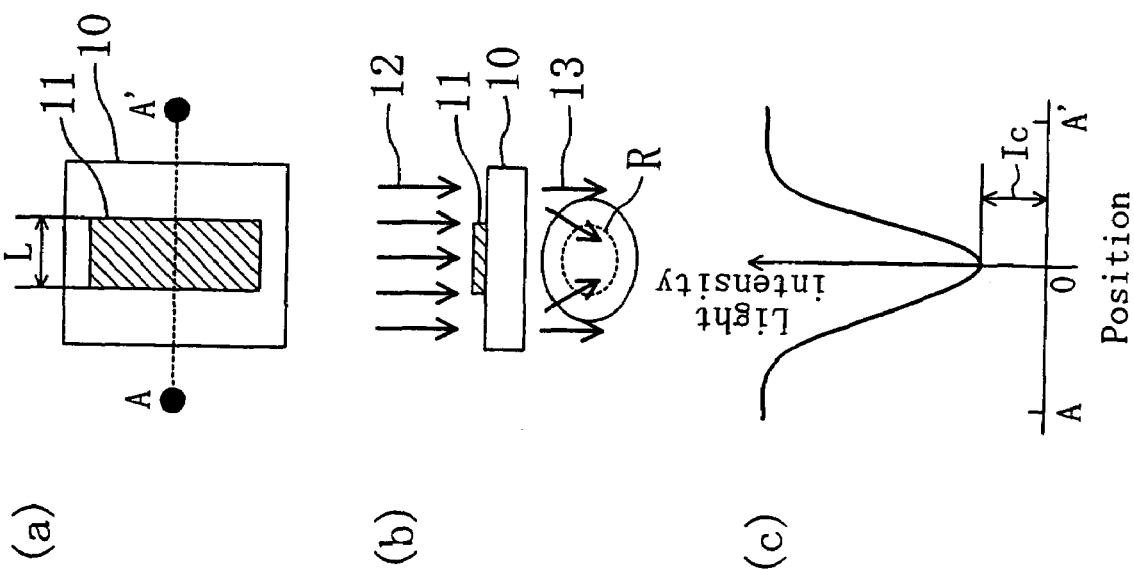
FIG. 1(a) is a plan view of a photomask having a mask pattern constituted by a complete light-shielding film.
FIG. 1(b) is a view showing the manner in which exposure is performed with the photomask shown in FIG. 1(a)
FIG. 1(c) is a diagram showing the light intensity distribution transferred on an exposed material in the exposure with the photomask shown in FIG. 1(a)
FIG. 1(d) is a diagram showing the simulation results of the light intensity distribution transferred on an exposed material when the line width L of a mask pattern is varied in the exposure with the photomask shown in FIG. 1(a).

FIG. 1(*a*) is a plan view of a photomask having a mask pattern constituted by a complete light-shielding film. As shown in FIG. 1(*a*), a mask pattern 11 with a line width L constituted by a complete light-shielding film is formed on a transparent substrate 10.

FIG. 1(*b*) shows the manner in which exposure is performed with the photomask shown in FIG. 1(*a*), and FIG. 1(*c*) shows the light intensity distribution transferred at the position corresponding to line AA' of FIG. 1(*a*) on an exposed material in the exposure with the photomask shown in FIG. 1(*a*). As shown in FIG. 1(*b*), exposure light 12 is shielded by the mask pattern 11, but a part of the exposure light 12 transmitted through in the periphery of the mask pattern 11 in the transparent substrate 10, that is, transmitted light 13 diffracts to a region R on the back of the mask pattern 11. As a result, as shown in FIG. 1(*c*), the light intensity Ic is not 0 at the position (0 in the horizontal axis) corresponding to the central portion of the mask pattern 11 on the exposed material.

FIG. 1(*d*) shows the simulation results of the light intensity distribution transferred on the exposed material when the line width L of the mask pattern 11 is varied in the exposure with the photomask shown in FIG. 1(*a*). The optical conditions in the simulations are such that the wavelength λ of the exposure light=0.193 μm; the numerical aperture NA of the projecting optical system of the exposure apparatus=0.6; the interference degree (coherence degree) a of the exposure apparatus=0.8. In this case, the value of $0.4 \times \lambda/NA$ is about 0.13 μm. As shown in FIG. 1(d), when the line width L is changed from 0.14 μm to 0.1 μm, the light intensity is increased drastically at the position (0 in the horizontal axis) corresponding to the central portion of the mask pattern 11 on the exposed material. In other words, as the line width L of the mask pattern 11 becomes smaller, light going into the back side of the mask pattern 11 increases, so that the light-shielding properties of the mask pattern 11 are deteriorated, which limits the pattern size that can be formed is limited. More specifically, when the line width L of the mask pattern 11 is smaller than about $0.8 \times \lambda/NA$, the light going into the back side of the mask pattern 11 begins to increase and when the line width L of the mask pattern 11 is smaller than about $0.4 \times \lambda/NA$, the light going into the back side of the mask pattern 11 increases drastically, so that it becomes difficult to form a pattern.

Figure 2:
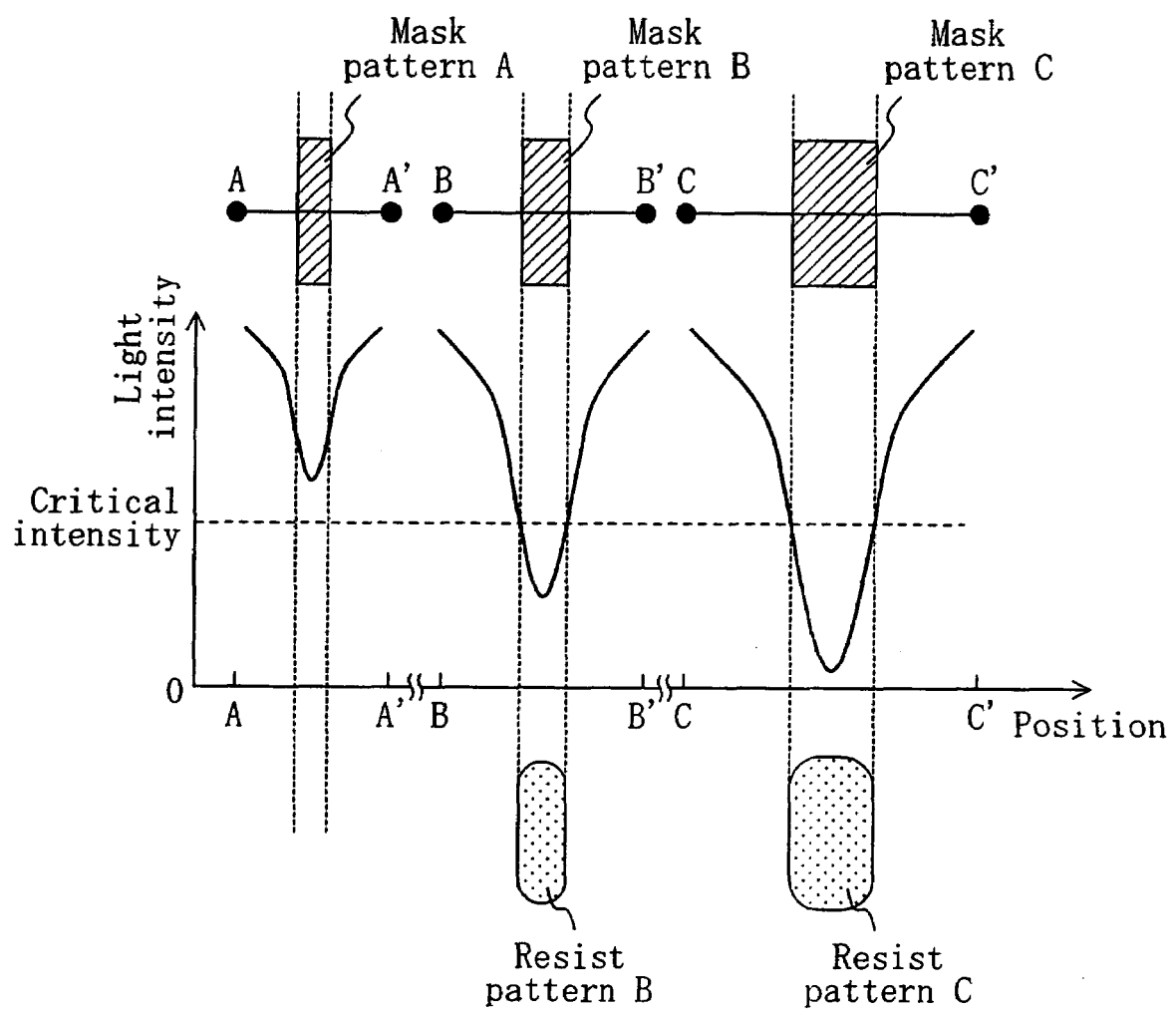
FIG. 2 is a diagram showing a change in the light intensity distribution transferred on a resist film and a change in the shape of a resist pattern formed after the resist film is developed when the line width of a mask pattern is varied in the exposure with the photomask.

FIG. 2 shows a change in the light intensity distribution transferred on an exposed material (to be specific, a resist film) and a change in the shape of the resist pattern formed after the resist film is developed when the line width of a mask pattern is varied in exposure with a photomask.

As shown FIG. 2, it is necessary to reduce the line width of a mask pattern in order to form a resist pattern having a small line width. In the case of a mask pattern having a sufficiently large line width as a mask pattern C, the exposure light is sufficiently shielded, so that a resist pattern C having a desired shape can be formed. Furthermore, as the line width of the mask pattern becomes smaller, the light-shielding properties of the mask pattern are deteriorated, so that the light intensity in a region corresponding to the mask pattern in the resist film becomes larger. In this case, when the light going into the back side of the mask pattern from the periphery of the mask pattern (hereinafter, referred to as "mask pattern diffracted light") does not cause the light intensity to be beyond the critical intensity even if the light-shielding properties are deteriorated, the pattern resolution is possible as in the case of the mask pattern B, and the line width of the resist pattern can be reduced by reducing the line width of the mask pattern. However, as in the case of the mask pattern A, when the light intensity exceeds the critical intensity because of the mask pattern diffracted light, a resist pattern cannot be formed any more.

Next, a method for realizing a desired light intensity distribution by canceling the mask pattern diffracted light to let the light-shielding properties of the mask pattern effectively higher than those of the complete light-shielding film (hereinafter, referred to as "image enhancement") will be described with reference to FIGS. 3 and 4.

Figure 3:
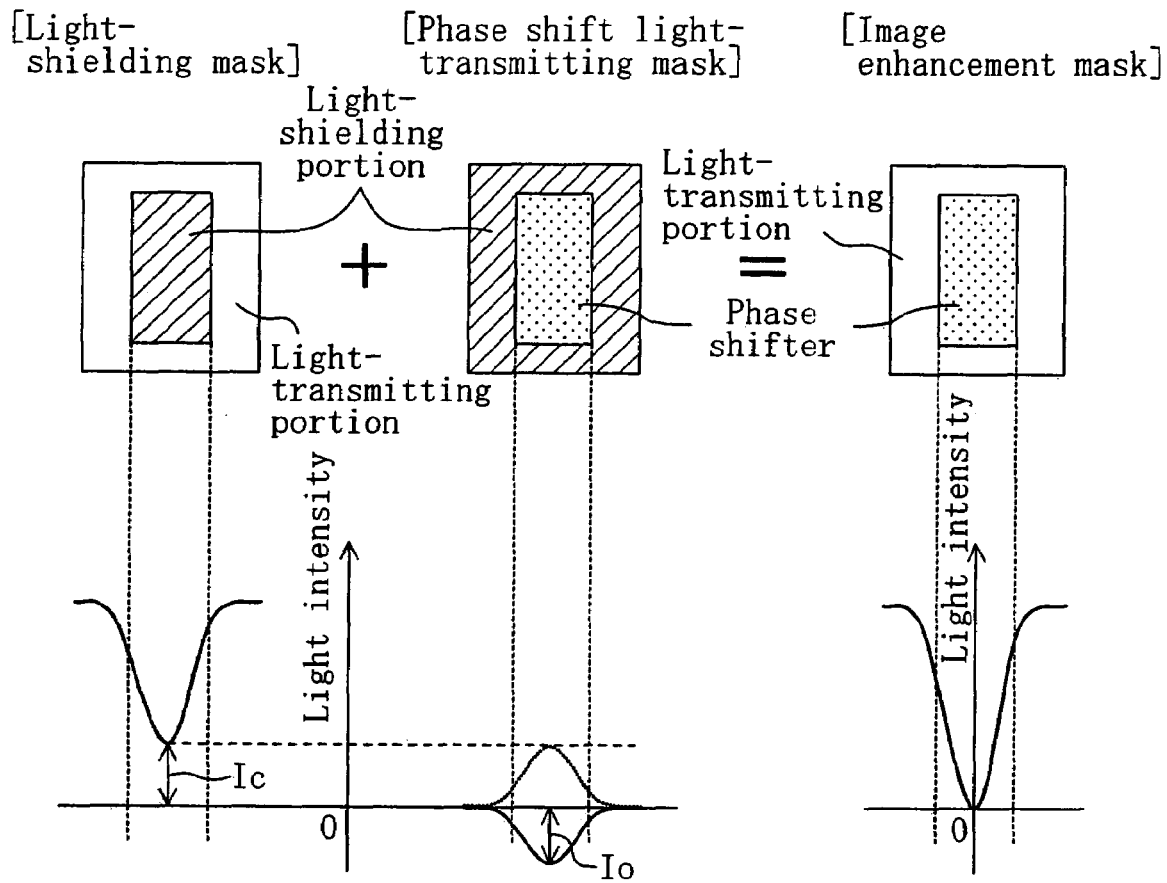
FIG. 3 is a schematic view showing the principle of image enhancement of the present invention.

FIG. 3 is a schematic view showing the principle of the image enhancement of the present invention.

In general, lights having opposite phases to each other, that is, lights having a phase difference of 180 degrees, have the light intensity that are opposite in the plus and minus in a phase space. Therefore, when lights having phase difference of 180 degrees interfere with each other, the light intensities of the lights can be cancelled. When the diffracted light from the periphery of the mask pattern interfere with a light having an opposite phase relationship, using this principle, the light intensities of the lights can be cancelled, so that a very high light-shielding effect can be realized by the mask pattern.

In the image enhancement mask of the present invention shown in FIG. 3, a phase shifter that transmits light having an opposite phase to that of the light transmitted through a regular light-transmitting portion is provided as a mask pattern, and the intensity of the light transmitted through the phase shifter (hereinafter, referred to as "shifter transmitted light") is matched to the intensity of the diffracted light (that is the mask pattern diffracted light) from the light-transmitting portion in the periphery of the phase shifter, that is, the periphery of the mask pattern. Thus, the state in which light is completely shielded on the back side of the mask pattern can be realized. In this case, the intensity of the shifter transmitted light can be adjusted by adjusting the size or the transmittance (with respect to the exposure light) of the phase shifter.

The intensity of the mask pattern diffracted light in the image enhancement mask can be obtained by using a light-shielding mask shown in FIG. 3 (a light-shielding film constituted by a complete light-shielding film is provided, instead of the phase shifter of the image enhancement mask). Furthermore, the intensity of the shifter transmitted light in the image enhancement mask can be obtained by using a phase shift transmitted mask shown in FIG. 3 (a light-shielding portion constituted by a complete light-shielding film is provided, instead of the light-transmitting portion of the image enhancement mask). In this case, when the intensity of the mask pattern diffracted light is Ic and the intensity of the shifter transmitted light is Io, the condition that can realize the state in which light is completely shielded on the back side of the mask pattern of the image enhancement mask is Ic=Io.

Figure 4:
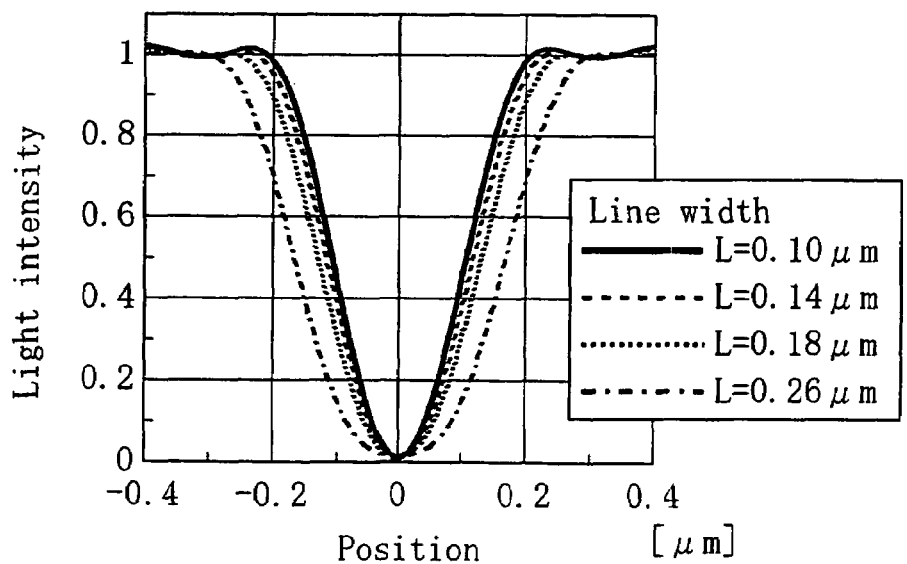
FIG. 4 is a graph showing the simulation results of the light intensity distribution transferred on an exposed material when the line width of a phase shifter is varied in exposure with an image enhancement mask shown in FIG. 3.

FIG. 4 shows the simulation results of the light intensity distribution transferred on an exposed material when the line width of the mask pattern, that is, the phase shifter is varied in the exposure with the image enhancement mask shown in FIG. 3. In the image enhancement mask having a phase shifter with each line width, the transmittance of the phase shifter is optimized such that the mask pattern diffracted light is cancelled by the shifter transmitted light having an opposite phase most satisfactorily. Furthermore, the optical conditions in the simulations are the same as those of the simulations shown in FIG. 1(d).

When the results shown in FIG. 4 are compared with the results shown in FIG. 1(d), the exposure method with the image enhancement mask, that is, the image enhancement of the present invention improves the light-shielding properties of a mask pattern having a line width of less than about $0.8 \times \lambda/NA$, and thus a desired light intensity distribution can be realized.

First Embodiment

Hereinafter, a photomask according to a first embodiment of the present invention, a method for producing the same and a method for forming a pattern using the photomask will be described with reference of the accompanying drawings.

When the magnification factor of the reduced projecting optical system of the exposure apparatus is M, in general, a mask pattern having a size M times larger than the designed value of a desired pattern (generally resist pattern) is drawn on a substrate made of a material having a high transmittance with respect to the exposure light (hereinafter, referred to as "transparent substrate"), using a material such as chromium that can be formed into a complete light-shielding film with respect to the exposure light, so as to produce a photomask, and exposure is performed using the photomask As the exposure light, i line (wavelength 365 nm), KrF excimer laser light (wavelength 248 nm), ArF excimer laser light (wavelength 193 nm), or $F_2$ excimer laser light (wavelength 157 nm) can be used, for example. In this specification, the size of the resist pattern may be used to indicate the size of the mask pattern, instead of the actual size on the photomask (a value M times larger than the size of the resist pattern).

A first feature of the first embodiment is as follows. A light-shielding film portion corresponding to a region in which the light intensity in the light intensity distribution transferred on an exposed material (to be specific, a resist film) is not sufficiently decreased by a mask pattern during exposure in the case where the mask pattern corresponding to a desired pattern are produced with a light-shielding film is replaced by a phase shifter, so that a mask pattern is produced, and exposure is performed with a photomask having that mask pattern. Herein, the phase shifter refers to a light-transmitting portion that reverses the phase of light transmitted through this portion by 180 degrees (to be specific, 150+360×n) degrees or more and (210+360×n) degrees or less (where n is an integer)) with respect to the phase of the light transmitted through a regular light-transmitting portion. More specifically, the phase shifter can be produced, for example, using a transparent film or the like having a thickness that generates an optical path difference of a half of the wavelength of the exposure light.

A second feature of the first embodiment is as follows. The phase shifter provided as a mask pattern may have a plurality of transmittances, and a light-shielding film portion that corresponds to a region having a lower reduction degree in the light intensity in the light intensity distribution transferred onto an exposed material through a mask pattern constituted only by a light-shielding film is replaced by a phase shifter having a higher transmittance.

Figure 5:
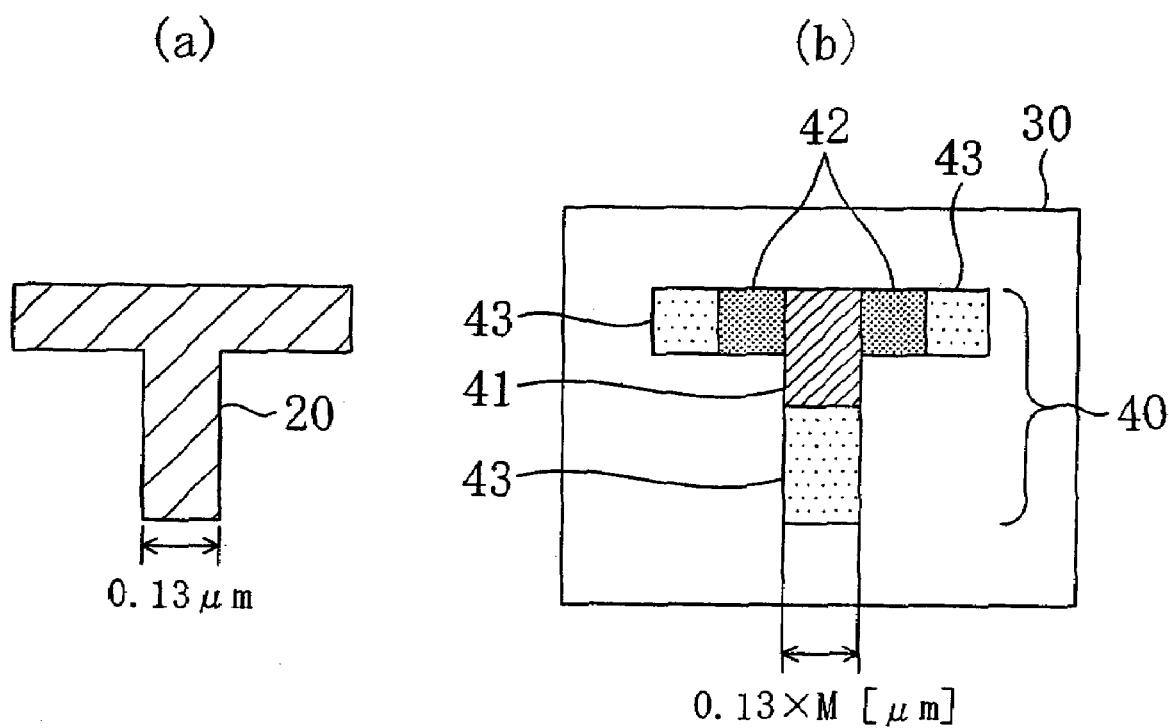
FIG. 5(a) is a diagram showing an example of a design layout of a desired pattern to be formed in a pattern forming method according to a first embodiment of the present invention.
FIG. 5(b) is a plan view of a photomask according to the first embodiment of the present invention used to form the pattern shown in FIG. 5(a).

FIG. 5(a) shows an example of a design layout of a desired pattern (resist pattern) to be formed in the first embodiment. As shown in FIG. 5(a), the width of a pattern 20 is 0.13 μm.

FIG. 5(b) is a plan view of a photomask according to the first embodiment used to form the pattern shown in FIG. 5(a). As shown in FIG. 5(b), the photomask of the first embodiment is obtained by forming a mask pattern 40 corresponding to the pattern shown in FIG. 5(a) on a transparent substrate 30. The mask pattern 40 has a size (actual size) of 0.13×M[μm] (M: magnification factor of a reduced projecting optical system of an exposure apparatus). The mask pattern 40 has a light-shielding portion 41 constituted by a light-shielding film such as a chromium film, a first phase shifter 42 having a transmittance of 10%, and a second phase shifter 43 having a transmittance of 50%.

For comparison, FIG. 55(a) shows a plan view of a conventional photomask used to form the pattern shown in FIG. 5(a) whose mask pattern is constituted only by a light-shielding film (see the section of the background of the invention), and FIG. 55(b) shows the simulation results of the light intensity distribution projected onto a resist film by the photomasks shown in FIG. 55(a). More specifically, in the mask pattern 40 shown in FIG. 5(b), the portion of the light-shielding film constituting the mask pattern 812 shown in FIG. 55(a) in which the light-shielding properties are sufficient is left as it is as the light-shielding portion 41, and the portion of the light-shielding film in which the light-shielding properties are not sufficient is replaced by a phase shifter (the first phase shifter 42 and the second phase shifter 43). Here, the portion corresponding to the edge of the mask pattern 812 in which the light-shielding properties are particularly weak is replaced by a phase shifter having a higher transmittance (the second phase shifter 43).

FIGS. 6(a) to (c) are cross-sectional views showing each process of the pattern forming method according to the first embodiment of the present invention, more specifically, each process of the pattern forming method by exposure using the photomask shown in FIG. 5(b). First, as shown in FIG. 6(a), a film to be processed 51 made of a metal film, an insulating film or the like is formed on a substrate 50, and then a positive resist film 52 is formed on the film to be processed 51. Thereafter, as shown in FIG. 6(b), the resist film 52 is irradiated with exposure light 53 through the photomask of the first embodiment obtained by the mask pattern 40 is formed on the transparent substrate 30 (see FIG. 5(b)). Thus, the portion corresponding to the mask pattern 40 in the resist film 52 becomes a non-exposed portion 52a and other portions in the resist film 52 become an exposed portion 52b. Thereafter, as shown in FIG. 6(c), a resist pattern 54 constituted by the non-exposed portion 52a is formed by developing the resist film 52.

Figure 7:
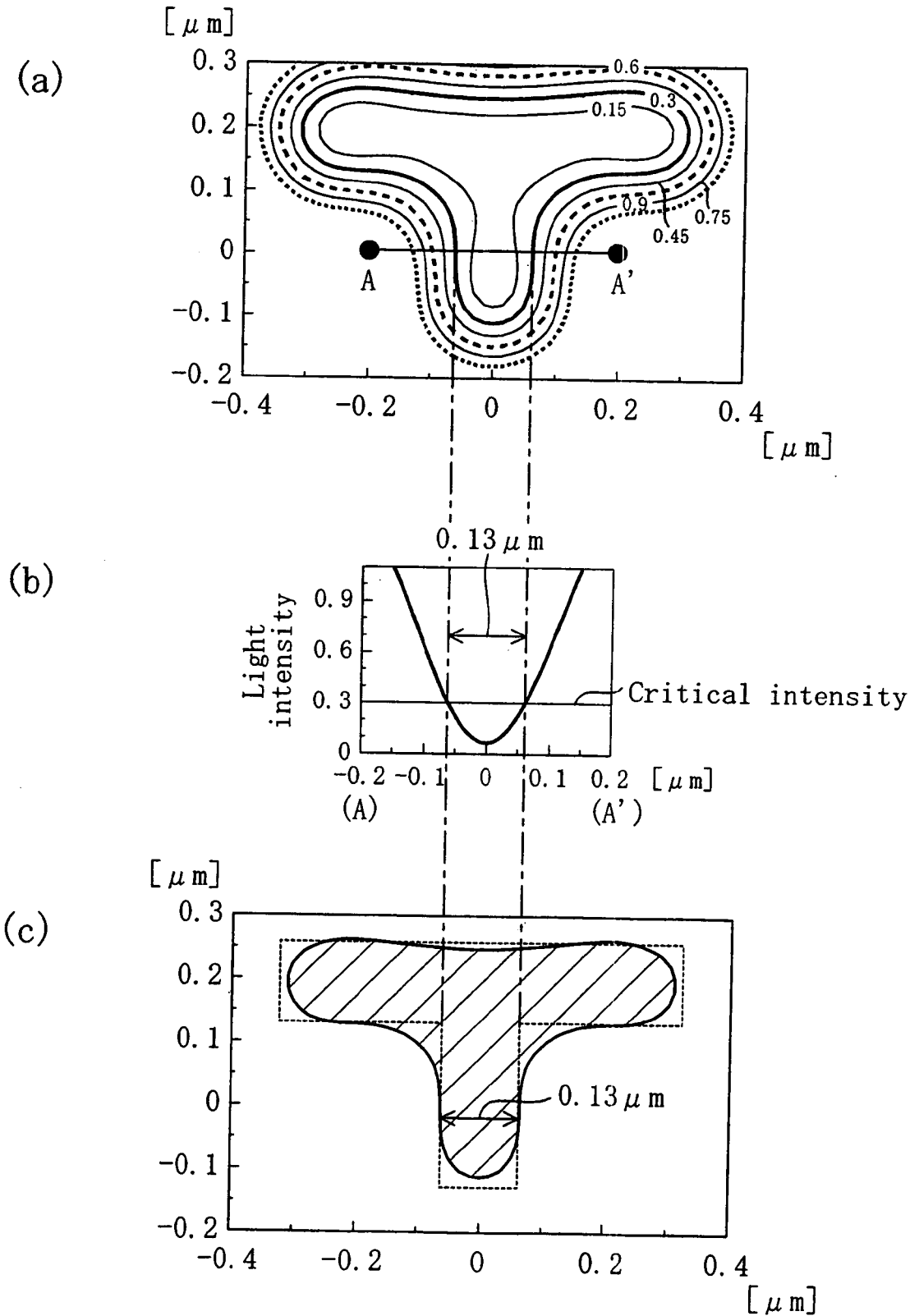
FIG. 7(a) is a diagram showing the simulation results of the light intensity distribution projected on a resist film by the photomask shown in FIG. 5(b)
FIG. 7(b) is a diagram showing the simulation results of the light intensity distribution taken along line AA' of FIG. 7(a)
FIG. 7(c) is a diagram showing the results of estimating the shape of a resist pattern from the simulation results of the light intensity distribution shown in FIG. 7(a).

FIG. 7(a) shows the simulation results of the light intensity distribution projected on the resist film 52 by the photomask shown in FIG. 5(b). The simulation conditions are that the wavelength λ of the exposure light 53=0.193 nm; the numerical aperture NA of the projecting optical system of the exposure apparatus=0.6; and the interference degree a of the exposure apparatus=0.8 (hereinafter, these simulation conditions are used when the simulation results are shown, unless otherwise specified). In this case, the relationship of 0.13×M [μm]≈0.4×M×λ/NA is satisfied with respect to the size of the mask pattern 40 shown in FIG. 5(b). In FIG. 7(a), the light intensity distribution is shown with contour lines of the relative light intensity in the two-dimensional relative coordinate system.

When comparing the simulation results shown in FIG. 7(a) and the simulation results shown in FIG. 55(b), the following can be understood. When the conventional photomask in which the mask pattern is constituted only by a light-shielding film is used and the size of the mask pattern is narrowed to about a half of λ/NA or less, then the light-shielding properties at the edge portion of the mask pattern or the like are deteriorated significantly. As a result, the shape of the light intensity distribution is significantly different from a desired pattern shape. On the other hand, when the photomask of the first embodiment is used, a phase shifter having a higher transmittance is provided in a portion in which sufficient light-shielding properties cannot be obtained by the light-shielding film in the mask pattern, so that sufficient light-shielding properties can be realized throughout the mask pattern. This, a resist pattern having a shape closer to a desired shape can be formed. This is achieved by utilizing interference between light with a 0 degree phase and light with a 180 degree phase so as to use the conditions that make the effective light-shielding properties of the phase shifter better than those of the light-shielding film.

FIG. 7(b) shows the simulation results of the light intensity distribution taken along line AA' of FIG. 7(a), and FIG. 7(c) shows the results of estimating the shape of the resist pattern 54 from the simulation results of the light intensity distribution shown in FIG. 7(a). As shown in FIG. 7(b), the critical intensity is 0.3, the distribution shape of the critical intensity values in the light intensity distribution shown in FIG. 7(a) is substantially matched to the shape of the mask pattern 40. As a result, the resist pattern 54 (hatched portion) having substantially a desired shape (shape shown by broken lines), as shown in FIG. 7(c), can be obtained.

As described above, according to the first embodiment, the phase shifter is provided in the mask pattern on the photomask, so that the mask pattern diffracted light is cancelled by the shifter transmitted light. Thus, the light-shielding properties of the mask pattern can be improved from the mask pattern constituted only by a complete light-shielding film, and therefore a pattern having an arbitrary size or shape can be formed by exposure using one photomask.

Hereinafter, the relationship between the transmittance and the line width of the phase shifter provided as a mask pattern in the photomask of the first embodiment and the light intensity distribution projected onto an exposed material by the mask pattern will be described in detail.

FIG. 8(a) is a plan view of a photomask having a mask pattern constituted by a phase shifter. As shown in FIG. 8(a), a mask pattern 61 with a line width L constituted by a transparent film serving as a phase shifter is formed on a transparent substrate 60.

FIG. 8(b) shows the manner in which exposure is performed with the photomask shown in FIG. 8(a). As shown in FIG. 8(b), exposure light 62 becomes a first transmitted light 63 after being transmitted through the periphery of the mask pattern 61 in the transparent substrate 60, and becomes a second transmitted light 64 after being transmitted through the mask pattern 61.

FIG. 9(a) shows the simulation results of the light intensity distribution transferred at a position corresponding to line AA' of FIG. 8(a) on an exposed material when the transmittance of the phase shifter is varied in the exposure with the photomask shown in FIG. 8(a). The simulation conditions are that the wavelength λ of the exposure light=0.193 μm; the numerical aperture NA of the projecting optical system of the exposure apparatus=0.6; the interference degree σ of the exposure apparatus=0.8; and the line width L=0.1 μm. The point O on the line AA' is positioned in the center of the mask pattern 61.

As shown in FIG. 9(a), as the transmittance of the phase shifter becomes higher, the light intensity of the position (0 in the horizontal axis) corresponding to the center O of the mask pattern 61 in the exposed material is decreased and the shape of the light intensity distribution is better. When the mask pattern 61 is constituted by a complete light-shielding film (a transmittance of 0%), the shape of the light intensity distribution is worst. However, in the first embodiment, a higher transmittance of the phase shifter is not always better. The reason for this will be described below.

FIG. 9(b) shows the simulation results of the light intensity generated at the position corresponding to the point O of FIG. 8(a) on the exposed material when the transmittance of the phase shifter and the line width L of the mask pattern are varied in the exposure with the photomask shown in FIG. 8(a).

As shown in FIG. 9(b), there is a line width L in which the effective light-shielding properties are highest with respect to the mask pattern constituted by a phase shifter of each transmittance, and there is a line width L in which the light-shielding properties are started to be worse than those of the complete light-shielding film. In the photomask shown in FIG. 8(a), the light-shielding properties of the mask pattern 61 are improved by cancel the light transmitted through the periphery of the mask pattern 61 on the transparent substrate 60 and going into the back side of the mask pattern 61 (that is, mask pattern diffracted light) by the light transmitted through the mask pattern 61 (that is, shifter transmitted light). Therefore, when the balance between the mask pattern diffracted light and the shifter transmitted light is optimized, the effective light-shielding properties of the mask pattern 61 are highest. On the other hand, when the shifter transmitted light is excessive with respect to the mask pattern diffracted light, the effective light-shielding properties of the mask pattern 61 are decreased and may be lower than the light-shielding properties of the mask pattern constituted by a complete light-shielding film in some cases.

FIG. 9(c) shows the simulation results of the light intensity distribution generated at the position corresponding to the point O of FIG. 8(a) on the exposed material when the transmittance T of the phase shifter and the line width L of the mask pattern are varied in the exposure with the photomask shown in FIG. 8(a), represented by contour lines of the light intensity with the transmittance T and the line width L in the vertical axis and the horizontal axis, respectively.

The cross-hatched region shown in FIG. 9(c) shows the combination condition of the line width L of the mask pattern and the transmittance T of the phase shifter that maximize the effective light-shielding properties of the mask pattern. In other words, in these combination conditions, the mask pattern diffracted light and the shifter transmitted light are cancelled each other. Therefore, the shape of the light intensity distribution projected on an exposed material through the mask pattern can be made close to a desired shape by determining the transmittance T of the phase shifter that maximizes the effective light-shielding properties of each mask pattern with respect to the line width L of each mask pattern, based on these combination conditions.

In FIG. 9(c), the combination conditions (the conditions for maximizing the light-shielding properties) of the line width L and the transmittance T that maximize the effective light-shielding properties of the mask pattern are obtained by actually calculating the light intensity distribution transferred onto an exposed material using various line widths L of the mask pattern and various transmittances T of the phase shifter. However, for obtaining the conditions for maximizing the light-shielding properties by this method, calculation takes a very long time, which makes it difficult, for example, to obtain the optimal transmittance T of the phase shifter with respect to an arbitrary line width L of the mask pattern.

Next, a simple method for calculating the conditions for maximizing the light-shielding properties, more specifically, a simple method for obtaining the optimal transmittance T of the phase shifter with respect to an arbitrary line width L of the mask pattern (hereinafter, referred to as a "mask pattern overlapping method") that has been found out by the inventors of the present invention will be described.

Figure 10:
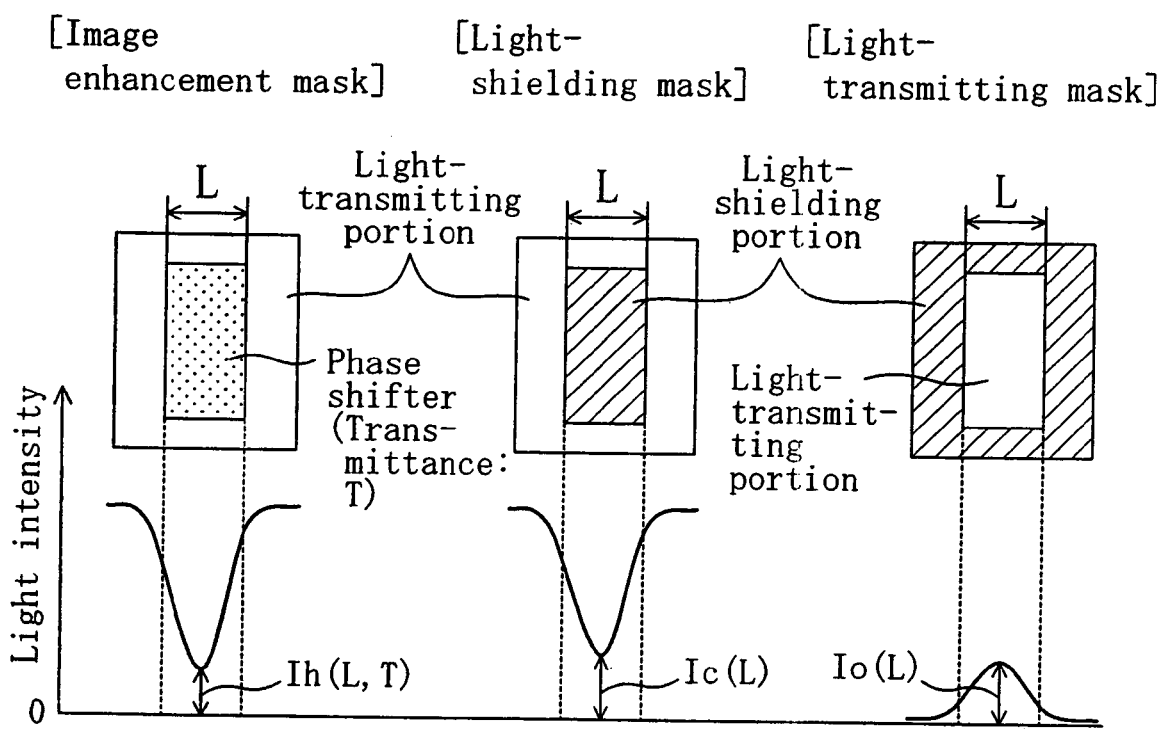
FIG. 10 is a schematic view showing the principle of a method of overlapping a mask pattern of the present invention regarding the case of an image enhancement mask having a mask pattern with a line width L constituted by a phase shifter with a transmittance T.

FIG. 10 is a schematic view showing the principle of the mask pattern overlapping method of the present invention regarding the case of a mask pattern with a line width L constituted by a phase shifter with a transmittance T.

As shown in FIG. 10, in the exposure using a photomask (image enhancement mask) having a mask pattern with a line width L constituted by a phase shifter with a transmittance T, the light intensity generated at the position corresponding to the center of the mask pattern on the exposed material is taken as Ih(L,T). In the exposure using a photomask (light-shielding mask) in which a complete light-shielding film is provided as a mask pattern instead of the phase shifter of the image enhancement mask, the light intensity generated at the position corresponding to the center of the mask pattern on the exposed material is taken as Ic(L). In the exposure using a photomask (light-transmitting mask) in which a regular light-transmitting portion is provided instead of the phase shifter of the image enhancement mask and a light-shielding portion constituted by a complete light-shielding film is provided instead of the light-transmitting portion of the image enhancement mask, the light intensity generated at the position corresponding to the center of the mask pattern on the exposed material is taken as Io(L). In this case, as described in the principle (see FIG. 3) of the image enhancement of the present invention, in the image enhancement mask, the intensity of the mask pattern diffracted light generated at the position corresponding to the center of the mask pattern on the exposed material corresponds to Ic (L), and the light intensity of the shifter transmitted light generated at the position corresponding to the center of the mask pattern on the exposed material corresponds to T×Io (L). Therefore, the light intensity Ih(L, T) can be approximated to a value obtained by converting the light intensity Ic(L) and the light intensity T×Io(L) to the light intensities in a phase space, overlapping the two light intensities, and squaring the result. That is, $$Ih(L,T)=((Ic(L))^{0.5}-(T\times Io(L))^{0.5})^2.$$

Therefore, in the image enhancement mask, the condition that provides the smallest Ih(L,T), that is, the condition that maximizes the light-shielding properties of the mask pattern is:

Ic(L)=T×Io(L). In other words, the optimal transmittance T of the phase shifter with respect to an arbitrary line width L of the mask pattern can be obtained with $$T=Ic(L)/Io(L).$$

FIGS. 11(a) to (c) show the simulation results of the light intensity Ih(L,T) generated at the position corresponding to the center of the mask pattern on the exposed material when the transmittance T of the phase shifter and the line width L of the mask pattern are varied in the exposure with the image enhancement mask shown in FIG. 10, represented by contour lines of the light intensity with the transmittance T and the line width L in the vertical axis and the horizontal axis, respectively. Herein, in each of FIGS. 11(a) to (c), the graph indicating the relationship of T=Ic(L)/Io(L) described above is superimposed. The simulation results shown in FIGS. 11(a) to (c) are obtained using different exposure light sources. The simulation results shown in FIG. 11(a) are obtained using regular exposure with a circular light source. The simulation results shown in FIG. 11(b) are obtained using annular exposure with an annular light source. The simulation results shown in FIG. 11(c) are obtained using quadrupole exposure with light sources positioned at four points on diagonal coordinates. Other simulation conditions are such that the wavelength of the exposure light λ=0.193 μm, and the numerical aperture NA of the projecting optical system of the exposure apparatus=0.6.

As shown in FIGS. 11(a) to (c), the dependence of the light intensity Ih(L,T) on the transmittance T of the phase shifter and the line width L of the mask pattern is slightly varied depending on the shape of the exposure light source, but the condition that provides the smallest light intensity Ih(L,T) can be represented accurately by the relationship of T=Ic(L)/Io(L), regardless of the shape of the exposure light source.

Figure 12:
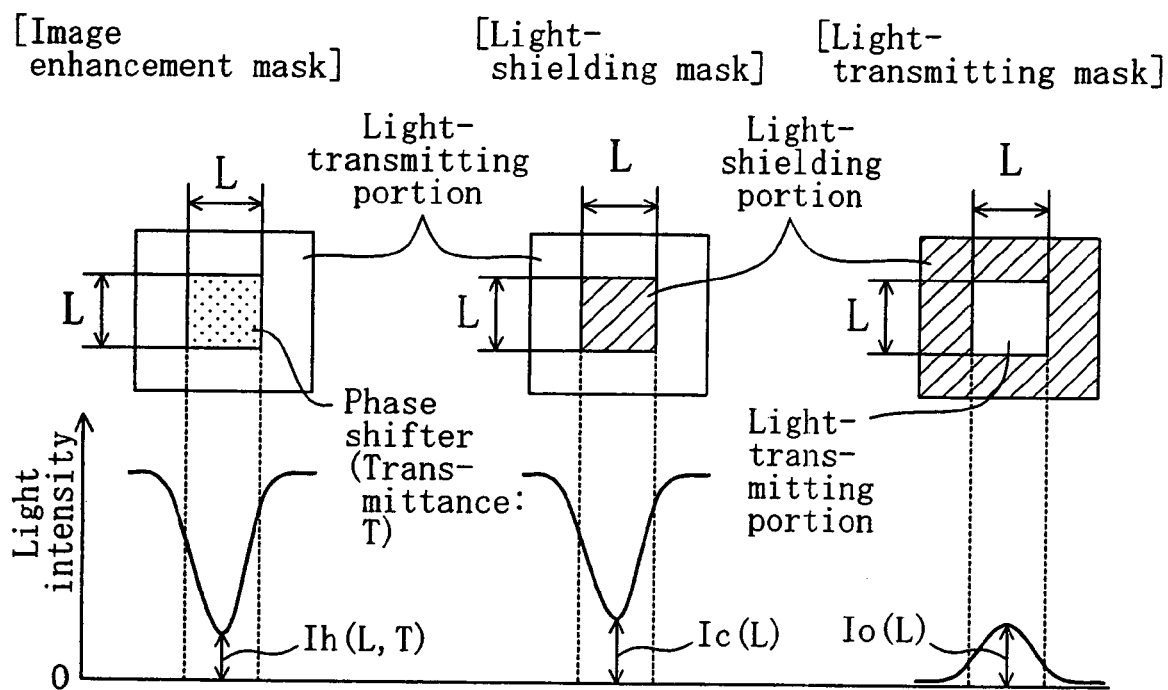
FIG. 12 is a schematic view showing the principle of a method of overlapping a mask pattern of the present invention regarding the case of an image enhancement mask having a mask pattern with a square shape (the length of one side is L) constituted by a phase shifter with a transmittance T.

FIG. 12 is a schematic view showing the principle of the mask pattern overlapping method of the present invention regarding the case of the image enhancement mask having a mask pattern with a square shape (the length of one side is L) constituted by a phase shifter with a transmittance T. Also in the image enhancement mask shown in FIG. 12, the light intensity of the mask pattern diffracted light generated at the position corresponding to the center of the mask pattern on the exposed material corresponds to Ic(L), and the light intensity of the shifter transmitted light generated at the position corresponding to the center of the mask pattern on the exposed material corresponds to T×Io(L). Therefore, also in the image enhancement mask shown in FIG. 12, the optimal transmittance T of the phase shifter with respect to an arbitrary line width L of the mask pattern can be obtained with $$T=Ic(L)/Io(L).$$

FIGS. 13(a) to (c) show the simulation results of the light intensity Ih(L,T) generated at the position corresponding to the center of the mask pattern on the exposed material when the transmittance T of the phase shifter and the line width L of the mask pattern are varied in the exposure with the image enhancement mask shown in FIG. 12, represented by contour lines of the light intensity with the transmittance T and the line width L in the vertical axis and the horizontal axis, respectively. Herein, in each of FIGS. 13(a) to (c), the graph indicating the relationship of T=Ic(L)/Io(L) described above is superimposed. The simulation results shown in FIGS. 13(a) to (c) are obtained using different exposure light sources. The simulation results shown in FIG. 13(a) are obtained using regular exposure with a circular light source. The simulation results shown in FIG. 13(b) are obtained using annular exposure with an annular light source. The simulation results shown in FIG. 13(c) are obtained using quadrupole exposure with light sources positioned at four points on diagonal coordinates. Other simulation conditions are such that the wavelength of the exposure light λ=0.193 μm, and the numerical aperture NA of the projecting optical system of the exposure apparatus=0.6.

As shown in FIGS. 13(a) to (c), the dependence of the light intensity Ih(L,T) on the transmittance T of the phase shifter and the line width L of the mask pattern is slightly varied depending on the shape of the exposure light source, but the condition that provides the smallest light intensity Ih(L,T) can be represented accurately by the relationship of T=Ic(L)/Io(L), regardless of the shape of the exposure light source.

In other words, there is no limitation regarding the shape of the mask pattern to which the mask pattern overlapping method of the present invention can be applied.

More specifically, the transmittance T of the phase shifter that maximizes the effective light-shielding properties of a mask pattern having an arbitrary shape constituted by the phase shifter by the image enhancement of the present invention can be calculated as follows.

(1) The light intensity Ic(r) generated at a position r corresponding to the vicinity of the center of a mask pattern on an exposed material is calculated in exposure using a light-shielding mask provided with a complete light-shielding film instead of the phase shifter of the image enhancement mask.

(2) The light intensity Io(r) generated at a position r corresponding to the vicinity of the center of a mask pattern on an exposed material is calculated in exposure using a light-transmitting mask in which a regular light-transmitting portion is provided instead of the phase shifter of the image enhancement mask and a light-shielding portion constituted by a complete light-shielding film is provided instead of the light-transmitting portion of the image enhancement mask.

(3) The optimal transmittance T of the phase shifter is obtained based on the relationship T=Ic(L)/Io(L).

It should be noted that since the upper limit of the transmittance T is 1, when the transmittance T obtained by T=Ic(L)/Io(L) exceeds 1, the optimal transmittance T is 1.

In the above description, mask patterns having simple shapes have been described, but when a mask pattern has a complex shape, the mask pattern is divided into a plurality of patterns having a simple shape, and the mask pattern overlapping method of the present invention can be applied to each pattern. By doing this, the optimal transmittance T of the phase shifter can be determined for each divided pattern.

As described above, in the photomask of the first embodiment, the intensity of mask pattern diffracted light is calculated, and the transmittance T of the phase shifter is calculated such that the intensity of the shifter transmitted light is equal to the intensity of the mask pattern diffracted light, and thus the light-shielding properties of the mask pattern can be maximized. When a mask pattern has a complex shape, the mask pattern is divided into a plurality of patterns having a simple shape, and the transmittance T of the phase shifter is calculated such that the intensity of the transmitted light is equal to the intensity of the diffracted light for each pattern, and thus the light-shielding properties throughout the mask pattern can be maximized.

In the first embodiment, in order to maximize the effective light-shielding properties of the mask pattern in view of the principle of the image enhancement of the present invention, the transmittance T of the phase shifter can be determined based on the relationship $T=Ic(L)/Io(L)$. However, if it is sufficient to make the effective light-shielding properties of the mask pattern higher than those of the mask pattern constituted by a complete light-shielding film, the transmittance T of the phase shifter may be determined such that the relationship $T=Ic(L)/Io(L)$ is almost satisfied. More specifically, even if the complete light-shielding film is replaced by the phase shifter, the light-shielding properties of the mask pattern is not improved any more when the phase shifter having a transmittance of not less than four times the optimal transmittance T obtained from the relationship $T=Ic(L)Io(L)$ is provided as the mask pattern. The reason for this will be described below. As described above, the light intensity $Ih(L,T)$ generated at the position corresponding to the center of the mask pattern on the exposed material through the image enhancement mask having the mask pattern constituted by the phase shifter having a line width L and a transmittance T can be estimated using the relationship:

$Ih(L,T)=((Ic(L))^{0.5}-T\times Io(L))^{0.5})^2$, where $Ic(L)$ is the light intensity of the mask pattern diffracted light and $Io(L)$ is the light intensity of the shifter transmitted light). Herein, overlapping the $Ic(L)$ and $T\times Io(L)$ is overlapping interference, so that it is necessary to add each light intensity on the phase space. Therefore, to convert each light intensity to values on the phase space, the square root of each light intensity is taken. The result obtained by adding the square root of each light intensity in view of each phase of the mask pattern diffracted light and the shifter transmitted light corresponds to overlapping of the light intensities on the phase space, and further in order to convert the result to regular light intensity, the result is squared.

As described above, when the square of $Ih(L,T)$, that is, $((Ic(L))^{0.5}-(T\times Io(L))^{0.5})^2$ is minimized, in other words, when the light-shielding effect by the mask pattern is highest, $Ic(L)=T\times Io(L)$ is satisfied, and therefore the optimized transmittance T (hereinafter, referred to as the optimal transmittance Tb) of the phase shifter can be obtained based on:

$Tb=Ic(L)/Io(L)$.

On the other hand, the condition in which the shifter transmitted light becomes excessive, and the effective light-shielding properties of the mask pattern are deteriorated to be equal to those of the mask pattern constituted by a complete light-shielding film can be $Ih(L,T)=Ic(L)$, that is, $-(Ic(L))^{0.5}-(T\times Io(L))^{0.5})=(Ic(L))^{0.5}$. In this case, since $(T\times Io(L))^{0.5})^2=2\times(Ic(L))^{0.5}$ is satisfied, and therefore $T\times Io(L)=4\times(Ic(L))$ is satisfied. In other words, when the light intensity of the shifter transmitted light reaches four times the light intensity of the mask pattern diffracted light, the effective light-shielding properties of the mask pattern becomes equal to those of the mask pattern constituted by a complete light-shielding film. The transmittance T of the phase shifter that satisfies this condition (hereinafter, referred to as "limit transmittance Tw) can be obtained based on:

$Tw=4\times Ic(L)/Io(L)=4\times Th$. Therefore, when the phase shifter having a transmittance of not less than four times the optimal transmittance Tb is provided as the mask pattern instead of the complete light-shielding film, the effective light-shielding properties of the mask pattern are lower than those of the mask pattern constituted by the complete light-shielding film. In other words, when the transmittance of the phase shifter is not more than four times the optimal transmittance Tb, the effective light-shielding properties of the mask pattern can be improved by providing the phase shifter as the mask pattern instead of the complete light-shielding film.

FIGS. 14(a) to (c) show the conditions that satisfy $Ih(L,T)=Ic(L)$ when the transmittance T of the phase shifter and the line width L of the mask pattern are varied in the exposure with the image enhancement mask shown in FIG. 10. Herein, in each of FIGS. 14(a) to (c), the graph (Tw is represented by T in the FIGS. 14(a) to (c)) indicating the relationship of $Tw=4\times Ic(L)/Io(L)$ described above is superimposed. The simulation results shown in FIGS. 14(a) to (c) are obtained using different exposure light sources. The simulation results shown in FIG. 14(a) are obtained using regular exposure with a circular light source. The simulation results shown in FIG. 14(b) are obtained using annular exposure with an annular light source. The simulation results shown in FIG. 14(c) are obtained using quadrupole exposure with light sources positioned at four points on diagonal coordinates. Other simulation conditions are such that the wavelength of the exposure light $\lambda=0.193$ μm, and the numerical aperture NA of the projecting optical system of the exposure apparatus=0.6.

As shown in FIGS. 14(a) to (c), the dependence of the condition that satisfies $Ih(L,T)=Ic(L)$ on the transmittance T of the phase shifter and the line width L of the mask pattern is slightly varied depending on the shape of the exposure light source, but the condition that satisfies $Ih(L,T)=Ic(L)$ can be represented accurately by the relationship of $T=4\times Ic(L)/Io(L)$, regardless of the shape of the exposure light source.

In the above description, the limit transmittance Tw of the phase shifter with respect to an arbitrary line width L of the mask pattern has been obtained, but on the other hand, the limit line width Lo of the mask pattern with respect to a predetermined transmittance To of the phase shifter can be obtained. More specifically, $Ic(L)/Io(L)$ is decreased with an increase of the line width L of the mask pattern. Therefore, when the line width L providing that $Ic(L)/Io(L)$ is $To/4$ with respect to a predetermined transmittance To of the phase shifter is taken as the limit line width Lo, the effective light-shielding properties of the mask pattern are deteriorated to a larger extent when the phase shifter is used instead of a light-shielding film in the mask pattern having a line width of a limit line width Lo or more. Therefore, when the phase shifter having a predetermined transmittance To is provided in a mask pattern having an arbitrary layout, it is preferable to provide the phase shifter in a mask pattern portion having a line width of not more than the limit line width Lo determined by the relationship of $Ic(L)/Io(L)=To/$ 4, and to provide a light-shielding film in a mask pattern portion having a line width of the limit line width Lo or more. By doing this, the effective light-shielding properties of the entire mask pattern can be improved, compared with the case where the entire mask pattern is formed by a light-shielding film. The size at which the arrangement of the phase shifter and the arrangement of the light-shielding film are switched is not necessarily the limit line width Lo determined by the relationship of Ic(L)/Io(L)=To/4, and can be any line width of not more than the limit line width Lo.

In the above description, the optimal transmittance T is obtained based on Th=Ic(L)/Io (L) and the limit transmittance Tw by is obtained based on Tw=4×Ic(L)/Io(L)=4×Tb, but for more generalized situations, the transmittance T of the phase shifter can be determined in the following manner. To reduce the light intensity Ih generated at the position corresponding to the center of the mask pattern on an exposed material to 1/D of the intensity Ic of the mask pattern diffracted light, the transmittance T that satisfies the following inequality can be used.

$$-((Ic)^{0.5}-(T\times Io)^{0.5})<(Ic/D)^{0.5}<((Ic)^{0.5}-(T\times Io)^{0.5})$$

From this relationship, the following range can be obtained as the acceptable range of the transmittance T:

$$(Ic/Io)\times((D-D^{0.5})/D)\times((D-D^{0.5})/D)<T$$

$$<(Ic/Io)\times((D+D^{0.5})/D)\times((D+D^{0.5})/D)$$

More specifically, in the case of D=3, the acceptable range of the transmittance T is between 0.18 times and 2.5 times the value of (Ic/Io). In the case of D=5, the acceptable range of the transmittance T is between 0.31 times and 2.1 times the value of (Ic/Io). In the case of D=10, the acceptable range of the transmittance T is between 0.48 times and 1.7 times the value of (Ic/Io). It is not necessary to maximize the light-shielding properties of all the mask patterns in practice, so that if the transmittance T of the phase shifter is between about ⅓ and 2 times the value of (Ic/Io), the light-shielding properties of the mask pattern can be improved sufficiently.

Furthermore, when two phase shifters having, for example, different transmittances can be used as mask patterns, which of the two phase shifters is the phase shifter whose transmittance can realize higher light-shielding properties can be determined by the following method. When the transmittances of the two phase shifters are T1 and T2 (T1>T2), respectively, the condition that provides the higher light-shielding properties using the phase shifter having a transmittance T1 than using the phase shifter having a transmittance T2 is:

$$(Ic^{0.5}-(T1\times Io)^{0.5})\times(Ic^{0.5}-(T1\times Io)^{0.5})$$

$$<(Ic^{0.5}-(T2\times Io)^{0.5})\times(Ic^{0.5}-(T2\times Io)^{0.5})$$

When this inequality is rearranged, $$Ic/Io>(T1^{0.5}+T2^{0.5})\times(T1^{0.5}+T2^{0.5})/2$$

can be obtained. Therefore, in the mask pattern portion in which $$Ic/Io \geq (T1^{0.5}+T2^{0.5})\times(T1^{0.5}+T2^{0.5})/2 \text{ is satisfied, the}$$

phase shifter having a transmittance T1 can be selected, and in the mask pattern portion in which $$Ic/Io<(T1^{0.5}+T2^{0.5})\times(T1^{0.5}+T2^{0.5})/2 \text{ is satisfied, the}$$

phase shifter having a transmittance T2 can be selected.

Furthermore, in a method for forming a pattern of the first embodiment, that is, a method for forming a pattern using the photomask of the first embodiment, a positive resist or a negative resist film can be used as the resist film. When a positive resist film is used, a resist pattern having a mask pattern shape can be formed by developing the positive resist film irradiated with exposure light, and removing portions other than the portion corresponding to the mask pattern in the positive resist film. When a negative resist film is used, a resist pattern having an opening with a mask pattern shape can be formed by developing the negative resist film irradiated with exposure light, and removing the portion corresponding to the mask pattern in the negative resist film. Regardless of whether the positive resist film is used or the negative resist film is used, when the width L of the mask pattern is smaller than about 0.4×λ/NA, the precision of the size of the resist pattern can be improved significantly, compared with the conventional methods.

Second Embodiment

Hereinafter, a photomask according to a second embodiment of the present invention, a method for producing the same and a method for forming a pattern using the photomask will be described with reference of the accompanying drawings.

The feature of the second embodiment is as follows. As in the first embodiment, in the case where a light-shielding film portion corresponding to a region in which the light intensity in the light intensity distribution transferred on an exposed material (to be specific, a resist film) is not sufficiently decreased by a mask pattern during exposure when the mask pattern corresponding to a desired pattern is produced with a light-shielding film is replaced by a phase shifter so as to produce a mask pattern, and exposure is performed with a photomask having that mask pattern.

The second embodiment is different from the first embodiment in the following aspects. In the first embodiment, a plurality of transmittances of a phase shifter provided as a mask pattern are present in order to control the intensity of the shifter transmitted light by the transmittance of the phase shifter. On the other hand, in the second embodiment, all the phase shifters provided as a mask pattern have the same transmittance, and the intensity of the shifter transmitted light is controlled by covering partially the phase shifter with a light-shielding film.

Figure 15:
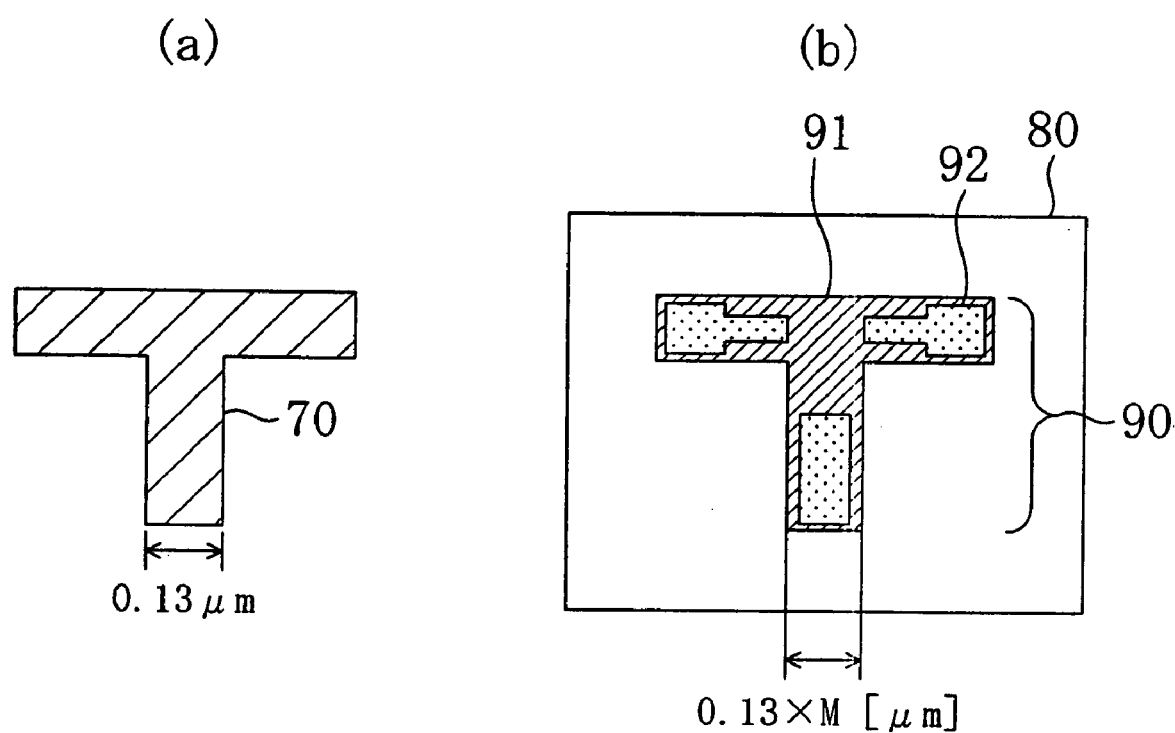
FIG. 15(a) is a diagram showing an example of a design layout of a desired pattern to be formed in a pattern forming method according to a second embodiment of the present invention.
FIG. 15(b) is a plan view of a photomask according to the second embodiment of the present invention used to form the pattern shown in FIG. 15(a).

FIG. 15(a) shows an example of a design layout of a desired pattern (resist pattern) to be formed in the second embodiment. As shown in FIG. 15(a), the width of a pattern 70 is 0.13 μm. The design layout of the pattern 70 is the same as the design layout of the pattern 20 to be formed in the first embodiment shown in FIG. 5(a).

FIG. 15(b) is a plan view of a photomask according to the second embodiment used to form the pattern shown in FIG. 15(a). As shown in FIG. 15(b), the photomask of the second embodiment is obtained by forming a mask pattern 90 corresponding to the pattern shown in FIG. 15(a) on a transparent substrate 80. The mask pattern 90 has a size (actual size) of 0.13×M [μm] (M: magnification factor of a reduced projecting optical system of an exposure apparatus). The mask pattern 90 has a light-shielding portion 91 constituted by a light-shielding film such a chromium film, and a phase shifter 92 disposed in the opening provided in the light-shielding film.

When comparing the photomask of the second embodiment shown in FIG. 15(b) with the photomask of the first embodiment shown in FIG. 5(b), the following can be understood. In the second embodiment, with respect to a region in which a phase shifter (the second phase shifter 43) having a high transmittance is provided in the first embodiment, a large opening is provided in a light-shielding film serving as the light-shielding portion 91, and the opening is used as the phase shifter 92. With respect to a region in which a phase shifter (the first phase shifter 42) having a low transmittance is provided in the first embodiment, a small opening is provided in a light-shielding film serving as the light-shielding portion 91, and the opening is used as the phase shifter 92.

FIGS. 16(a) to (c) are cross-sectional views showing each process of the pattern forming method according to the second embodiment, more specifically, are cross-sectional view showing each process of a method for forming a pattern by exposure using the photomask shown in FIG. 15(b). First, as shown in FIG. 16(a), a film to be processed 101 made of a metal film, an insulating film or the like is formed on a substrate 100, and then a positive resist film 102 is formed on the film to be processed 101. Thereafter, as shown in FIG. 16(b), the resist film 102 is irradiated with the exposure light 103 through the photomask (see FIG. 15(b)) of the second embodiment obtained by forming a mask pattern 90 on a transparent substrate 80. Thus, a portion corresponding to the mask pattern 90 in the resist film 102 becomes a non-exposed portion 102a, and other portions in the resist film 102 become an exposed portion 102b. Thereafter, as shown in FIG. 16(c), a resist pattern 104 constituted by the non-exposed portion 102a is formed by developing the resist film 102.

FIG. 17(a) shows the simulation results of the light intensity distribution projected on the resist film 102 by the photomask shown in FIG. 15(b). The simulation conditions are that the wavelength λ of the exposure light 103=0.193 nm; the numerical aperture NA of the projecting optical system of the exposure apparatus=0.6; and the interference degree σ of the exposure apparatus=0.8. In this case, the relationship of 0.13×M [μm]≈0.4×M×λNA is satisfied with respect to the size of the mask pattern 90 shown in FIG. 15(b). In FIG. 17(a), the light intensity distribution is shown with contour lines of the relative light intensity in the two-dimensional relative coordinate system.

When comparing of the simulation results of the second embodiment shown in FIG. 17(a) and the simulation results of the first embodiment shown in FIG. 7(a), the following can be understood. When the photomask of the second embodiment is used, a larger opening is provided in a portion in which sufficient light-shielding properties cannot be obtained by the light-shielding film in the mask pattern, so that sufficient light-shielding properties can be realized throughout the mask pattern. Therefore, as in the first embodiment, a resist pattern having a shape closer to a desired shape can be formed.

FIG. 17(b) shows the simulation results of the light intensity distribution taken along line AA' of FIG. 17(a), and FIG. 17(c) shows the results of estimating the shape of the resist pattern 104 from the simulation results of the light intensity distribution shown in FIG. 17(a). As shown in FIG. 17(b), the critical intensity is 0.3, the distribution shape of the critical intensity values in the light intensity distribution shown in FIG. 17(a) is substantially matched to the shape of the mask pattern 90. As a result, the resist pattern 104 (hatched portion) having substantially a desired shape (shape shown by broken lines), as shown in FIG. 17(c), can be obtained.

As described above, according to the second embodiment, the phase shifter is provided in the mask pattern on the photomask, so that the mask pattern diffracted light is cancelled by the shifter transmitted light. Thus, the light-shielding properties of the mask pattern can be improved from the mask pattern constituted only by a complete light-shielding film, and therefore a pattern having an arbitrary size or shape can be formed by exposure using one photomask.

Hereinafter, the advantages of the second embodiment over the first embodiment will be described. As described above, theoretically, in the case where a mask pattern corresponding to a desired pattern is formed using a light-shielding film, the effective light-shielding properties can be improved throughout the mask pattern by replacing a portion in which the effective light-shielding properties are deteriorated in the light-shielding film by a phase shifter having an optimal transmittance. In this case, it is necessary to form the phase shifter as a deposited film on a transparent substrate made of quartz or the like, which is a material transmitting exposure light, and it is also necessary to provide deposited films made of materials having different transmittances in different positions on the transparent substrate. However, this is difficult in terms of time and costs on mask production. On the other hand, when it is attempted to control the transmittance of the phase shifter by the thickness of the deposited film instead of the material of the deposited film, the thickness of the deposited film is limited to the thickness that generates an optical path difference corresponding to a phase difference of 180 degrees. Therefore, it is difficult to change the transmittance of the phase shifter in each portion of the mask pattern by changing the thickness of the deposited film made of a single material. On the other hand, in the second embodiment, the shifter transmitted light is controlled, not by the transmittance of the phase shifter, but by the size of the opening provided in the mask pattern (more specifically, the opening provided in the light-shielding film having the outline shape of the mask pattern), so that the transmittance of the phase shifter disposed in the opening can be uniform. In this case, it is of course possible that there are a plurality of transmittances.

Hereinafter, the relationship between the width of the opening provided in the mask pattern of the photomask of the second embodiment and the light intensity distribution projected onto an exposed material through the mask pattern will be described in detail. In the second embodiment, the aspect of using the principle of the image enhancement of canceling the mask pattern diffracted light by the shifter transmitted light is common with the first embodiment. In the first embodiment, the transmittance of the phase shifter is set appropriately with respect to the line width of the mask pattern, whereas in the second embodiment, the width of the opening is set appropriately with respect to the line width of the mask pattern.

FIG. 18(a) is a plan view of a photomask having a mask pattern constituted by a light-shielding film and an opening provided with the light-shielding film and serving as a phase shifter. As shown in FIG. 18(a), a transparent film 111 patterned into a mask pattern shape and serving as a phase shifter is formed on a transparent substrate 110, and a light-shielding film 112 such as a chromium film is formed so as to cover the transparent film 111. Furthermore, and an opening 113 is provided in the light-shielding film 112 so as to expose the transparent film 111, and thus the opening 113 functions as a phase shifter. In FIG. 18(a), the transmittance (T) of the transparent film 111 is 50%, the mask pattern line width is L, and the width of the opening 113 (hereinafter, referred to as "opening width") is S.

FIG. 18(b) shows the manner in which exposure is performed with the photomask shown in FIG. 18(a). As shown in FIG. 18(b), exposure light 114 becomes a first transmitted light 115 after being transmitted through the periphery of the mask pattern on the transparent substrate 110, and becomes a second transmitted light 116 after being transmitted through the opening 113.

FIG. 19(a) shows the simulation results of the light intensity distribution transferred at a position corresponding to line AA' of FIG. 18(a) on an exposed material when the opening width S is varied in the exposure with the photomask shown in FIG. 18(a). The simulation conditions are that the wavelength λ of the exposure light=0.193 μm; the numerical aperture NA of the projecting optical system of the exposure apparatus=0.6; the interference degree a of the exposure apparatus=0.8; and the line width L=0.1 μm. The point O on the line AA' is positioned in the center of the mask pattern.

As shown in FIG. 19(a), as the opening width S becomes higher, the light intensity of the position (0 in the horizontal axis) corresponding to the center O of the mask pattern in the exposed material is decreased and the shape of the light intensity distribution is better. When the opening width S is 0 (the mask pattern is constituted by a complete light-shielding film), the shape of the light intensity distribution is worst. In other words, a comparison with the simulation results shown in FIG. 9(a) indicates that increasing the width of the opening provided in the mask pattern brings about the same effect as increasing the transmittance of the phase shifter provided in the mask pattern.

FIG. 19(b) shows the simulation results of the light intensity generated at the position corresponding to the point O of FIG. 18(a) on the exposed material when the mask pattern line width L and the opening width S are varied in the exposure with the photomask shown in FIG. 18(a), represented by contour lines of the light intensity with the mask pattern line width L and the opening width S in the vertical axis and the horizontal axis, respectively.

The cross-hatched region shown in FIG. 19(b) shows the combination condition of the mask pattern line width L and the opening width S that maximize the effective light-shielding properties of the mask pattern. In other words, in these combination conditions, the light intensities of the mask pattern diffracted light and the shifter transmitted light are cancelled each other. Therefore, the shape of the light intensity distribution projected on an exposed material through the mask pattern can be made close to a desired shape by determining the opening width S that maximizes the effective light-shielding properties of each mask pattern with respect to the mask pattern line width L, based on these combination conditions.

In the photomask shown in FIG. 18(a), even if the opening width S is equal to the mask pattern line width L (the light-shielding film 112 is not provided on the transparent film 111 serving as a phase shifter), the largest value of the shifter transmitted light is limited by the transmittance of the transparent film 111. On the other hand, in the second embodiment, it is preferable that the transmittance of the phase shifter is high, unless there is no specific reason to suppress the largest value of the transmittance of the phase shifter.

Therefore, in the second embodiment, it is preferable to use a photomask in as shown in FIG. 20(a), that is, a photomask provided with a phase shifter formed by etching the transparent substrate by a thickness that can generate an optical path difference corresponding to a phase difference of 180 degrees, instead of the photomask shown in FIG. 18(a). In this case, the transmittance of the phase shifter is substantially equal to the transmittance of the transparent substrate. In this specification, the transmittance of the transparent substrate is used as the reference (1.0) of the transmittance.

FIG. 20(a) is a plan view of a photomask having a mask pattern constituted by a light-shielding film and an opening serving as a phase shifter provided in the light-shielding film. As shown in FIG. 20(a), a light-shielding film 121 such as a chromium film having the outer shape of the mask pattern is formed on a transparent substrate 120. An opening 123 is formed in the light-shielding film 121 and an etched portion 122 serving as a phase shifter is formed below the opening 123 in the transparent substrate 120. In the FIG. 20(a), the mask pattern line width is L, and the width of the opening 123 (hereinafter, referred to as "opening width") is S.

FIG. 20(b) shows the manner in which exposure is performed with the photomask shown in FIG. 20(a). As shown in FIG. 20(b), exposure light 124 becomes a first transmitted light 125 after being transmitted through the periphery of the mask pattern on the transparent substrate 120, and becomes a second transmitted light 126 after being transmitted through the opening 123.

Figure 21:
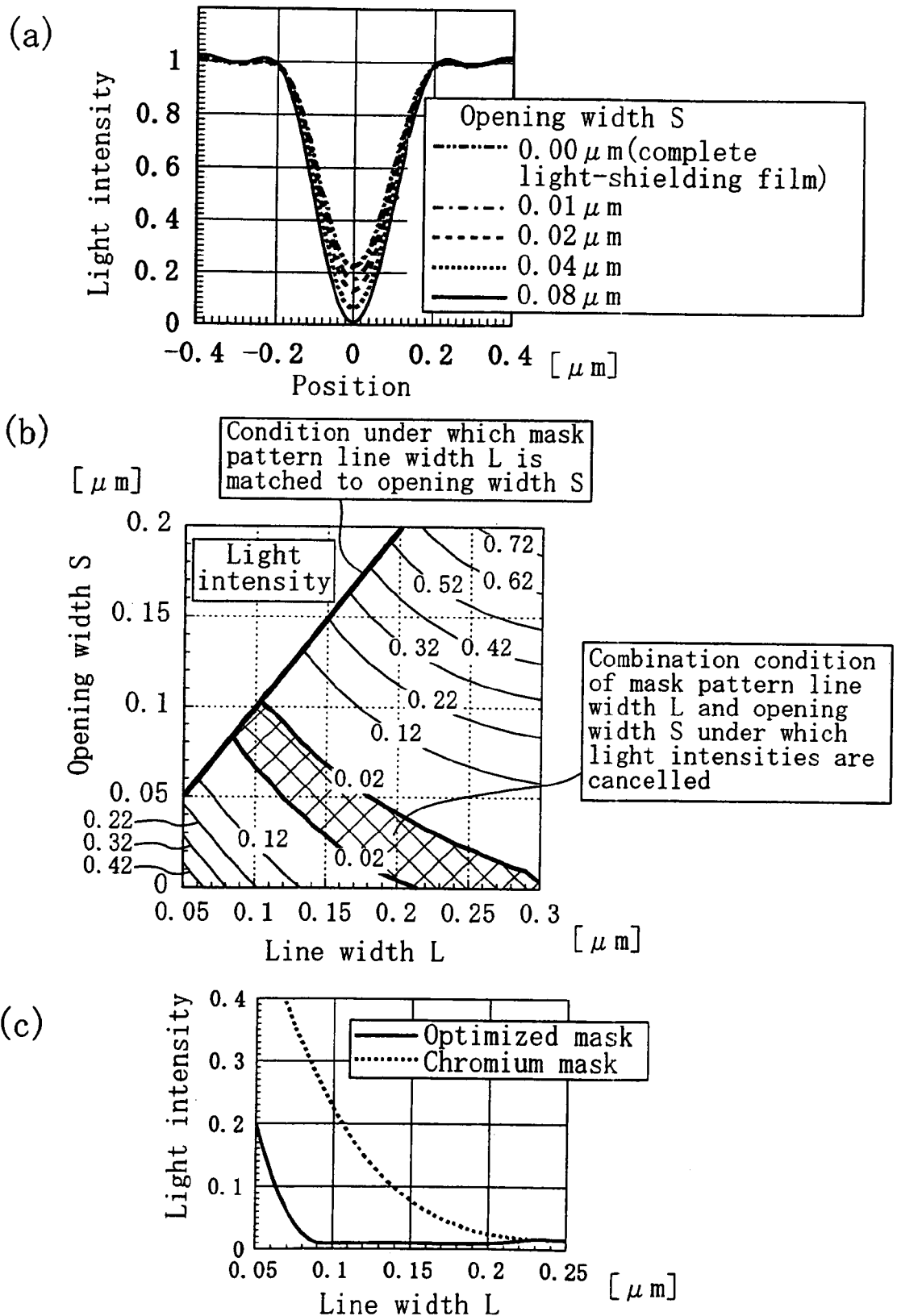
FIG. 21(a) is a graph showing the simulation results of the light intensity distribution transferred on an exposed material when the width S of the opening is varied in exposure with a photomask shown in FIG. 20(a)
FIG. 21(b) is a graph showing the simulation results of the light intensity generated on an exposed material when the line width L of a mask pattern and the width S of the opening are varied in the exposure with a photomask shown in FIG. 20(a), represented by contour lines of the light intensity with the line width L of the mask pattern and the width S of the opening in the vertical axis and the horizontal axis, respectively.
FIG. 21(c) is a graph showing the simulation results of the light intensity generated on an exposed material when the line width L of a mask pattern is varied in the exposure with a photomask in which the light-shielding properties of the mask pattern are optimized.

FIG. 21(a) shows the simulation results of the light intensity distribution transferred at a position corresponding to line AA' of FIG. 20(a) on an exposed material when the opening width S is varied in the exposure with the photomask shown in FIG. 20(a). The simulation conditions are the same as those in the case of FIG. 19(a). The point O on the line AA' is positioned in the center of the mask pattern.

As shown in FIG. 21(a), as the opening width S becomes larger, the light intensity of the position (0 in the horizontal axis) corresponding to the center O of the mask pattern in the exposed material is decreased and the shape of the light intensity distribution is better. When the opening width S is 0 (the mask pattern is constituted by a complete light-shielding film), the shape of the light intensity distribution is worst. Furthermore, a comparison with the simulation results shown in FIG. 19(a) indicates that the light-shielding properties of the mask pattern are improved further because the transmittance of the phase shifter is increased.

FIG. 21(b) shows the simulation results of the light intensity generated at the position corresponding to the point O of FIG. 21(a) on the exposed material when the mask pattern line width L and the opening width S are varied in the exposure with the photomask shown in FIG. 20(a), represented by contour lines of the light intensity with the mask pattern line width L and the opening width S in the vertical axis and the horizontal axis, respectively. A comparison of the simulation results shown in FIG. 21(b) with the simulation results shown in FIG. 19(a) indicates that in FIG. 21(b), the effective light-shielding properties of the mask pattern are kept high also with respect to a smaller mask pattern line width L because the transmittance of the phase shifter is increased.

The cross-hatched region shown in FIG. 21(b) shows the combination condition of the mask pattern line width L and the opening width S that maximize the effective light-shielding properties of the mask pattern. In other words, in these combination conditions (hereinafter, referred to as "light-shielding property maximizing conditions), the light intensities of the mask pattern diffracted light and the shifter transmitted light are cancelled each other.

As the photomask shown in FIG. 21(b), in the light-shielding property maximizing conditions, the relationship that the opening width S is larger as the mask pattern line width L is smaller is satisfied. In other words, in the second embodiment, when the mask pattern line width L is sufficiently large, the opening width S is made 0, and the opening width S is increased according to the light-shielding property maximizing conditions shown in FIG. 21(b) as the mask pattern line width L is decreased, and when mask pattern line width L is decreased to some extent, the mask pattern is constituted only by the phase shifter, in other words, the structure of the mask pattern is changed continuously with the mask pattern line width L. Thus, the light-shielding properties of the mask pattern can be constantly optimized.

FIG. 21(c) shows the simulation results of the light intensity generated at the position corresponding to the center of the mask pattern on an exposed material when the line width L of the mask pattern is varied in the exposure with the photomask ("the optimized mask" in the drawing) in which the light-shielding properties of the mask pattern are optimized as described above. FIG. 21(c) also shows, for comparison, the simulation results of the light intensity generated at the position corresponding to the center of the mask pattern on an exposed material when the line width L of the mask pattern is varied in the exposure with the conventional photomask ("the chromium mask" in the drawing) in which a mask pattern constituted only by a complete light-shielding film such as a chromium film is provided).

As shown FIG. 21(c), in the exposure using the chromium mask, when the mask pattern line width L is about 0.2 μm or less, the light-shielding properties of the mask pattern are started to deteriorate. On the other hand, in the exposure using the optimized mask, the light-shielding properties of the mask pattern can be prevented from deteriorating until the mask pattern line width L is about 0.1 μm or less.

In FIG. 19(b) or 21(b), the combination conditions of the mask pattern line width L and the opening width S that maximize the effective light-shielding properties of the mask pattern (the light-shielding property maximizing conditions) are obtained by actually calculating the light intensity distribution transferred on an exposed material using various mask pattern line widths L and opening widths S. However, for obtaining the light-shielding property maximizing conditions by this method, calculation takes a very long time, which makes it difficult, for example, to obtain the optimal opening width S with respect to an arbitrary mask pattern line width L of the mask pattern.

Next, a simple method for calculating the light-shielding property maximizing conditions, more specifically, a simple method for obtaining the optimal opening width S with respect to an arbitrary mask pattern line width L (hereinafter, referred to as a "mask pattern overlapping method") that is found out by the inventor of the present invention will be described. In the following description, calculation results are shown, assuming that the transmittance of the phase shifter is the same as the transmittance (1.0) of the transparent substrate serving as a mask substrate. However, when the transmittance of the phase shifter is not the same as that of the transparent substrate, the intensity of shifter transmitted light transmitted through the opening is calculated based on the difference in the transmittance.

Figure 22:
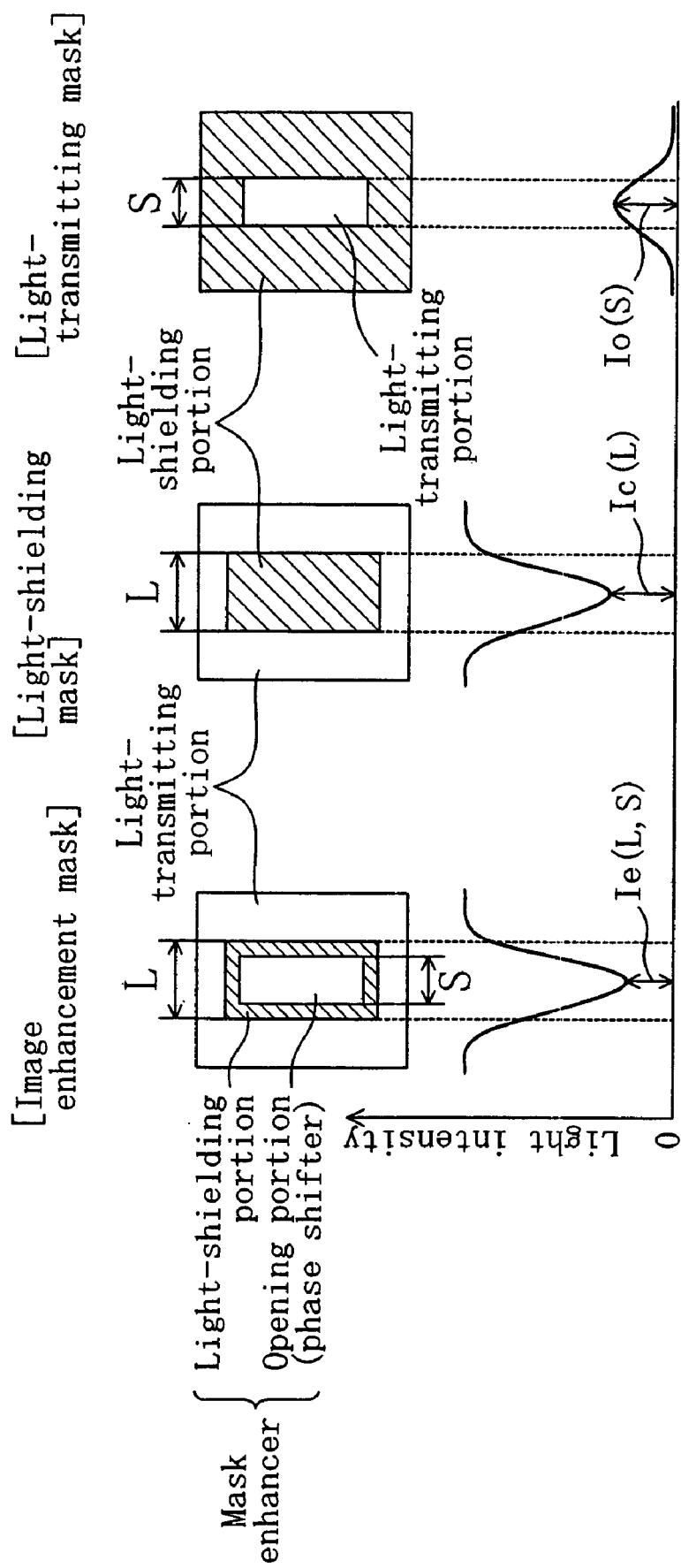
FIG. 22 is a schematic view showing the principle of a method of overlapping a mask pattern of the present invention regarding the case of an image enhancement mask having a mask pattern with a line width L constituted by a mask enhancer of an opening width S.

FIG. 22 is a schematic view showing the principle of the mask pattern overlapping method of the present invention regarding the case of a mask pattern with a line width L constituted by a mask enhancer with an opening width S. In the following description, the structure of the present invention in which an opening serving as a phase shifter is provided in a light-shielding film in a mask pattern is referred to as a "mask enhancer".

As shown in FIG. 22, in the exposure using a photomask (image enhancement mask) having a mask pattern with a line width L constituted by a mask enhancer with an opening width S, the light intensity generated at the position corresponding to the center of the mask pattern on the exposed material is taken as Ie(L,S). In the exposure using a photomask (light-shielding mask) in which a complete light-shielding film is provided as a mask pattern instead of the mask enhancer of the image enhancement mask, the light intensity generated at the position corresponding to the center of the mask pattern on the exposed material is taken as Ic(L). In the exposure using a photomask (light-transmitting mask) in which a regular light-transmitting portion is provided instead of the opening (a phase shifter having a transmittance of 1.0) of the image enhancement mask and a light-shielding portion constituted by a complete light-shielding film is provided instead of the light-transmitting portion of the image enhancement mask, the light intensity generated at the position corresponding to the center of the mask pattern on the exposed material is taken as Io(S).

In this case, in the image enhancement mask, the intensity of the mask pattern diffracted light generated at the position corresponding to the center of the mask pattern on the exposed material corresponds to Ic(L), and the light intensity of the shifter transmitted light generated at the position corresponding to the center of the mask pattern on the exposed material corresponds to Io(S). Therefore, the light intensity Ie(L,S) can be approximated to a value obtained by converting the light intensity Ic(L) and the light intensity Io(S) to the light intensities in a phase space, overlapping the two light intensities, and squaring the result. That is, $$Ie(L,S)=((Ic(L))^{0.5}-(Io(S))^{0.5})^2.$$

Therefore, in the image enhancement mask, the condition that provides the smallest Ie(L,S), that is, the light-shielding property maximizing condition is:

Ic(L)=Io(S). In other words, as the light-shielding property maximizing condition, the mask pattern line width L and the opening width S that satisfy Ic(L)=Io(S) can be obtained.

Figure 23:
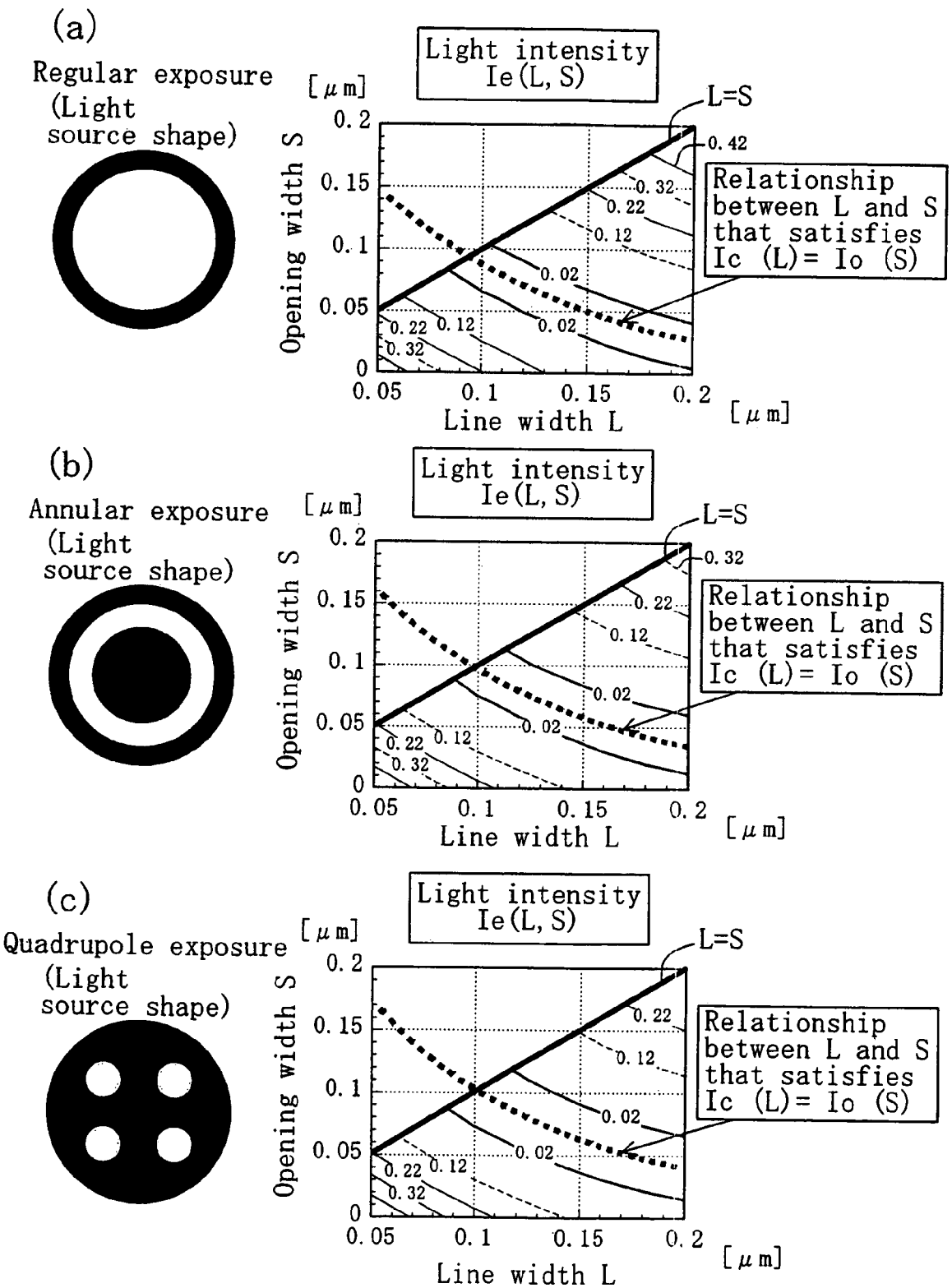
FIGS. 23(a) to (c) are graphs showing the simulation results of the light intensity Ie(L,S) generated on an exposed material when the line width L of a mask pattern and the opening width S are varied in the exposure with an image enhancement mask shown in FIG. 22, represented by contour lines of the light intensity with the opening width S and the line width L in the vertical axis and the horizontal axis, respectively.

FIGS. 23(a) to (c) show the simulation results of the light intensity Ie(L,S) generated at the position corresponding to the center of the mask pattern on the exposed material when the mask pattern line width L and the opening width S are varied in the exposure with the image enhancement mask shown in FIG. 22, represented by contour lines of the light intensity with the opening width S and the mask pattern line width L in the vertical axis and the horizontal axis, respectively. Herein, in each of FIGS. 23(a) to (c), the graph indicating the relationship of Ic(L)=Io(S) described above is superimposed. The simulation results shown in FIGS. 23(a) to (c) are obtained using different exposure light sources. The simulation results shown in FIG. 23(a) are obtained using regular exposure with a circular light source. The simulation results shown in FIG. 23(b) are obtained using annular exposure with an annular light source. The simulation results shown in FIG. 23(c) are obtained using quadrupole exposure with light sources positioned at four points on diagonal coordinates. Other simulation conditions are such that the wavelength of the exposure light λ=0.193 μm, and the numerical aperture NA of the projecting optical system of the exposure apparatus=0.6.

As shown in FIGS. 23(a) to (c), the dependence of the light intensity Ie(L,S) on the mask pattern line width L and the opening width S is slightly varied depending on the shape of the exposure light source, but the condition that provides the smallest light intensity Ie(L,S) can be represented accurately by the relationship of Ic(L)=Io(S), regardless of the shape of the exposure light source.

Figure 24:
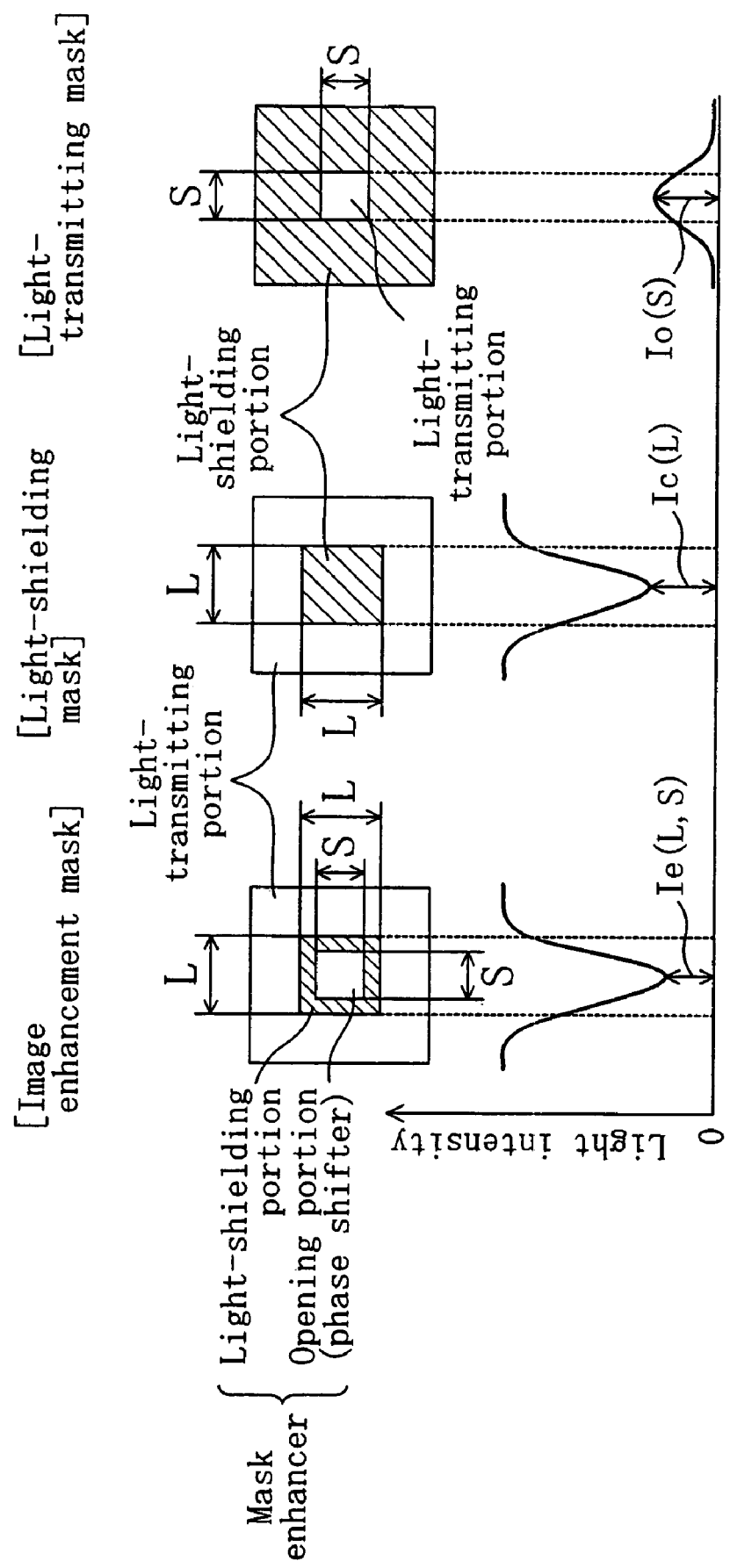
FIG. 24 is a schematic view showing the principle of a method of overlapping a mask pattern of the present invention regarding the case of an image enhancement mask having a mask pattern having a square shape (the length of one side is L) constituted by a mask enhancer of an opening width S.

FIG. 24 is a schematic view showing the principle of the mask pattern overlapping method of the present invention regarding the case of the image enhancement mask having a mask pattern with a square shape (the length of one side is L) constituted by a mask enhancer with an opening width S. Also in the image enhancement mask shown in FIG. 24, the light intensity of the mask pattern diffracted light generated at the position corresponding to the center of the mask pattern on the exposed material corresponds to Ic(L), and the light intensity of the shifter transmitted light generated at the position corresponding to the center of the mask pattern on the exposed material corresponds to Io(S). Therefore, also in the image enhancement mask shown in FIG. 24, the mask pattern line width L and the an opening width S that provide the smallest Ie(L,S) can be obtained based on the relationship Ic(L)=Io(S).

FIGS. 25(a) to (c) show the simulation results of the light intensity Ie(L,S) generated at the position corresponding to the center of the mask pattern on the exposed material when the mask pattern line width L and the opening width S are varied in the exposure with the image enhancement mask shown in FIG. 24, represented by contour lines of the light intensity with the opening width S and the mask pattern line width L in the vertical axis and the horizontal axis, respectively. Herein, in each of FIGS. 25(a) to (c), the graph indicating the relationship of Ic(L)=Io(S) described above is superimposed. The simulation results shown in FIGS. 25(a) to (c) are obtained using different exposure light sources. The simulation results shown in FIG. 25(a) are obtained using regular exposure with a circular light source. The simulation results shown in FIG. 25(b) are obtained using annular exposure with an annular light source. The simulation results shown in FIG. 25(c) are obtained using quadrupole exposure with light sources positioned at four points on diagonal coordinates. Other simulation conditions are such that the wavelength of the exposure light λ=0.193 μm, and the numerical aperture NA of the projecting optical system of the exposure apparatus=0.6.

As shown in FIGS. 25(a) to (c), the dependence of the light intensity Ie(L,S) on the mask pattern width L and the opening width S is slightly varied depending on the shape of the exposure light source, but the condition that provides the smallest light intensity Ie(L,S) can be represented accurately by the relationship of Ic(L)=Io(S), regardless of the shape of the exposure light source.

In other words, there is no limitation regarding the shape of the mask pattern to which the mask pattern overlapping method of the present invention can be applied.

More specifically, the opening width that maximizes the effective light-shielding properties of the mask pattern in the image enhancement mask having the mask pattern with an arbitrary shape constituted by the mask enhancer can be calculated as follows.

(1) The light intensity Ic(r) generated at a position r corresponding to the vicinity of the center of a mask pattern on an exposed material is calculated in exposure using a light-shielding mask provided with a complete light-shielding film as the mask pattern instead of the mask enhancer of the image enhancement mask.

(2) The opening width is obtained so that the intensity of light transmitted through the opening is equal to Ic(r), and a phase shifter is provided in the opening.

It should be noted that since the opening width cannot be larger than the mask pattern width, when the opening width obtained by the above-described method exceeds the mask pattern width, the entire mask pattern is used as the phase shifter. When the light-shielding properties are not sufficient even if the entire mask pattern is used as the phase shifter, the size of the original mask pattern is increased, and the opening width can be obtained again by the above-described method.

In the above description, mask patterns having simple shapes have been described, but when a mask pattern has a complex shape, the mask pattern is divided into a plurality of patterns having a simple shape, and the mask pattern overlapping method of the present invention can be applied to each pattern. By doing this, the optimal opening width can be determined for each divided pattern.

As described above, in the photomask of the second embodiment, the intensity of mask pattern diffracted light is calculated, and the opening width of the mask enhancer is calculated such that the intensity of the shifter transmitted light is equal to the intensity of the mask pattern diffracted light, and thus the light-shielding properties of the mask pattern can be maximized. When a mask pattern has a complex shape, the mask pattern is divided into a plurality of patterns having a simple shape, and the opening width is calculated such that the intensity of the transmitted light is equal to the intensity of the diffracted light for each pattern, and thus the light-shielding properties throughout the mask pattern can be maximized.

In the second embodiment, the shape of the opening of the mask enhancer for generating shifter transmitted light does not have to be matched to the shape of the mask pattern, unlike the shape of the phase shifter in the first embodiment. In other words, the shape of the opening of the mask enhancer can be set to an arbitrary shape, as long as it is within the mask pattern. Furthermore, in the image enhancement of the present invention, the method of controlling shifter transmitted light by changing the transmittance of the phase shifter in the first embodiment can be regarded as one of the methods of controlling the shifter transmitted light by changing the size of the opening of the mask enhancer in the second embodiment. That is to say, a mask pattern constituted by a phase shifter having a predetermined transmittance can be replaced by another mask pattern in which an opening serving as a phase shifter having a transmittance higher than the predetermined transmittance is provided in a light-shielding film having the same outer shape as that of the mask pattern. Speaking in a more generalized manner, an opening having a predetermined transmittance and a predetermined shape and size is replaced equivalently by an opening having a transmittance different from the predetermined transmittance and a shape and size different from the predetermined shape and size. However, to satisfy this, it is a condition that the size of the mask pattern is about a half of λ/NA or less. It is important that the opening provided in a fine mask pattern has the same optical behavior, regardless of the shape of the opening, as long as the intensity of light transmitted through it is the same. An effect generated when this is utilized in the second embodiment will be described below.

Figure 26:
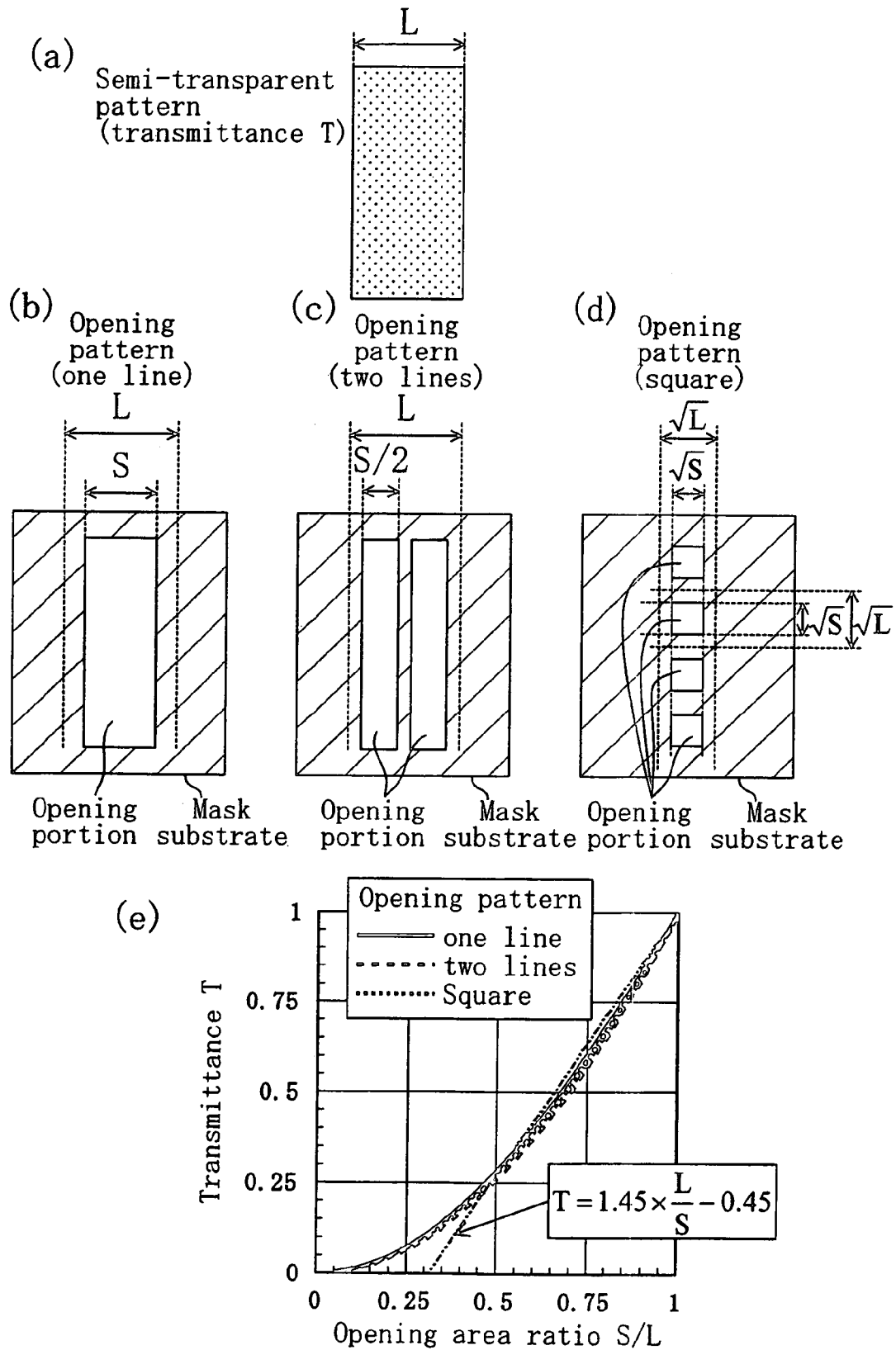
FIG. 26(a) is a view showing a semi-transparent pattern constituted by a semi-transparent film having a line width L and a transmittance T.
FIGS. 26(b) to (d) are diagrams showing opening patterns obtained by providing an opening having a transmittance of 1.0 in a transparent substrate.
FIG. 26(e) is a graph showing the results of evaluating the intensity of light transmitted through the opening with simulations when the opening pattern shown in each of FIGS. 26(b) to (d) is irradiated with light while changing the size S from 0 to L.

FIG. 26(a) shows a semi-transparent pattern constituted by a semi-transparent film having a line width L and a transmittance T. Herein, L=0.1 μm.

FIGS. 26(b) to (d) show opening patterns obtained by providing an opening having a transmittance of 1.0 in a transparent substrate, and FIG. 26(b) shows an opening pattern in which an opening constituted by one line with a width S is provided in the center of a region with a line width L(S<L), FIG. 26(c) shows an opening pattern in which openings constituted by two lines with a width of S/2 are provided uniformly in a region with a line width L, and FIG.

26(d) shows an opening pattern in which square openings having an area S are provided in the center of a region having an area L.

FIG. 26(e) shows the results of evaluating the intensity of light transmitted through the opening at the position corresponding to the center of each opening pattern with simulations when the opening pattern shown in each of FIGS. 26(b) to (d) is irradiated with light while changing the size S from 0 to L. In FIG. 26(e), using the transmittance T (vertical axis) of a semi-transparent film at the time when the intensity of light transmitted through a semi-transparent film at the position corresponding to the center of a semi-transparent pattern in the case where the semi-transparent pattern shown in FIG. 26(a) is irradiated with light is equal to the light intensity at the position corresponding to the center of each opening pattern, the light intensity at the position corresponding to the center of each opening pattern is evaluated. In FIG. 26(e), the light intensity at the position corresponding to the center of each opening pattern is plotted as a function using the opening area ratio S/L (horizontal axis) as the parameter.

As shown in FIG. 26(e), the dependence of the transmittance T of the semi-transparent film in the semi-transparent pattern equivalent to each opening pattern (hereinafter, referred to as "equivalent transmittance T) on the opening area ratio S/L is slightly varied depending on the shape of each opening pattern, but there is a strong correlation between the equivalent transmittance T and the opening area ratio S/L in all the opening patterns.

Figure 27:
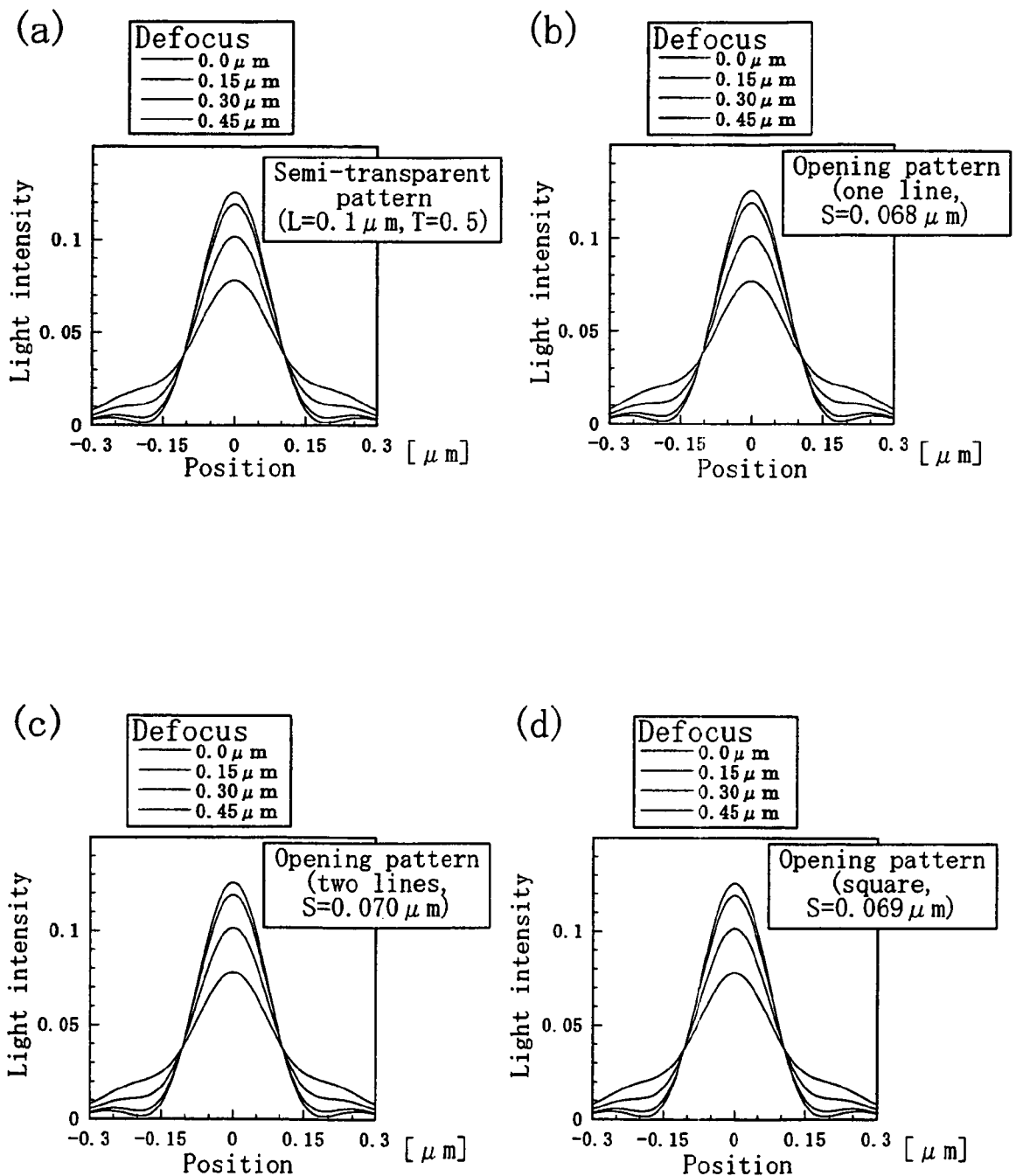
FIG. 27(a) is a graph showing the results of evaluating the intensity distribution of light transmitted through a semi-transparent film with simulations in which the transmittance T is 0.5, when the semi-transparent pattern shown in FIG. 26(a) is irradiated with light.
FIGS. 27(b) to (d) are graphs showing the results of evaluating the intensity distribution of light transmitted through an opening with simulations in which the equivalent transmittance T is 0.5, when the opening pattern shown in each of FIGS. 26(b) to (d) is irradiated with light.

FIG. 27(a) shows the results of evaluating the intensity distribution of light transmitted through the semi-transparent film with simulations in which the transmittance T is 0.5, when the semi-transparent pattern shown in FIG. 26(a) is irradiated with light. In FIG. 27(a), the position 0 (the original point in the horizontal axis) corresponds to the center of the semi-transparent pattern. FIG. 27(a) also shows the simulation results of the focus characteristics of the light intensity distribution. The focus characteristics are evaluated regarding the best focus position and the position defocused from the best focus position by 0.15, 0.30 and 0.45 µm.

FIGS. 27(b) to (d) show the results of evaluating the intensity distribution of light transmitted through an opening with simulations in which the equivalent transmittance T is 0.5, when the opening pattern shown in each of FIGS. 26(b) to (d) is irradiated with light. In this case, as seen from FIG. 26(e), S in the opening pattern shown in FIG. 26(b) is 0.068 µm, S in the opening pattern shown in FIG. 26(c) is 0.070 µm, and S in the opening pattern shown in FIG. 26(d) is 0.069 µm (however, L is 0.10 µm in all the cases). In FIGS. 27(b) to (d), the position 0 (the original point in the horizontal axis) corresponds to the center of each opening pattern. FIG. 27(b) to (d) also show the simulation results of the focus characteristics of the light intensity distribution. The focus characteristics are evaluated regarding the best focus position and the position defocused from the best focus position by 0.15, 0.30 and 0.45 µm.

FIGS. 27(b) to (d) indicate that if the light intensities at the position corresponding to its center in each opening pattern are matched, the optical characteristics thereof are totally equal.

In the image enhancement of the present invention in which the mask pattern diffracted light is cancelled by the shifter transmitted light, it is sufficient to adjust only the effective intensity of the shifter transmitted light, and the method that can be most easily realized can be selected as the method for generating the shifter transmitted light, as long as its intensity is the same.

Furthermore, if the opening area ratio is the same, the dependence of the intensity of the shifter transmitted light transmitted through the opening on the opening shape is small, and although not strictly, but practically, the intensity of the shifter transmitted light can be substantially uniquely determined by the opening area ratio.

For example, as shown in FIG. 26(e), the dependence of the equivalent transmittance T of each opening pattern shown in FIGS. 26(b) to (d) on the opening area ratio S/L can be represented approximately by:

$$T = 1.45 \times (S/L) - 0.45$$

This approximation is quite accurate with respect to a transmittance of 0.2 or more, although it is not accurate with respect to a low transmittance of 0.1 or less. However, in the above equation, the coefficient (1.45) of (S/L) and the constant (0.45) are changed depending on the wavelength of the exposure light or the mask pattern size.

Therefore, in the photomask of the second embodiment, the opening shape in the mask pattern can be changed to an arbitrary shape within the range in which the opening area ratio can be kept constant. For example, in the case where a mask pattern is to be formed for practical use, in view of the degree of attachment between the light-shielding film and the substrate, it is not preferable that an extremely narrow light-shielding film is produced. In this case, for example, the opening is divided into regions, each of which has a radius λ/NA or less, without changing its opening area ratio so as to ensure that a narrow light-shielding film is not present alone.

In the second embodiment, in order to maximize the effective light-shielding properties of a mask pattern in view of the principle of the image enhancement of the present invention, the opening width S can be determined based on the relationship Ic(L)=Io(S). However, if it is sufficient to make the effective light-shielding properties of the mask pattern higher than those of the mask pattern constituted by a complete light-shielding film, the opening width S may be determined such that the relationship Ic(L)=Io(S) is almost satisfied.

More specifically, as described above, the light intensity Ie(L,S) generated at the position corresponding to the center of the mask pattern on the exposed material through the image enhancement mask having the mask pattern with a line width L constituted by the mask enhancer having an opening width S can be estimated using the relationship:

Ie(L,S)=((Ic(L))$^{0.5}$−(Io(S))$^{0.5}$)$^2$, where Ic(L) is the light intensity of the mask pattern diffracted light and Io(S) is the light intensity of the shifter transmitted light). Therefore, the condition in which the shifter transmitted light becomes excessive, and the effective light-shielding properties of the mask pattern are deteriorated to be equal to those of the mask pattern constituted by a complete light-shielding film can be Ie(L,S)=Ic(L), that is, −((Ic(L))$^{0.5}$−(Io(S))$^{0.5}$)=(Ic(L))$^{0.5}$. In this case, since (Io(S))$^{0.5}$=2×(Ic(L))$^{0.5}$ is satisfied, and therefore Io(S)=4×(Ic(L)) is satisfied. In other words, when the light intensity of the shifter transmitted light reaches four times the light intensity of the mask pattern diffracted light, the effective light-shielding properties of the mask pattern becomes equal to those of the mask pattern constituted by a complete light-shielding film. In other words, when the opening width S is set so that the light intensity of the shifter transmitted light is not more than four times the light intensity of the mask pattern diffracted light, the effective light-shielding properties of the mask pattern can be improved from the mask pattern constituted by a complete light-shielding film.

In the second embodiment, for more generalized situations, the opening width can be determined in the following manner. To reduce the light intensity Ih generated at the position corresponding to the center of the mask pattern on an exposed material to 1/D of the intensity Ic of the mask pattern diffracted light, the opening width that satisfies the following inequality can be used.

$$-((Ic)^{0.5}-(Io)^{0.5})<(Ic/D)^{0.5}$$

$$<((Ic)^{0.5}-(Io)^{0.5})$$

More specifically, in the case of D=3, the opening width is set so that Io (light intensity of the shifter transmitted light) is between 0.18 times and 2.5 times the value of Ic. In the case of D=5, the opening width is set so that Io is between 0.31 times and 2.1 times the value of Ic. In the case of D=10, the opening width is set so that Io is between 0.48 times and 1.7 times the value of Ic. It is not necessary to maximize the light-shielding properties of all the mask patterns for practical use, so that if the opening width is set so that Io is between about ⅓ and 2 times the value of Ic, the light-shielding properties of the mask pattern can be improved sufficiently.

Furthermore, in a method for forming a pattern of the second embodiment, that is, a method for forming a pattern using the photomask of the second embodiment, a positive resist film or a negative resist film can be used as the resist film. When a positive resist film is used, a resist pattern having a mask pattern shape can be formed by developing the positive resist film irradiated with exposure light, and removing portions other than the portion corresponding to the mask pattern in the positive resist film. When a negative resist film is used, a resist pattern having an opening with a mask pattern shape can be formed by developing the negative resist film irradiated with exposure light, and removing the portion corresponding to the mask pattern in the negative resist film. Regardless of whether the positive resist film is used or the negative resist film is used, when the mask pattern width L is smaller than about 0.4×λ/NA, the precision of the size of the resist pattern can be improved significantly, compared with the conventional methods.

VARIATION EXAMPLE OF THE SECOND EMBODIMENT

Hereinafter, a photomask according to a second embodiment of the present invention, a method for producing the same and a method for forming a pattern using the photomask will be described with reference of the accompanying drawings.

A variation example of the second embodiment is different from the second embodiment in the following aspects. In the second embodiment, it is implicitly assumed that a light-shielding portion constituting a mask pattern constituted by a mask enhancer is a complete light-shielding film. However, in this variation example of the second embodiment, a semi-light-shielding portion having a predetermined transmittance with respect to exposure light is used as the light-shielding portion constituting the mask pattern. It is ideal that this semi-light-shielding portion does not generate a phase difference between this portion and a light-transmitting portion with respect to exposure light, but if the phase difference is (−30+360×n) degrees or more and (30+360×n) degrees or less (n=an integer), it is regarded as being able to be ignored.

Figure 28:
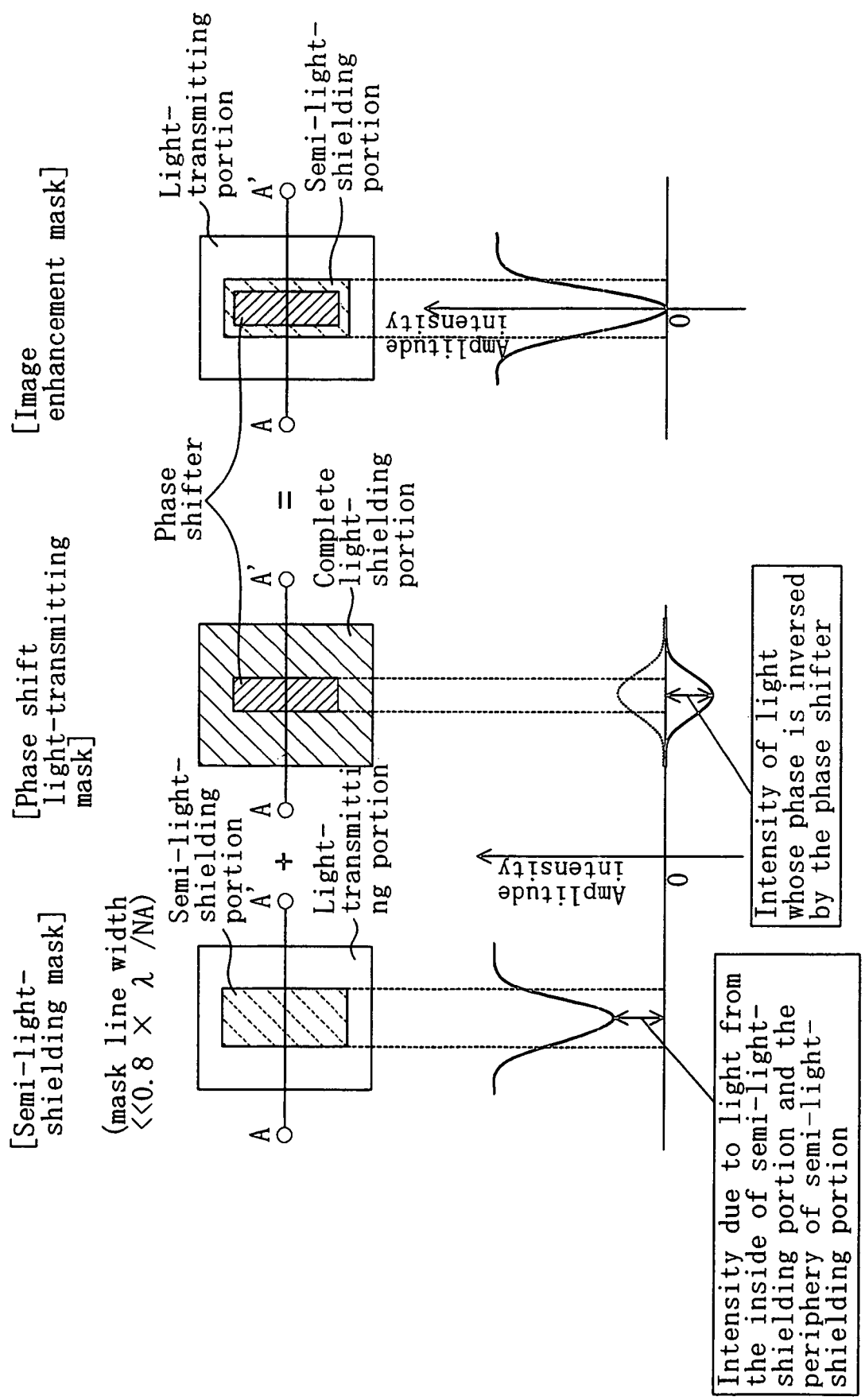
FIG. 28 is a schematic view showing the principle of an image enhancement of the present invention when a semi-light-shielding-portion is used as a light-shielding portion constituting a mask pattern in the case where the line width of a mask pattern constituted by a mask enhancer is smaller than $0.8 \times \lambda/NA$.
Figure 29:
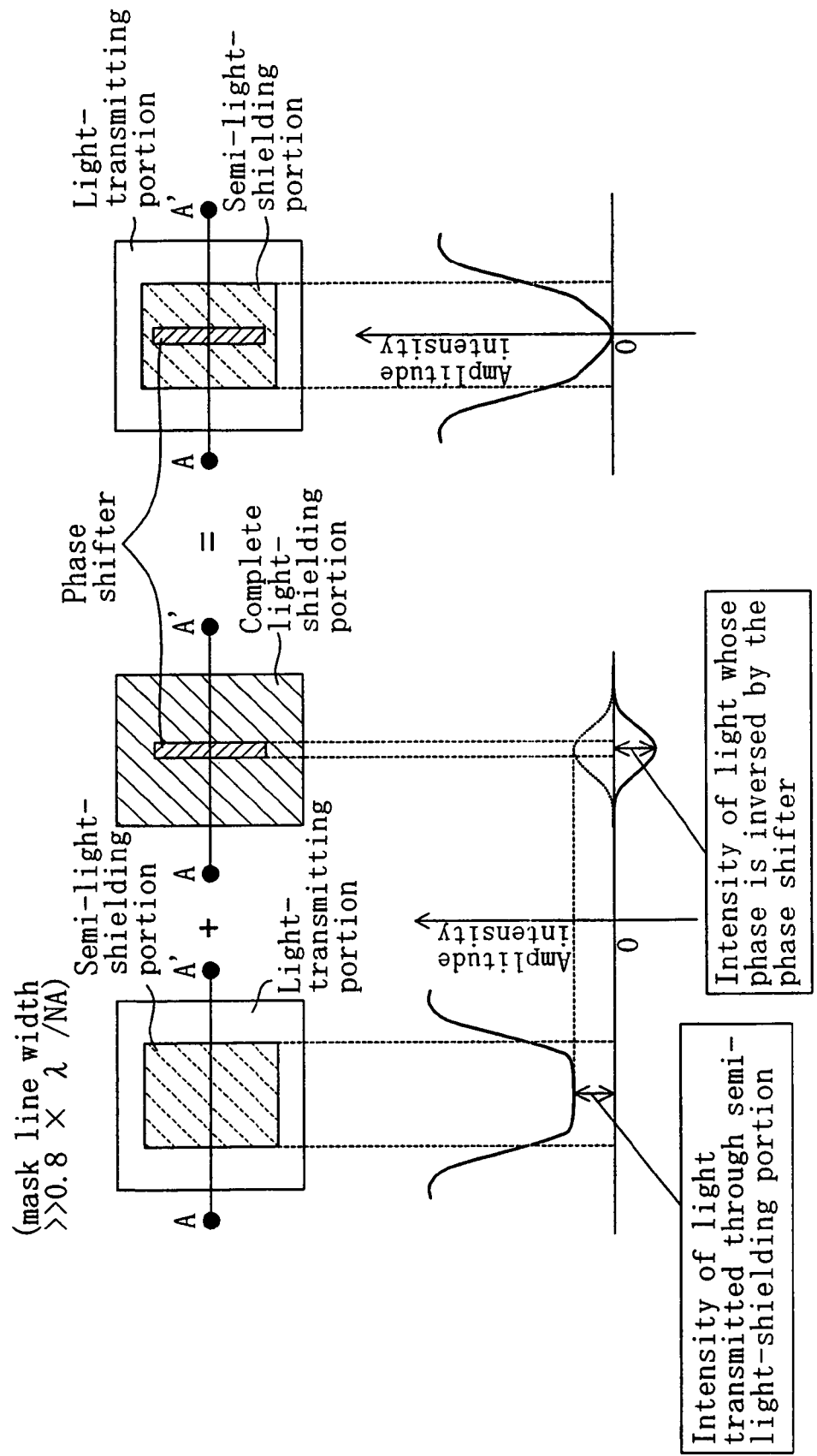
FIG. 29 is a schematic view showing the principle of an image enhancement of the present invention when a semi-light-shielding-portion is used as a light-shielding portion constituting a mask pattern in the case where the line width of a mask pattern constituted by a mask enhancer is larger than $0.8 \times \lambda NA$

In the variation example of the second embodiment, the principle of the image enhancement is basically the same as in the case of FIG. 3, but slightly different effects result. Hereinafter, effects provided by using the semi-light-shielding portion as the light-shielding portion constituting the mask pattern will be described with reference to FIGS. 28 and 29. FIG. 28 is a schematic view showing the principle of the image enhancement of the present invention in the case where the line width L of the mask pattern constituted by the mask enhancer is sufficiently small, that is, smaller than 0.8×λ/NA (λ is the wavelength of the exposure light and NA is the numerical aperture). FIG. 29 is a schematic view showing the principle of the image enhancement of the present invention in the case where the line width L of the mask pattern constituted by the mask enhancer is sufficiently large, that is larger than 0.8×λ/NA.

As shown in FIGS. 28 and 29, the image enhancement mask has a structure in which the semi-light-shielding mask provided with the semi-light-shielding portion corresponding to the mask pattern of the image enhancement mask and a phase shift transmitted mask provided with a phase shift pattern corresponding to the phase shifter of the image enhancement mask in a complete light-shielding portion covering the surface of the mask are overlapped. FIGS. 28 and 29 also show the amplitude intensity of the light transmitted through each of the semi-light-shielding mask, the phase shift transmitted mask and the image enhancement mask and transferred at the position corresponding to line AA'.

First, as shown in FIG. 28, when the line width L of the mask pattern constituted by a mask enhancer is smaller than 0.8×λ/NA and the semi-light-shielding portion is used as the light-shielding portion, the principle of the image enhancement is substantially the same as in the case of FIG. 3(a) using a complete light-shielding portion as the light-shielding portion. However, as seen in the amplitude intensity of the light transmitted through the semi-light-shielding mask, the intensity transferred at the position corresponding to the center of the semi-light-shielding pattern constituted by the semi-light-shielding portion results from not only the light from the periphery of the semi-light-shielding pattern, but also from the light transmitted through the inner portion of the semi-light-shielding pattern. Therefore, the light intensity transferred at the position corresponding to the center of the semi-light-shielding pattern shown in FIG. 28 is increased from when a complete light-shielding portion is used as the light-shielding portion by the extent of the light transmitted through the inner portion of the semi-light-shielding pattern. Therefore, in order to cancel this increase, it is necessary to make the width of the phase shifter larger than when a complete light-shielding portion is used as the light-shielding portion. Only this point is different between when the semi-light-shielding portion is used as the light-shielding portion and when a complete light-shielding portion is used as the light-shielding portion in the case where the line width L of the mask pattern is smaller than 0.8×λ/NA.

When the line width of the complete light-shielding pattern constituted by the complete light-shielding portion becomes larger than 0.8×λ/NA, there is almost no light going into the back side of the mask pattern from the periphery of the pattern, so that the light intensity transferred at the position corresponding to the center of the complete light-shielding pattern is substantially 0. Therefore, in the case where such a phase shifter is arranged in the complete light-shielding pattern, the contrast is reduced, however small the width of the phase shifter is.

On the other hand, as shown in FIG. 29, when the line width L of the mask pattern constituted by the mask enhancer is larger than $0.8 \times \lambda/NA$ and the semi-light-shielding portion is used as the light-shielding portion, there is light transmitted through the semi-light-shielding pattern of the semi-light-shielding mask corresponding to the image enhancement mask, however larger than $0.8 \times \lambda/NA$ the line width L becomes. Therefore, the light intensity transferred at the position corresponding to the center of the semi-light-shielding pattern never becomes 0. Therefore, the contrast is not reduced, regardless of the position in the semi-light-shielding pattern at which the phase shifter is arranged, as long as the phase shifter has a size and width that can transmit light having an intensity just as high so as to cancel the light transmitted through the semi-light-shielding pattern at this point. Furthermore, when the line width L of the mask pattern is larger than a value twice $0.8 \times \lambda/NA$, a plurality of phase shifters can be arranged, as long as the phase shifters have the above-described size and width and are arranged apart from each other by $0.8 \times \lambda/NA$ or more.

Next, advantages provided when producing a mask by using the semi-light-shielding portion as the light-shielding portion constituting a mask pattern in the image enhancement mask instead of the complete light-shielding portion will be described.

FIG. 30($a$) is a plan view of a photomask provided with a complete light-shielding pattern with a line width L constituted by a complete light-shielding portion and shows the light intensity of light transmitted through the mask and transferred at the position corresponding to the line AA'. FIG. 30($b$) is a plan view of a photomask provided with a semi-light-shielding pattern with a line width L constituted by a semi-light-shielding portion and shows the light intensity of light transmitted through the mask and transferred at the position corresponding to the line AA'.

When the line width L of the complete light-shielding pattern becomes larger than $0.8 \times \lambda/NA$, as shown in FIG. 30($a$), the intensity of the light transferred at the position corresponding to the center of the complete light-shielding pattern becomes 0. In other words, when the complete light-shielding portion is used as the light-shielding portion constituting the mask pattern in the image enhancement mask, as shown in FIG. 30($c$), the width of the phase shifter is reduced as the width L of the complete light-shielding pattern is increased, and it is necessary to eliminate the phase shifter when the line width L becomes larger than $0.8 \times \lambda/NA$ However, when actually producing a mask pattern, the line width of the phase shifter is changed by unit of a mask grid (the minimum width by which the mask size can be adjusted: generally about 1 nm), and the minimum of the line width of the phase shifter that can be produced is limited, because of limitations in terms of mask processing. Therefore, if the complete light-shielding portion is used as the light-shielding portion constituting the mask pattern in the image enhancement mask, it is not always possible to arrange an optical phase shifter in the light-shielding pattern.

On the other hand, as shown in FIG. 30($b$), even if the line width of the semi-light-shielding pattern is larger than $0.8 \times \lambda/NA$, the light intensity corresponding to the center of the semi-light-shielding pattern never becomes 0, and there is residual light intensity resulting from the light transmitted through the semi-light-shielding pattern. In other words, a phase shifter can be arranged in a semi-light-shielding pattern with any line width, as long as the phase shifter has a line width that can matched to this residual light intensity. More specifically, as shown in FIG. 30($d$), the line width of the phase shifter is decreased as the line width L of the semi-light-shielding pattern is increased, but when the line width of the phase shifter is decreased to a size that matches to the residual light intensity, it is not necessary to decrease the line width of the phase shifter any more. Thus, when the semi-light-shielding portion is used as the light-shielding portion constituting the mask pattern in the image enhancement mask, the phase shifter having a predetermined line width can be arranged at an arbitrary position in the semi-light-shielding pattern. Therefore, if the transmittance of the semi-light-shielding portion is adjusted such that the residual light intensity of the semi-light-shielding portion corresponds to the minimum value of the phase shifter that can be produced on an actual mask, an optimal phase shifter can be arranged in an arbitrary semi-light-shielding pattern. Furthermore, if the transmittance of the semi-light-shielding portion at this point is low so that a resist is not exposed to light, in the semi-light-shielding pattern with a line width of $0.8 \times \lambda/NA$ or more, it can be determined arbitrarily whether the phase shifter is arranged or eliminated. Furthermore, if the distance between the phase shifters is $0.8 \times \lambda/NA$ or more in the semi-light-shielding pattern, a plurality of phase shifters can be arranged in the semi-light-shielding pattern. In this case, if the phase shifters are arranged not in the central portion, but in the fringe of the semi-light-shielding pattern, the contrast in the fringe of the semi-light-shielding pattern can be emphasized.

As described above, according to the variation example of the second embodiment, the semi-light-shielding portion is used as the light-shielding portion constituting the mask pattern constituted by the mask enhancer, instead of the complete light-shielding portion, so that the arrangement of the phase shifter emphasizing the contrast of the light intensity by the mask pattern can be realized accurately with respect to an arbitrary pattern shape. Furthermore, the light transmitted through the semi-light-shielding portion constituting the mask pattern makes it possible to arrange the phase shifter at an arbitrary position in the mask pattern, so that a special effect of setting a location at which the contrast is emphasized at an arbitrary position in the mask pattern by arranging the phase shifter can be obtained.

In the variation example of the second embodiment, it is preferable that the transmittance of the semi-light-shielding portion used as the light-shielding portion constituting the mask pattern constituted by the mask enhancer is about 15% or less. The reason for this is as follows. When the light intensity Ith is the critical intensity at which a resist film is exposed to light and the intensity Ib is the background intensity of the light transmitted through the semi-light-shielding portion, then the higher Ith/Ib leads to the less possibility of a reduction of the thickness of the resist film during formation of a pattern, and it is more preferable that this value is as high as possible. In general, it is preferable that Ith/Ib is 2 or more. However, since Ith/Ib is decreased as the transmittance of the semi-light-shielding portion is increased, so that it is not preferable that the transmittance of the semi-light-shielding portion is too high for improvement of Ith/Ib. More specifically, it is preferable that the transmittance of the semi-light-shielding portion is 15% or less, because Ith/Ib becomes smaller than 2 when the transmittance of the semi-light-shielding portion is about 15%.

Third Embodiment

A method for forming a pattern according to a third embodiment of the present invention will be described with reference to the accompanying drawings, by taking an example a method for improving a focus margin by exposure using the photomask (an example of the photomask according to the second embodiment) having a mask pattern constituted by the mask enhancer. The effect of improving focus margin in the third embodiment can be realized by combining the image enhancement of the present invention in which the mask pattern diffracted light is cancelled by the shifter transmitted light and a method for exposure. In addition, it can be considered that increasing and decreasing the opening width of the mask enhancer in the photomask of the second embodiment has the same effect as increasing and decreasing the transmittance of the phase shifter in the photomask of the first embodiment. In other words, the method for forming a pattern according to the third embodiment can be realized by using either one of the photomasks according to the first or the second embodiment.

FIGS. 31(a) to (g) are diagrams explaining the dependence of the light intensity distribution generated on an exposed material by exposure with the mask enhancer on the exposure light incident direction from the light source to the photomask (hereinafter, referred to simply as "exposure light incident direction). More specifically, these drawings show the results of simulations performed in order to evaluate what influence the exposure light incident direction can give to the profile shape of the light intensity distribution formed by canceling the mask pattern diffracted light by the shifter transmitted light. More specifically, the light intensity distribution transferred on an exposed material by the exposure light using a linear mask enhancer (mask pattern width L and opening width S) provided parallel to and along the Y axis of the light source coordinate as shown in FIG. 31(a) is evaluated by calculations with simulations with respect to various exposure light incident directions.

FIGS. 31(b) to (d) show the positions at which small light sources are arranged in the light source coordinate used in the simulations, and FIG. 31(b) shows a light source that is incident from the center of the light source coordinate (vertical incident). FIG. 31(c) shows a light source that is incident obliquely from the X axis direction or the Y axis direction of the light source coordinate. FIG. 31(d) shows a light source that is incident obliquely from the 45 degree direction (straight direction of Y=X or Y=−X) of the light source coordinate. The light sources shown in FIGS. 31(b) to (d) are circular light sources having a radius of 0.05 in the light source coordinate. However, all the values on the light source coordinate are normalized by the numerical number NA of the reduced size optical system of the exposure apparatus.

FIGS. 31(e) to (g) show the light intensity distribution generated at the position corresponding to the X axis of FIG. 31(a) on an exposed material by the exposure with various structures of the mask pattern. In FIGS. 31(e) to (g), 0 at the horizontal axis (position) is a position corresponding to the center of the mask pattern.

Herein, FIG. 31(e) shows the light intensity distribution in the case where the entire mask pattern with a width L of 0.12 μm is constituted by a light-shielding film (S=0.0 μm) with respect to each exposure light incident direction. However, the optical conditions other than the exposure light incident direction are all common, such as the wavelength of the exposure light=193 nm and the numerical aperture=0.6.

As shown in FIG. 31(e), the effective light-shielding properties of the mask pattern is varied by the exposure light incident direction, and the light-shielding properties in the case of oblique incidence from the 45 degree direction are worst.

FIG. 31(f) shows the light intensity distribution in the case where the mask pattern width L is adjusted such that the light intensities at the position 0 on the light intensity distribution shown in FIG. 31(e) are matched with respect to the exposure light incident directions.

FIG. 31(g) shows the light intensity distribution in the case where an opening (width S) serving as a phase shifter is provided by the image enhancement of the present invention such that the effective light-shielding properties of the mask pattern with an adjusted width L as shown in FIG. 31(f) are maximized with respect to the exposure light incident directions. Here, in order to observe what influence occurs in the profile shape of the light intensity distribution by canceling the mask pattern diffracted light with the shifter transmitted light, the light intensities of each of the shifter transmitted light and the mask pattern diffracted light at the arrangement positions of the light sources shown in FIG. 31(b) to (d) are made the same and evaluation is performed. Furthermore, the scale on the vertical axis (light intensity) of FIG. 31(g) is offset by 0.1 so that the profiles of the light intensity distributions shown in FIGS. 31(f) and 31(g) can be compared easily.

When the profile shapes of the light intensity distributions shown in FIGS. 31(f) and 31(g) are compared regarding the case where the exposure light incident direction is the direction from the center of the light source coordinate, the profile shape of the light intensity distribution becomes flat at the position corresponding to the center of the mask pattern by canceling the mask pattern diffracted light with the shifter transmitted light. This means that the light-shielding properties of the mask pattern are improved, whereas the profile shape of the light intensity distribution becomes dull (deteriorate).

When the profile shapes of the light intensity distributions shown in the FIGS. 31(f) and 31(g) are compared regarding the oblique incidence where the exposure light incident direction is the oblique incidence from the X axis direction or the Y axis direction of the light, the profile shape of the light intensity distribution is not substantially changed even if the mask pattern diffracted light is cancelled by the shifter transmitted light.

On the other hand, when the profile shapes of the light intensity distributions shown in FIGS. 31(f) and 31(g) are compared regarding the case where the exposure light incident direction is the oblique incidence from the 45 degree direction of the light source coordinate, the profile shape of the light intensity distribution becomes sharp (improved) at the position corresponding to the center of the mask pattern by canceling the mask pattern diffracted light with the shifter transmitted light.

In other words, by using the image enhancement of the present invention of canceling the mask pattern diffracted light with the shifter transmitted light, the light-shielding properties at the position corresponding to the center of the mask pattern can be maximized with respect to any exposure light incident direction. However, the influence on the profile shape of the light intensity distribution is varied depending on the exposure light incident direction.

Hereinafter, a method for improving the focus characteristics in the formation of a pattern by exposure using the mask enhancer, utilizing the fact that the profile shape of the light intensity distribution is not degraded when the oblique incidence from the 45 degree direction is used as the exposure light incident direction in the image enhancement of the present invention will be described.

FIGS. 32(a) to (d) and FIG. 33(a) to (d) are graphs showing the principle of a method for improving the defocus characteristics utilizing a mask enhancer. All the calculation result shown in FIGS. 32(a) to (d) and FIG. 33(a) to (d) are simulation results using oblique incident exposure (off-axis illumination) from the 45 degree directions of the light source coordinate shown in FIG. 31(d).

Figure 32:
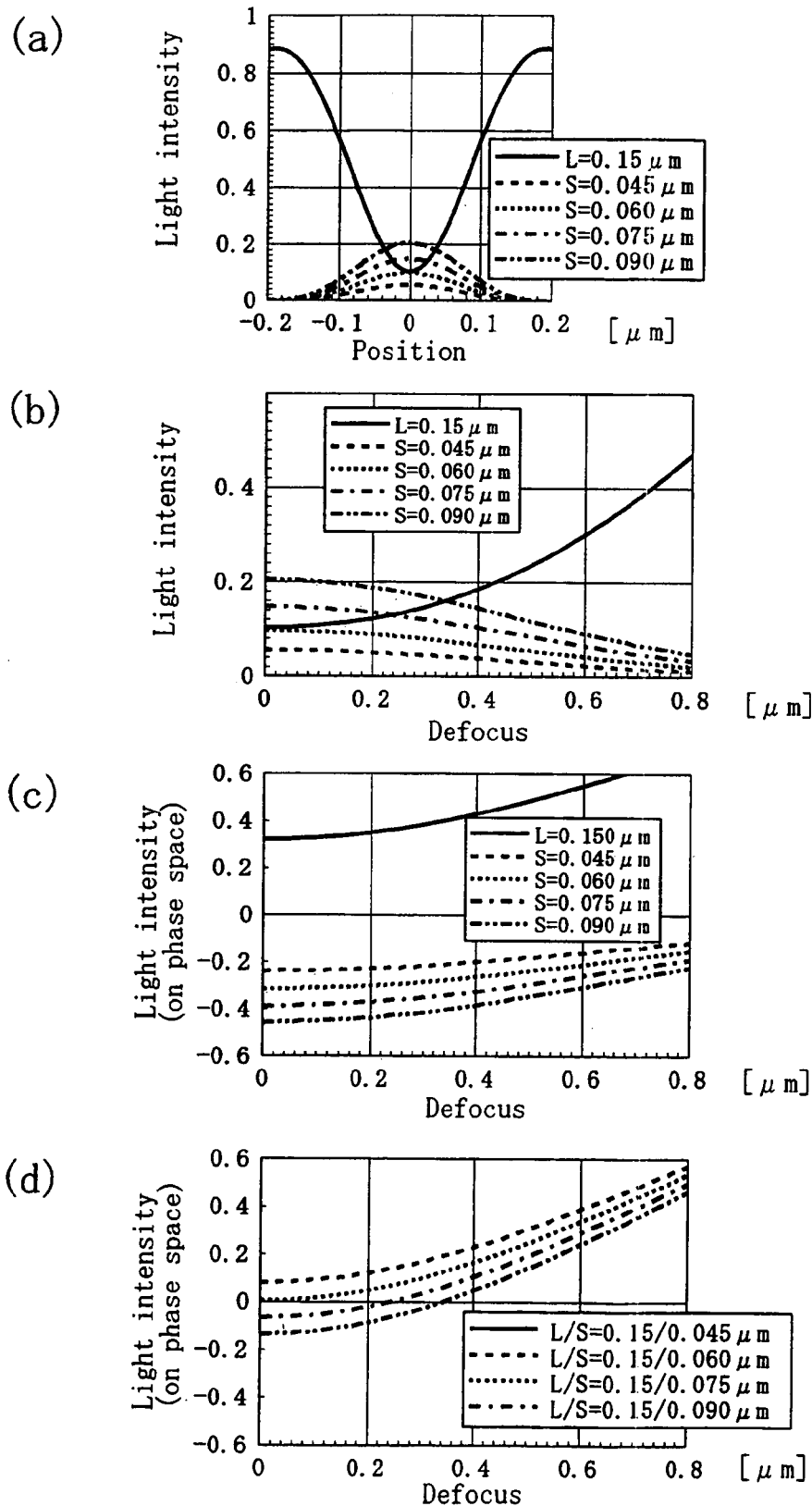
FIGS. 32(a) to (d) are graphs showing the principle of a method for improving the defocus characteristics utilizing a mask enhancer.

FIG. 32(a) shows the light intensity distribution projected on an exposed material in the exposure using the photomask provided with a single light-shielding film with a width L and a single opening with a width S. FIG. 32(a) shows the results in the case of L=0.15 µm, and the results when S is varied to 0.045 µm, 0.060 µm, 0.075 µm, and 0.090 µm. In FIG. 32(a), 0 in the horizontal axis (position) is the position corresponding to the center of the light-shielding film or the center of the opening on the exposed material.

FIG. 32(b) shows changes of the light intensity at the position corresponding to the center of the light-shielding film or the center of the opening in the light intensity distribution shown in FIG. 32(a) with respect to defocusing in the exposure.

As shown in FIG. 32(b), the light intensity generated by the light-shielding film increases as defocusing increased, whereas the light intensity generated by the opening decreases as defocusing increased.

In the case where the mask pattern diffracted light and the shifter transmitted light are desired to interfere each other as lights with opposite phases by producing a mask enhancer structure in which an opening serving as a phase shifter is provided in a light-shielding film, the light intensity realized by the mask enhancer is proportional to a difference between the mask pattern diffracted light and the shifter transmitted light. In this case, if the light intensity of the shifter transmitted light is set to be larger than the light intensity of the mask pattern diffracted light in the best focus (defocus is 0), the difference in the light intensity between the two lights decreases as the defocus increases, and the difference in the light intensity reaches 0 at a certain amount of defocus, and thereafter the light intensity of the mask pattern diffracted light becomes larger than the shifter transmitted light and the difference in the light intensity increases as the defocus increases.

In the third embodiment, utilizing this effect, the defocus characteristics can be improved. For example, the light intensity at the position corresponding to the center of a mask pattern on an exposed material in exposure using a photomask provided with a mask pattern with a pattern width L (L=0.15 µm) constituted by a mask enhancer with an opening width S(S=0.045 µm, 0.060 µm, 0.075 µm, and 0.090 µm) can be obtained by adding the light intensity generated by the light-shielding film and the light intensity generated by the opening in a phase space, as shown in FIG. 32(b). In this case, first, the light intensity on the phase space by generated by each of the light-shielding film and the opening can be obtained by taking the square root of each light intensity. Furthermore, a negative value is used as the light intensity on the phase space generated by the opening serving as a phase shifter in view of the phase.

FIG. 32(c) shows changes of the light intensity on the phase space generated by each of the light-shielding film and the opening obtained in the above-described manner with respect to defocusing in the exposure.

FIG. 32(d) shows changes of the total value of the light intensities on the phase space generated by the light-shielding film and the opening shown in FIG. 32(c). The results shown in FIG. 32(d) shows the defocus characteristics of the light intensity (on a phase space) at the position corresponding to the center of a mask pattern on an exposed material in exposure using a photomask provided with a mask pattern with a pattern width L (L=0.15 µm) constituted by a mask enhancer with an opening width S(S=0.045 µm, 0.060 µm, 0.075 µm, and 0.090 µm).

As shown in FIG. 32(d), in the case of an opening width S=0.06 µm, the mask pattern diffracted light and the shifter transmitted light are completely cancelled each other in the best focus, and therefore the light intensity (on the phase space) at the position corresponding to the center of the mask pattern is substantially 0. On the other hand, when the opening width S becomes 0.06 µm or more, the shifter transmitted light becomes excessive in the best focus, so that the light intensity (on the phase space) at the position corresponding to the center of the mask pattern has a negative value. However, even if the shifter transmitted light becomes excessive in the best focus, the mask pattern diffracted light is changed to be excessive as the defocus increases.

FIG. 33(a) shows changes of the light intensities (corresponding to energy intensity) on the actual space obtained by squaring the light intensity on the phase space shown in FIG. 32(d) with respect to defocus in exposure. In other words, the results shown in FIG. 33(a) shows the defocus characteristics of the light intensity (on the actual space) at the position corresponding to the center of a mask pattern on an exposed material in the exposure using a photomask provided with a mask pattern with a pattern width L (L=0.15 µm) constituted by a mask enhancer with an opening width S(S=0.045 µm, 0.060 µm, 0.075 µm, and 0.090 µM).

As shown in FIG. 33(a), in the case of the mask enhancer in which the shifter transmitted light becomes excessive in the best focus, the effective light-shielding properties are maximized in the best focus state. In this case, even if the effective light-shielding properties are not maximized in the best focus and if the effective light-shielding properties are in the range that causes no practical problems, the possibility of the degradation of the light-shielding properties due to defocusing is reduced by the extent that the focus position at which the light-shielding properties is maximized is shifted to the defocus position. This is the principle of a method for improving the defocus characteristics utilizing the mask enhancer in the third embodiment.

FIG. 33(b) shows the light intensity distribution projected on an exposed material in the case where the mask enhancer with each opening width S described above is used at the best focus. As shown in FIG. 33(b), regardless of whether the shifter transmitted light is optimal or excessive, the light intensity distribution having substantially equal contrast can be realized with respect to each opening width S. In other words, sufficient light-shielding properties are realized with respect to all the opening widths S.

FIG. 33(c) shows the light intensity distribution projected on an exposed material in the case where a mask enhancer with an opening width S of 0.09 µm is used at various focus positions. As shown in FIG. 33(c), according to this mask enhancer, although the light intensity distribution at the position corresponding to the outside of the mask pattern region is changed by defocusing, the light intensity distribution at the position corresponding to the inside of the mask pattern region is substantially not changed by defocusing. For reference, FIG. 33(d) shows the light intensity distribution projected on an exposed material in the case where a complete light-shielding film is used at various focus positions instead of the mask enhancer.

As described above, according to the third embodiment, utilizing the action of the mask enhancer to control the shifter transmitted light with respect to the mask pattern diffracted light, the shifter transmitted light is set to be excessive with respect to the mask pattern diffracted light, so that the defocus characteristics in the light intensity distribution can be improved, and therefore the focus margin in pattern formation can be improved drastically.

In the third embodiment, when setting the shifter transmitted light to be excessive with respect to the mask pattern diffracted light, if a condition that the light-shielding properties should not be lower than those of a mask pattern constituted by a complete light-shielding film is set, the light intensity of the shifter transmitted light at the position corresponding to the center of the mask pattern should not be at least four times larger than the light intensity distribution of the mask pattern diffracted light at the position corresponding to the center of the mask pattern. In other words, this condition defines the upper limit with respect to the opening width of the mask enhancer (with respect to the transmittance when the transmittance of the phase shifter is adjusted to control the shifter transmitted light).

In the above, referring to FIGS. 32(a) to (d) and FIG. 33(a) to (d), the principle of a method for improving the defocus characteristics utilizing a mask enhancer has been described. When forming the light intensity distribution by synthesizing the mask pattern diffracted light and the shifter transmitted light as described above, the profile shape is affected significantly by the exposure light incident direction (see FIG. 31(g)). Therefore, the influence of the exposure light incident direction on the method for improving the defocus characteristics utilizing a mask enhancer will be described below.

FIGS. 34(a) to (c), FIGS. 35(a) to (c) and FIG. 36(a) to (c) are graphs explaining the dependence of the profile shape change of the light intensity distribution by defocusing on the exposure light incident direction. More specifically, FIGS. 34(a) to (c), FIGS. 35(a) to (c) and FIG. 36(a) to (c) show the results of the defocus characteristics of the mask enhancer in which the light-shielding properties with respect to each of the exposure light incident directions are maximized as shown in FIG. 31(g), which are obtained by simulations, using the exposure light incident directions shown in FIGS. 31(b) to (d). The results shown in FIGS. 34(a) to (c) are results obtained at the time when the exposure light is incident from the direction from the center of the light source coordinate. The results shown in FIGS. 35(a) to (c) are results obtained at the time when shows the exposure light is incident obliquely from the X axis direction or the Y axis direction of the light source coordinate. The results shown in FIG. 36(a) to (c) are results obtained at the time when the light source is incident obliquely from the 45 degree direction of the light source coordinate. The results shown in FIG. 34(a), FIG. 35(a), and FIG. 36(b) show the defocus characteristics of the light intensity distribution when the mask enhancer is replaced by a light-shielding film having the same outer size (that is, the light intensity distribution by the mask pattern diffracted light). FIG. 34(b), FIG. 35(b), and FIG. 36(c) show the defocus characteristics of the light intensity distribution when an opening having the same size as the opening of the mask enhancer is provided in the light-shielding film (that is, the light intensity distribution by the shifter transmitted light). FIG. 34(c), FIG. 35(c), and FIG. 36(c) show the defocus characteristics of the light intensity distribution when the mask enhancer is used (that is, the light intensity distribution by the synthesized light of the mask pattern diffracted light and the shifter transmitted light). Here, the scales on the vertical axis (light intensity) of FIGS. 34(c), 35(c), and 36(c) are offset by 0.1 so that the results of FIGS. 34(c), 35(c), and 36(c) can be compared with the results shown in other drawings easily.

As shown in FIGS. 34(b), 35(b), and 36(b), the defocus characteristics of the light intensity distribution by the shifter transmitted light has dependence on the exposure light incident direction, but the difference in the defocus characteristics corresponding to each exposure light incident direction is not very large. However, as shown in FIGS. 34(a), 35(a), and 36(a), the defocus characteristics of the light intensity distribution by the mask pattern diffracted light are significantly varied with the exposure light incident direction. In particular, when the exposure light is incident from the direction from the center of the light source coordinate, the profile is such that the light intensity at the position corresponding to the vicinity of the center of the mask pattern increases locally by defocusing. Therefore, when the exposure light is incident from the direction from the center of the light source coordinate and the shifter transmitted light is added to the mask pattern diffracted light, then this profile is deteriorated further. In reality, when comparing the defocus characteristics of the profile shape of the light intensity distribution shown in FIG. 34(a) with the defocus characteristics of the profile shape of the light intensity distribution shown in FIG. 34(c), the profile shape of the light intensity distribution by the mask enhancer is deteriorated by defocusing. On the other hand, when the exposure light is incident obliquely from the X axis direction or the Y axis direction of the light source coordinate, as shown in FIGS. 35(a) to (c), even if the shifter transmitted light is added to the mask pattern diffracted light, the profile shape of the light intensity distribution is not deteriorated nor improved. When the exposure light is incident obliquely from the 45 degree directions of the light source coordinate, as shown in FIGS. 36(a) to (c), when the shifter transmitted light is added to the mask pattern diffracted light, the profile shape of the light intensity distribution is improved.

Figure 37:
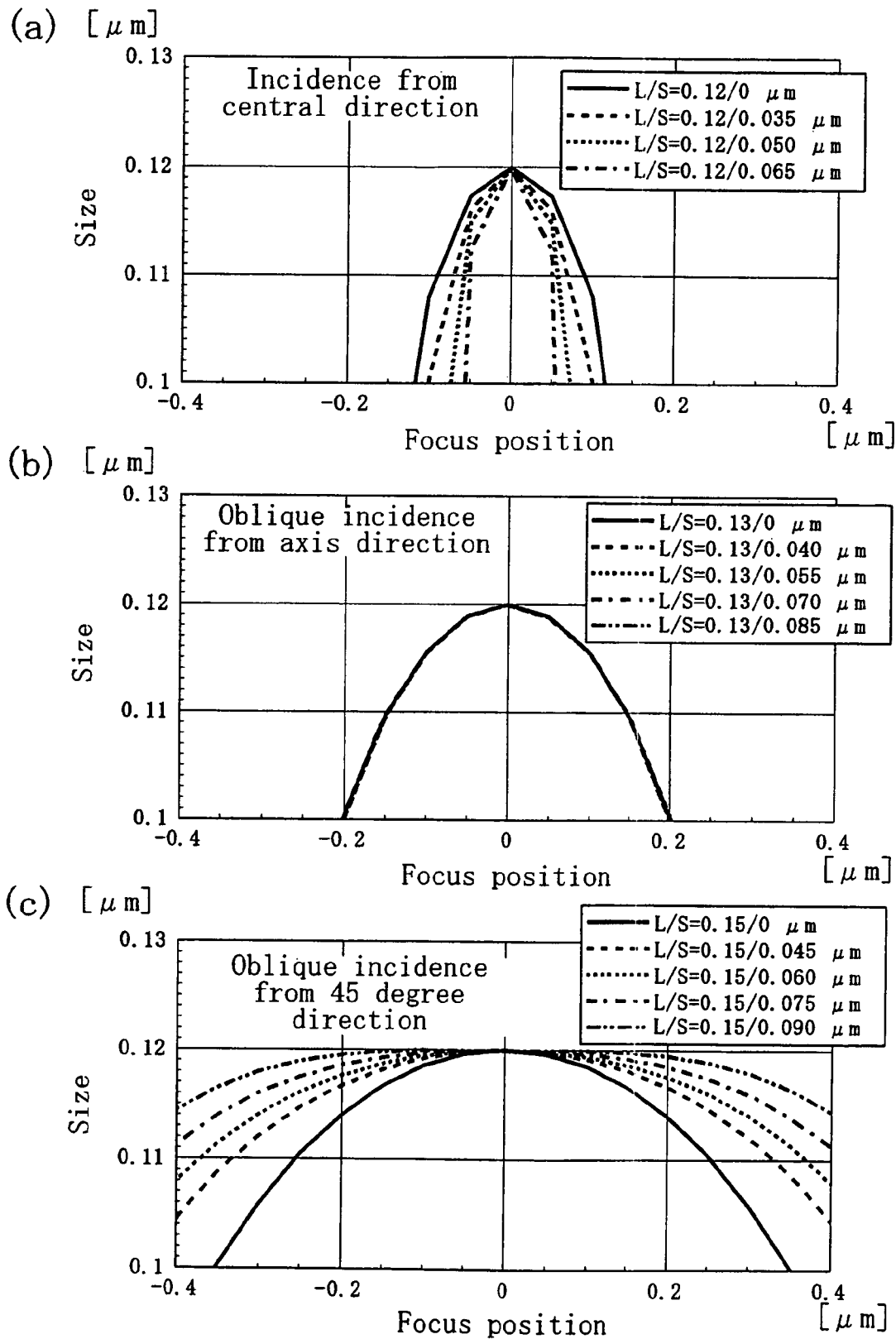
FIGS. 37(a) to (c) are graphs showing the results of calculating the DOF characteristics when exposure is performed using photomasks having different sizes of an opening serving as a phase shifter in a mask enhancer from each exposure light incident direction.

For clarification of the above-described results, the inventor of the present invention calculated the DOF (depth of focus) characteristics at the time when exposure is performed from each exposure light incident direction, using a photomask whose opening serving as the phase shifter in the mask enhancer has a different size with simulations. FIGS. 37(a) to (c) show the results thereof. FIG. 37(a) shows the results obtained at the time when the exposure light is incident from the direction from the center of the light source coordinate. FIG. 37(b) shows the results obtained at the time when shows the exposure light is incident obliquely from the X axis direction or the Y axis direction of the light source coordinate. FIG. 37(c) shows the results obtained at the time when the light source is incident obliquely from the 45 degree direction of the light source coordinate. Here, a mask enhancer having an opening width adjusted such that the light-shielding properties are maximized with respect to each exposure light incident direction (hereinafter, referred to as an optimal opening width), a mask enhancer having an opening width smaller than the optimal opening width, and a mask enhancer having an opening width larger than the optimal opening width were used as the mask enhancer. For comparison, the DOF characteristics at the time when the mask enhancer is replaced by a complete light-shielding film having the same outer shape were also calculated with simulations. The DOF characteristics are evaluated based on the change of a pattern size by defocusing when an exposure energy for providing a size of a pattern (resist pattern) formed at the best focus of 0.12 μm is set. In FIGS. 37(a) to (c), L denotes a mask pattern width, S denotes an opening width, and the focus position (horizontal axis) 0 corresponds to the best focus position.

As shown in FIG. 37(a), when the exposure light is incident from the center of the light source coordinate, the DOF characteristics are deteriorated as the opening width of the mask enhancer increases, and the DOF characteristics at the time when a complete light-shielding film is used as the mask pattern (L/S=0.12/0 μM) are best.

On the other hand, as shown in FIG. 37(b), when the exposure light is incident obliquely from the X axis or the Y axis of the light source coordinate, the DOF characteristics do not depend on the opening width of the mask enhancer, and the DOF characteristics are the same, regardless of whether the mask enhancer is used or a complete light-shielding film is used (L/S=0.13/0 μm).

However, as shown in FIG. 37(c), when the exposure light is incident obliquely from the 45 degree directions of the light source coordinate, the DOF characteristics are improved as the opening width of the mask enhancer increases, and the DOF characteristics at the time when a complete light-shielding film is used as the mask pattern (L/S=0.12/0 μm) are worst.

Thus, in order to improve the defocus characteristics of the light intensity distribution generated by interference of the mask pattern diffracted light and the shifter transmitted light in the obliquely incidence exposure from the 45 degree directions, it is preferable to increase the shifter transmitted light as high as possible in the range in which the minimum and necessary effective light-shielding properties can be achieved.

In the above, a method for improving the defocus characteristics by the mask enhancer in the obliquely incidence exposure from the 45 degree directions has been described, and next a method for setting a light source position that can realize the effect of improving the defocus characteristics in reality will be described.

FIG. 38(a) to (c) are diagrams showing a DOF maps corresponding to various light source positions in exposure using a mask pattern constituted by a complete light-shielding film. Mores specifically, a linear mask pattern parallel to the Y axis on the light source coordinate as shown in FIG. 38(a) is assumed as the mask pattern for evaluating the DOF map. As the light source position, that is, the exposure light incident direction, positions of the light sources symmetric with respect to the X axis and the Y axis on the coordinate of the light source and four rotational symmetric as shown in FIG. 38(b) are assumed so that the DOF map corresponding to the linear mask pattern parallel to the X axis on the light source coordinate exhibit the same characteristics as those of the mask pattern shown in FIG. 38(a). In this case, eight light source positions are simultaneously present without fail, except that the light source position is on the X axis, the Y axis or the diagonal line (Y=X or Y=−X). Here, the values on the light source coordinate are all normalized by the numerical aperture NA of a reduced size optical system of the exposure apparatus.

FIG. 38(c) shows the results of mapping the DOF of a mask pattern (width L=0.15 μm, opening width S=0 μm, see FIG. 38(a)) constituted by a complete light-shielding film with respect to the position of each light source when exposure is performed using a circular light source having a radius of 0.05 from the positions of the light sources with coordinates (x, y) shown in FIG. 38(b). Here, the exposure is performed at an exposure intensity that allows the size of the line pattern (resist pattern) formed at the best focus is 0.12 μm, and the DOF is defined with the largest focus width at which the pattern size is within 0.12±0.012 μm with respect to focus variations during the exposure. Furthermore, a ArF light source is used as the exposure light source, and the numerical aperture of the reduced size optical system of the exposure apparatus is 0.6.

As shown in FIG. 38(c), the average of the DOFs corresponding to various light source positions is about 0.3 μm, and the DOF at pattern exposure using a light source position with a distance from the original point (X=0, Y=0) of I is about 0.3 μm. The light source positions in which the DOF is higher than the average are present locally, such as the positions around a coordinate (X=0.5, Y=0.5), and positions obtained by rotating this position by 90 degrees, 180 degrees, and 270 degrees around the original point. Thus, better DOFs can be obtained by using oblique incidence from these four light source positions. However, as seen from FIG. 38(c), in the case of the mask pattern constituted by a complete light-shielding film, even if the DOF is improved by using, for example, the above-described light source positions, the improvement is only about twice the average of the DOF.

FIGS. 39(a) to (d) and FIGS. 40(a) to (d) are diagrams showing the DOF maps corresponding to various light source positions in exposure using a mask pattern constituted by a mask enhancer. More specifically, a mask enhancer having a mask pattern width of L (0.15 μm) and a width of an opening serving as a phase shifter of S (0.04 μm, 0.08 μm, or 0.10 μm) as shown in FIG. 39(a) is assumed as the mask pattern for DOF map evaluation. Here, as described above, the DOF map is four rotational symmetric with respect to the original point on the light source coordinate, so that in the following description, only a portion corresponding to the first quadrant (region with X≧0 and Y≧0) on the light source coordinate on the DOF map is shown.

FIGS. 39(b) to (d) are diagrams showing the results of mapping DOF of a mask pattern constituted by the mask enhancer shown in FIG. 39(a) with respect to the position of each light source. FIG. 39(b) shows the results obtained when the opening width S is 0.04 μm, FIG. 39(c) shows the results obtained when the opening width S is 0.08 μm, and FIG. 39(d) shows the results obtained when the opening width S is 0.10 μm. Here, a ArF light source is used as the exposure light source, and the numerical aperture of the reduced size optical system of the exposure apparatus is 0.6. As shown in FIGS. 39(b) to (d), as the opening width S of the mask enhancer increases, the DOF increases significantly by off-axis exposure when the light source is present in the vicinity of a coordinate (X=0.5, Y=0.5).

FIG. 40(a) is a diagram showing the results of plotting DOF values corresponding to the position of the light source on the X=Y line (diagonal line) in the DOF map shown in each of FIG. 38(c) and FIGS. 39(b) to (d). As shown in FIG. 40(a), in the off-axis exposure from the 45 degree directions, the DOF can be improved drastically as the opening width S of the mask enhancer increases, by performing off-axis exposure from the light source position with a distance from the original point on the light source coordinate of 0.4 or more and 0.85 or less. On the other hand, in the off-axis exposure from the 45 degree directions, when the off-axis exposure from the light source position with a distance from the original point on the light source coordinate of 0.4 or less is performed, the DOF are deteriorated as the opening width S of the mask enhancer increases.

Figure 40:
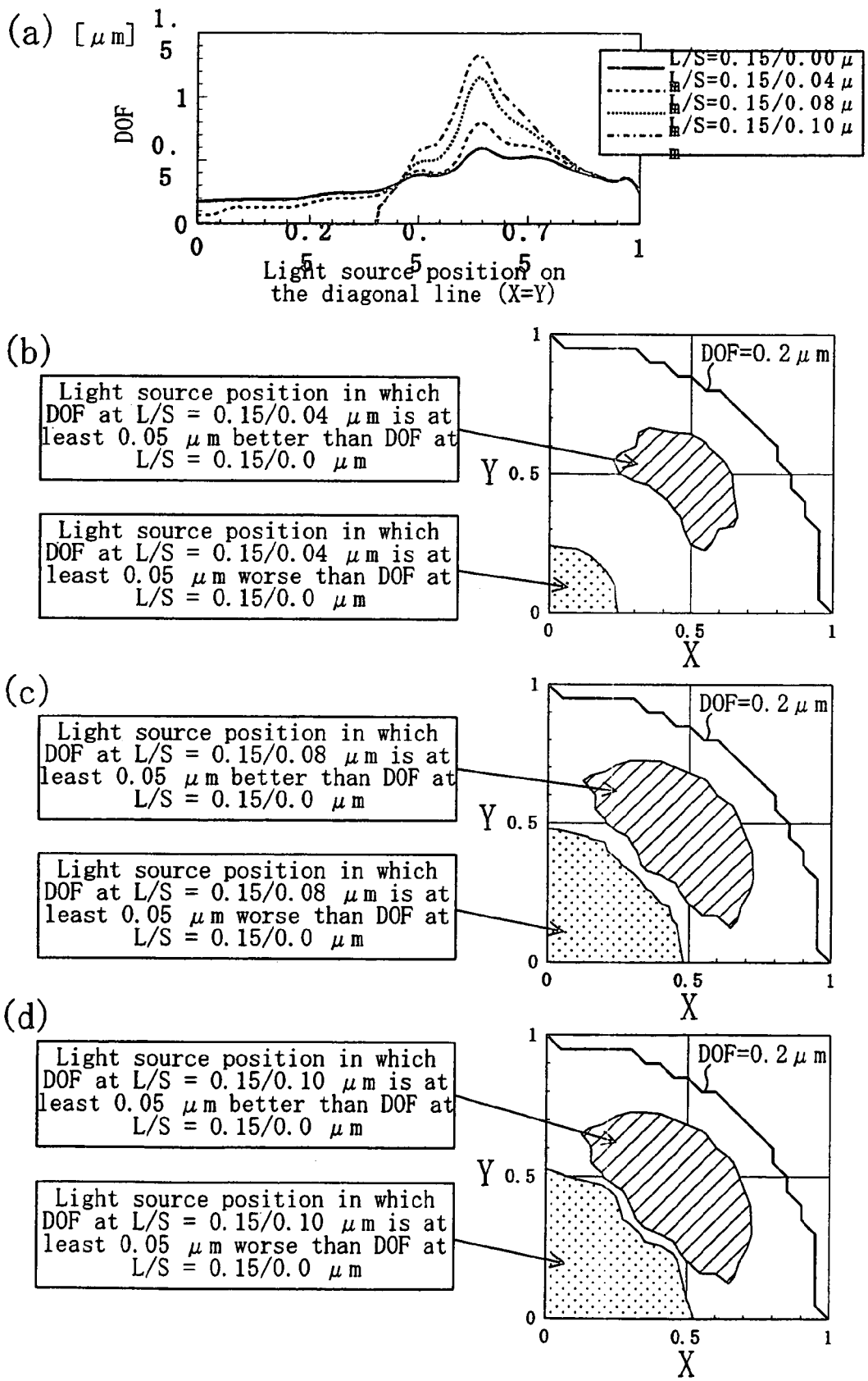
FIG. 40(*a*) is a diagram showing the results of plotting DOF values corresponding to the position of the light source on the diagonal line in the DOF map shown in each of FIG. 38(*c*) and FIGS. 39(*b*) to (*d*), and FIGS. 40(*b*) to (*d*) are diagrams showing the regions in which the DOF is increased or decreased by 0.05 μm or more from the DOF map shown in FIG. 38(*c*) in the DOF map shown in each of FIGS. 39(*b*) to (*d*).

FIGS. 40(*b*) to (*d*) show the regions in which the DOF is increased or decreased by 0.05 μm or more from the DOF map (mask pattern constituted by a complete light-shielding film) shown in FIG. 38(*c*) in the DOF map (mask pattern constituted by a mask enhancer) shown in each of FIGS. 39(*b*) to (*d*). The results shown in FIGS. 40(*b*) to (*d*) indicate that the DOF can be improved reliably by optically setting a reduced size optical system of the exposure apparatus such that exposure can be performed with the light source positions being present in the vicinity of a coordinate (X=0.5, Y=0.5) and a light source in a region with a distance from the original point on the light source coordinate of a predetermined value (about 0.4) or less being removed. In order to confirm whether this is a general tendency or not, the inventor of the present invention obtained the DOF values corresponding to the position of the light source on the diagonal line, as shown in FIG. 40(*a*), based on each DOF map, by obtaining the DOF map of a mask pattern (L/S=0.15/0 μm) constituted by a complete light-shielding film and the DOF map of a mask pattern (L/S=0.15/0.02, 0.04, 0.06 μm) constituted by a mask enhancer, in each of the cases where a KrF light source and a $F_2$ light source are used with a numerical aperture of a reduction projection optical system of an exposure apparatus of 0.6 and where an ArF light source is used with a numerical aperture of a reduction projection optical system of an exposure apparatus of 0.7 and 0.8. FIGS. 41(*a*) to (*d*) show the results thereof FIG. 41(*a*) show the DOF values corresponding to the position of the light source on the diagonal line when the numerical aperture of the reduction projection optical system of the exposure apparatus is 0.6, and a KrF light source is used. FIG. 41(*b*) show the DOF values corresponding to the position of the light source on the diagonal line when the numerical aperture of the reduction projection optical system of the exposure apparatus is 0.6, and a $F_2$ light source is used. FIG. 41(*c*) show the DOF values corresponding to the position of the light source on the diagonal line when the numerical aperture of the reduction projection optical system of the exposure apparatus is 0.7, and a ArF light source is used. FIG. 41(*d*) show the DOF values corresponding to the position of the light source on the diagonal line when the numerical aperture of the reduction projection optical system of the exposure apparatus is 0.8, and a ArF light source is used. The results shown in FIGS. 41(*a*) to (*d*) indicate that the tendency that the DOF is improved by off-axis exposure in which the light source positions are present in the vicinity of a coordinate (X=0.5, Y=0.5) is a general tendency.

In general, it is known that when off-axis exposure (off-axis illumination) is used to form a pattern arranged in a cycle of about λ/NA or less, the DOF characteristics are improved. However, when off-axis exposure is used to form an isolated pattern, the DOF characteristics are substantially not improved and the contrast of the light intensity distribution is deteriorated, and therefore it is supposed to be not preferable to use off-axis exposure to form an isolated pattern. On the other hand, in the third embodiment, also when forming an isolated pattern, the off-axis exposure is an optimal exposure method because of the effect of the DOF improvement and the contrast improvement of the mask enhancer. Therefore, according to the third embodiment, the optimal exposure method for forming an isolated pattern is matched to that for forming a pattern arranged in a small cycle, so that a fine pattern having an arbitrary layout can be formed with high precision.

Fourth Embodiment

Hereinafter, a method for designing a mask pattern according to a fourth embodiment of the present invention, more specifically, a method for designing a mask pattern for producing the photomask of the first or the second embodiment, that is a photomask that improves the contrast of the light intensity distribution and the focus margin for exposure by canceling the mask pattern diffracted light with the shifter transmitted light having a phase opposite thereto will be described with reference of the accompanying drawings.

Figure 42:
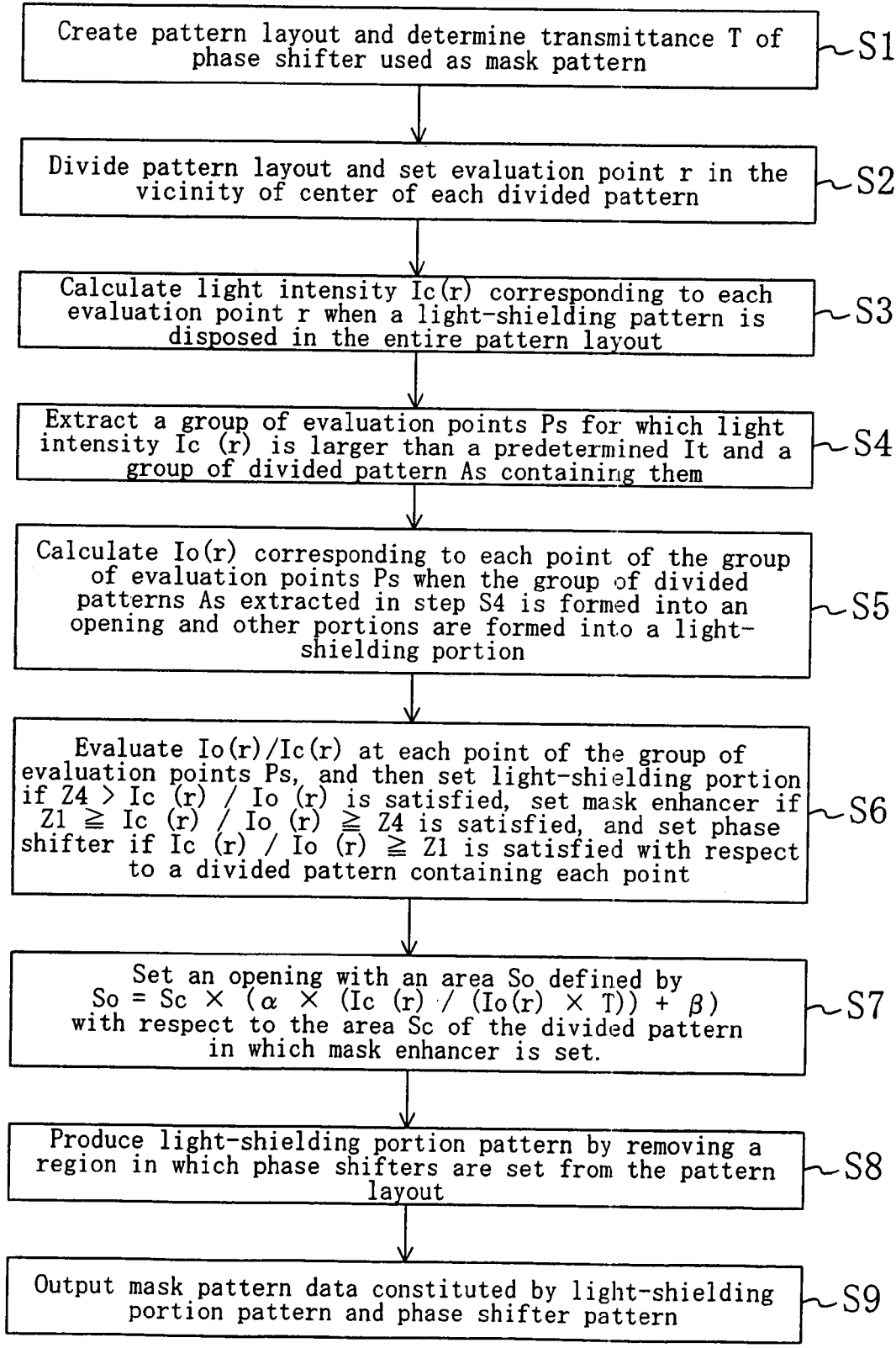
FIG. 42 is a flowchart showing each process of a mask pattern design method according to a fourth embodiment of the present invention.

FIG. 42 is a flowchart showing each process of the mask pattern design method according to the fourth embodiment.

Figure 43:
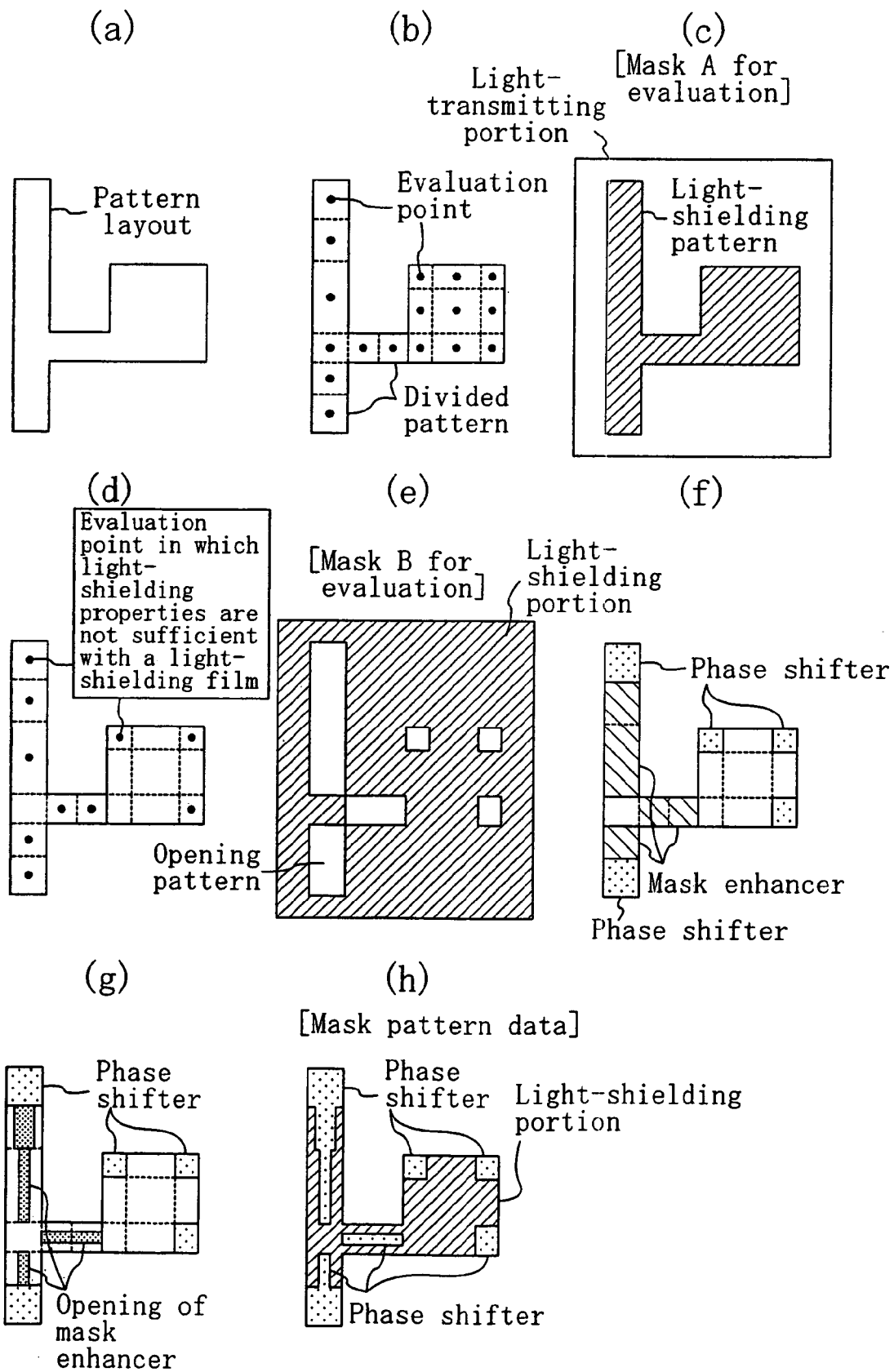
FIGS. 43(*a*) to (*h*) are diagrams explaining the mask pattern design method according to the fourth embodiment of the present invention.

First, in a step S1, a layout (hereinafter, referred to as a "pattern layout") of a mask pattern for forming a desired pattern (resist pattern) is produced, and the transmittance T of a phase shifter arranged in the mask pattern is set. FIG. 43(*a*) shows an example of a pattern layout produced in the step S1.

Next, in a step S2, the pattern layout produced in the step S1 is divided and an evaluation potion r is set in the vicinity of the center of each pattern that has been divided (hereinafter, referred to as a "divided pattern"). FIG. 43(*b*) shows the manner in which the evaluation point r is set in each divided pattern in the step S2.

Next, in a step S3, mask data indicating that a light-shielding pattern constituted by a light-shielding film is arranged in the entire pattern layout are created. This corresponds to a mask for evaluation for calculating the light intensity of the mask pattern diffracted light. FIG. 43(*c*) shows an example of the mask for evaluation corresponding to the mask data produced in the step S3. The light intensity Ic(r) projected and transferred on the position corresponding to each evaluation point r on the exposed material in exposure using this mask for evaluation is calculated by light intensity simulations using optical conditions of the exposure apparatus during actual use, or the like.

Next, in a step S4, a divided pattern containing an evaluation point r for which Ic (r) calculated in the step S3 is larger than a predetermined It, that is, a divided pattern in which the light-shielding properties are not sufficient in the evaluation point r, is extracted. FIG. 43(*d*) shows the divided pattern in which the light-shielding properties are not sufficient in the evaluation point r extracted in the step S4. The divided pattern extracted in the step S4 is a portion in which even if a light-shielding film is provided, sufficient light-shielding properties cannot be obtained because a large amount of light is transmitted through the periphery of the light-shielding film and goes into the back side of the light-shielding film.

Next, in a step S5, mask data indicating that an opening is provided in the divided pattern extracted in the step S4, and a light-shielding portion is provided in other portions in the photomask are created. This corresponds to a mask for evaluation for calculating the maximum of the light intensity of the shifter transmitted light. FIG. 43(*e*) shows an example of the mask for evaluation corresponding to the mask data produced in the step S5. The light intensity Io(r) projected and transferred on the position corresponding to each evaluation point r on the exposed material in exposure using this mask for evaluation is calculated by light intensity simulations using optical conditions of the exposure apparatus during actual use, or the like. Thus, the maximum of the light intensity of the shifter transmitted light in the case where a phase shifter is provided in the divided pattern extracted in the step S4 can be estimated to be T×Io(r), so that it can be determined whether the light intensity (light intensity $Ic(r)$) of the mask pattern diffracted light can be cancelled.

Next, in a step S6, using the value of the light intensity $Io(r)$ and the value of the light intensity $Ic(r)$ in each evaluation point r, the light intensity of each of the shifter transmitted light and the mask pattern diffracted light is evaluated, so that the conditions to improve the light-shielding properties are determined.

As described above, when the mask enhancer is used, a phase shifter corresponding to an arbitrary transmittance from 0 to T can be formed by covering partially the phase shifter having a transmittance T with a light-shielding film. However, when considering actual mask processing, the lower limit for the opening size is imposed, so that it is necessary to set the minimum size for the opening. Therefore, based on this minimum, the smallest transmittance Tmin that can be substantially generated is predetermined. In this case, in each divided pattern, if $Tmin \times Io(r) \geq 4 \times Ic(r)$ is satisfied, the light-shielding properties becomes higher when no opening, that is, no phase shifter is provided (see the first or the second embodiment), so that a light-shielding portion is provided in a divided pattern in which $Ic(r)/Io(r)$ becomes smaller than Z4, where $Z4=Tmin/4$.

On the other hand, the width of the light-shielding film covering the phase shifter decreases as the opening is enlarged, so that there is a limitation regarding the size of the light-shielding portion that can be formed on a photomask. In other words, light transmitted through the phase shifter provided in the light-shielding film has the upper limit, and based on this upper limit, the maximum transmittance Tmax (Tmax<T) that can be substantially generated is predetermined. In this case, in each divided pattern, if $Ic(r) \geq Tmax \times Io(r)$ is satisfied, the light-shielding properties becomes higher when only phase shifter is provided rather than providing the phase shifter partially covered by the light-shielding film (that is, the mask enhancer), so that the phase shifter is provided in the divided pattern in which $Ic(r)/Io(r)$ becomes larger than Z1, where $Z1=Tmax$.

In other words, in each divided pattern, if $Z4 > Ic(r)/Io(r)$ is satisfied, the light-shielding portion is set, and if $Z1 \geq Ic(r)/Io(r) \geq Z4$ is satisfied, the mask enhancer is set. If $Ic(r)/Io(r) \geq Z1$ is satisfied, the phase shifter is set. However, when Tmin and Tmax are not predetermined for simplification, $Z1=T$ and $Z4=T/4$. FIG. 43(f) shows divided patterns extracted in the step S4 in which the light-shielding properties are not sufficient and the phase shifter or the mask enhancer is set in the step S6.

Next, in the step S7, the size of the opening serving as a phase shifter in the mask enhancer set in a divided pattern in the step S6 is determined. In this case, the condition in which the transmittance Te generated effectively by the mask enhancer maximizes the light-shielding effect is represented by $Te=Ic(r)/Io(r)$. Furthermore, as described in the second embodiment, the equivalent transmittance of the opening is represented by an approximate that is proportional to the opening area ratio (see FIG. 26(e)). Therefore, in order to make a phase shifter having a transmittance T substantially equal to a phase shifter having a transmittance Te, the area of the opening is reduced based on the rule represented by $\alpha \times (Te/T) + \beta$, where the coefficient such as $\alpha$ and $\beta$ are determined depending on the optical parameter of the exposure apparatus such as the wavelength of exposure light or the mask pattern size. More specifically, according to the above-described rule, an opening whose opening area ratio is $\alpha \times (Ic(r)/(Io(r) \times T)) + \beta$ is set so that the divided pattern in which the mask enhancer is set effectively becomes the phase shifter having a transmittance Te. In this case, if the area of the divided pattern is Sc, and the area of the opening is So, $$So = Sc \times (\alpha \times (Ic(r)/(Io(r) \times T)) + \beta$$

is satisfied. There is no particular limitation regarding the shape of the opening, as long as the opening area ratio is a predetermined value. However, simply, a shape obtained simply by reducing the pattern layout shape in accordance with the opening area ratio may be used. FIG. 43(g) shows that the opening having a shape obtained by reducing the pattern layout shape in the step S7 is set in the mask enhancer set in the divided pattern in the step S6.

Next, in a step S8, a pattern obtained by removing the phase shifters (including the opening of the mask enhancer) that have been set up to the step S7 from the pattern layout is produced as a light-shielding portion pattern.

Finally, in a step S9, mask pattern data constituted by the light-shielding portion pattern and the phase shifter pattern are created. FIG. 43(h) shows an example of the mask pattern data created in the step S9. Thereafter, the mask pattern data are output and thus the mask pattern design is ended. Thus, it is possible to create mask pattern data to realize the mask structure that can improve the light-shielding effect by utilizing the shifter transmitted light having a phase opposite to that of the mask pattern diffracted light in a region where the light-shielding effect cannot be sufficiently obtained when a light-shielding pattern is provided entirely in a desired pattern layout.

As described above, according to the fourth embodiment, the transmittance of the phase shifter and the opening size of the mask enhancer that can maximize the light-shielding properties can be obtained based on the ratio in the light intensity between the mask pattern diffracted light and the shifter transmitted light, each of which is calculated independently. Therefore, the transmittance of the phase shifter and the opening size of the mask enhancer that can maximize the light-shielding properties can be obtained easily with respect to an arbitrary layout of the mask pattern.

Figure 44:
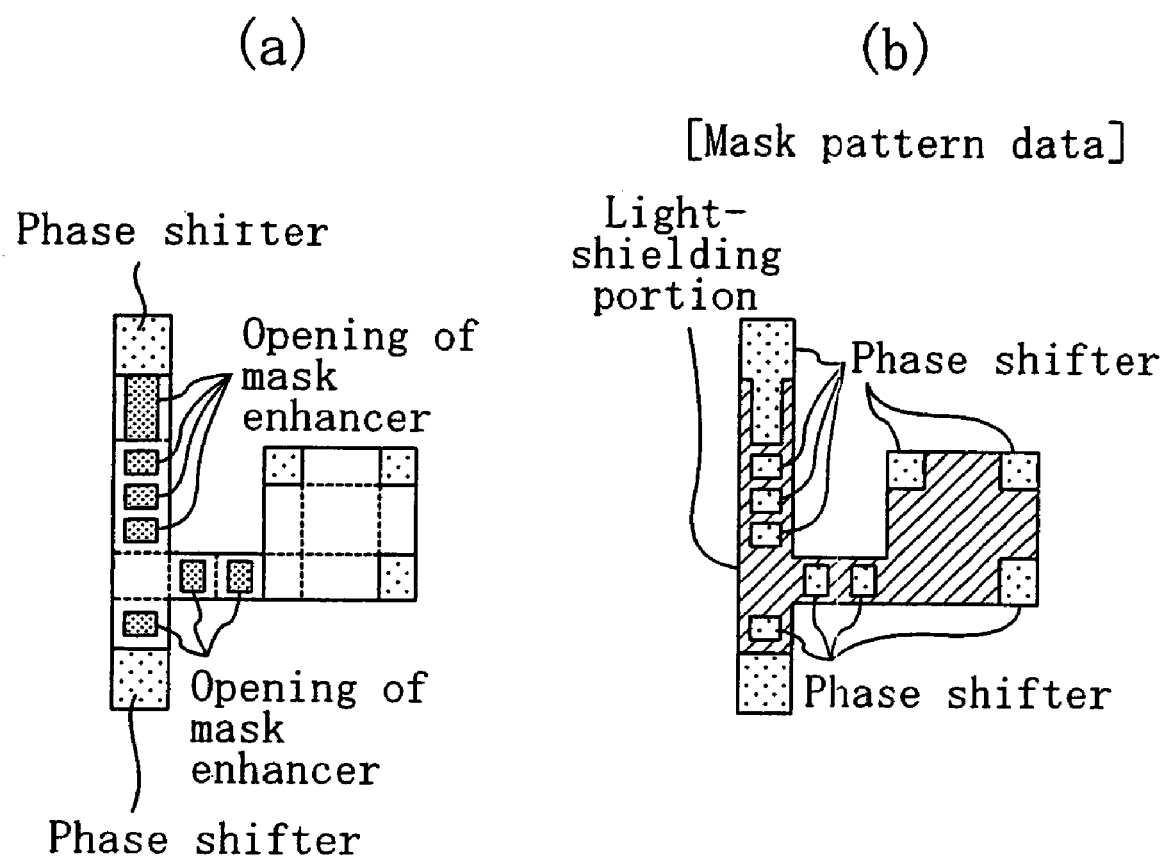
FIGS. 44(*a*) and (*b*) are diagrams explaining the mask pattern design method according to the fourth embodiment of the present invention.

In the fourth embodiment, a shape obtained simply by reducing the pattern layout shape in accordance with the opening area ratio is used as the shape of the opening set in the mask enhancer in the step S7, but the shape of the opening can be any shape, as long as it has a predetermined opening area ratio, and is accommodated within the pattern layout. In other words, the opening shape can be changed, as long as the opening area ratio or the area of the openings provided in a predetermined range is not changed. However, in general, a shape that does not cause any problem in actual mask processing is preferable. For example, an opening shape that forms a narrow light-shielding potion pattern, which causes peeling of the light-shielding film from the substrate, is not preferable. FIG. 44(a) shows the results of changing the shape of the opening shown in FIG. 43(g) in such a manner that a chromium film serving as the light-shielding film on the mask is hardly peeled, that is, a narrow light-shielding portion pattern is not produced. FIG. 44(b) shows mask pattern data corresponding to FIG. 44(a).

Furthermore, in the fourth embodiment, the light-shielding film or the light-shielding portion provided in the mask pattern layout (including divided patterns) may have a transmittance of 15% or less with respect to exposure light and generate a phase difference of $(-30+360 \times n)$ degrees or more and $(30+360 \times n)$ degrees or less, where n=an integer,

FIRST VARIATION EXAMPLE OF THE FOURTH EMBODIMENT

Hereinafter, a method for designing a mask pattern according to a first variation example of the fourth embodiment of the present invention, more specifically, a method for designing a mask pattern for producing the photomask of the first or the second embodiment will be described with reference of the accompanying drawings.

Figure 45:
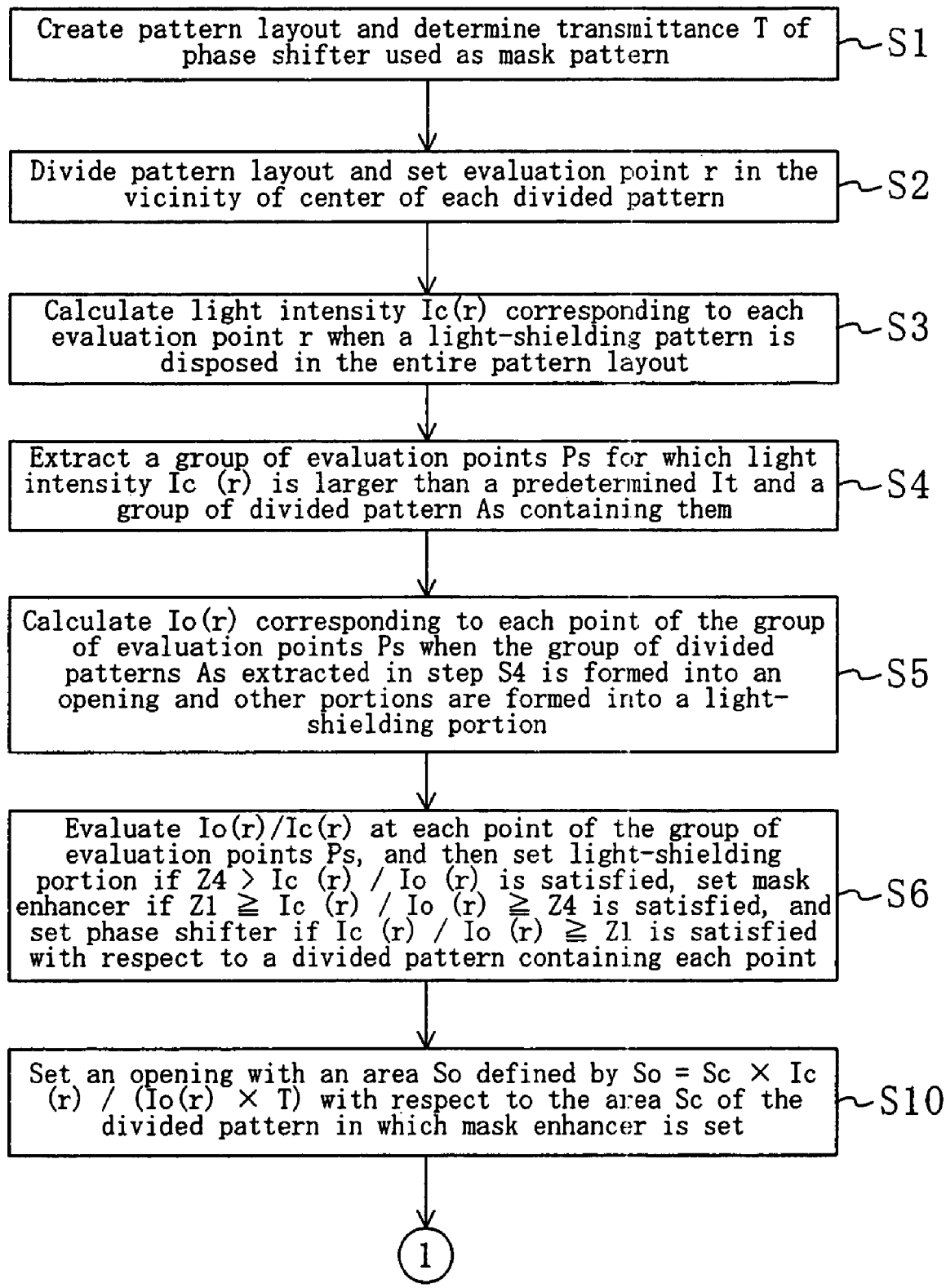
FIG. 45 is a flowchart showing each process of a mask pattern design method according to a first variation example of the fourth embodiment of the present invention.
Figure 46:
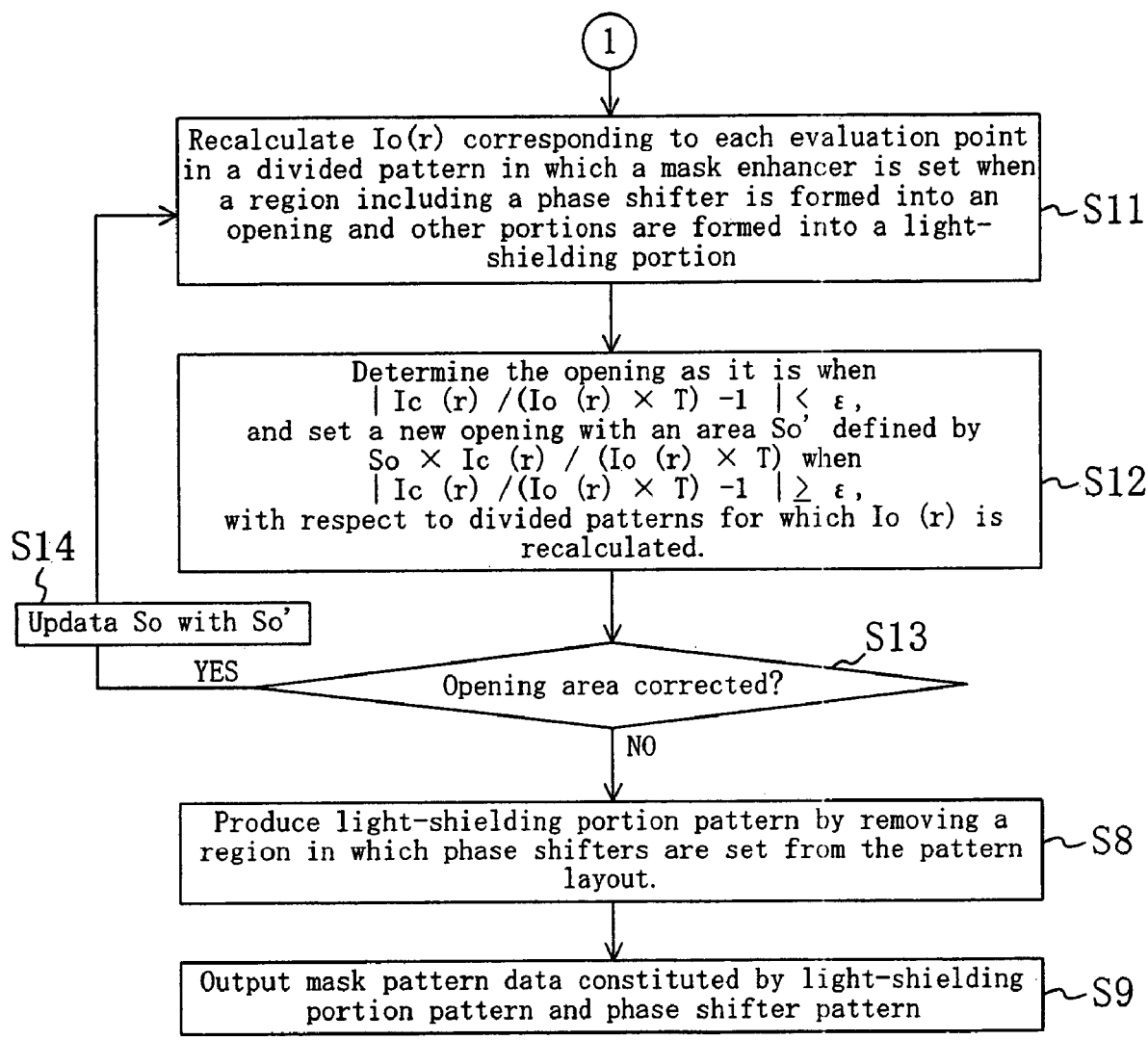
FIG. 46 is a flowchart showing each process of a mask pattern design method according to the first variation example of the fourth embodiment of the present invention.

FIGS. 45 and 46 are flowcharts showing each process of the mask pattern design method according to the first variation example of the fourth embodiment.

The first variation example of the fourth embodiment: is different from the fourth embodiment in a method for calculating the opening area of the mask enhancer. More specifically, in the fourth embodiment, the opening area of the mask enhancer is obtained by approximate calculations using only the opening area ratio, whereas in the first variation example of the fourth embodiment, the opening area of the mask enhancer is calculated more accurately.

As shown in FIGS. 45 and 46, the processing of the steps S1 to S6 and the processing of the steps S8 and S9 in the first variation example of the fourth embodiment are totally the same as the processing of the steps S1 to S6 and the processing of the steps S8 and S9 in the fourth embodiment shown in FIG. 42. That is, in the first variation example of the fourth embodiment, the processing of the step S7 in the fourth embodiment is replaced by the processing of the steps S10 to S14, more specifically, the procedure of checking whether or not the opening of the mask enhancer can realize sufficient light-shielding effect and correcting the opening area based on the results. Thus, it is possible to create the mask pattern data that can realize sufficient light-shielding properties with the mask enhancer.

Hereinafter, the processing from the steps S10 to S14 will be described with reference to FIGS. 45 and 46.

In the step S10, the opening area ratio is set using only the ratio between the transmittance T of the phase shifter and the optimal transmittance Te($=Ic(r)/Io(r)$) that realize the maximum light-shielding effect in the mask enhancer, and the size of the opening of the mask enhancer is determined based on the opening area ratio. More specifically, if the area of the divided pattern is Sc, and the area of the opening is So, $$So = Sc \times Ic(r)/(Io(r) \times T)$$

is satisfied. Hereinafter, description below is based on the assumption that FIG. 43(*a*) shows the opening set at the step S10.

Figure 47:
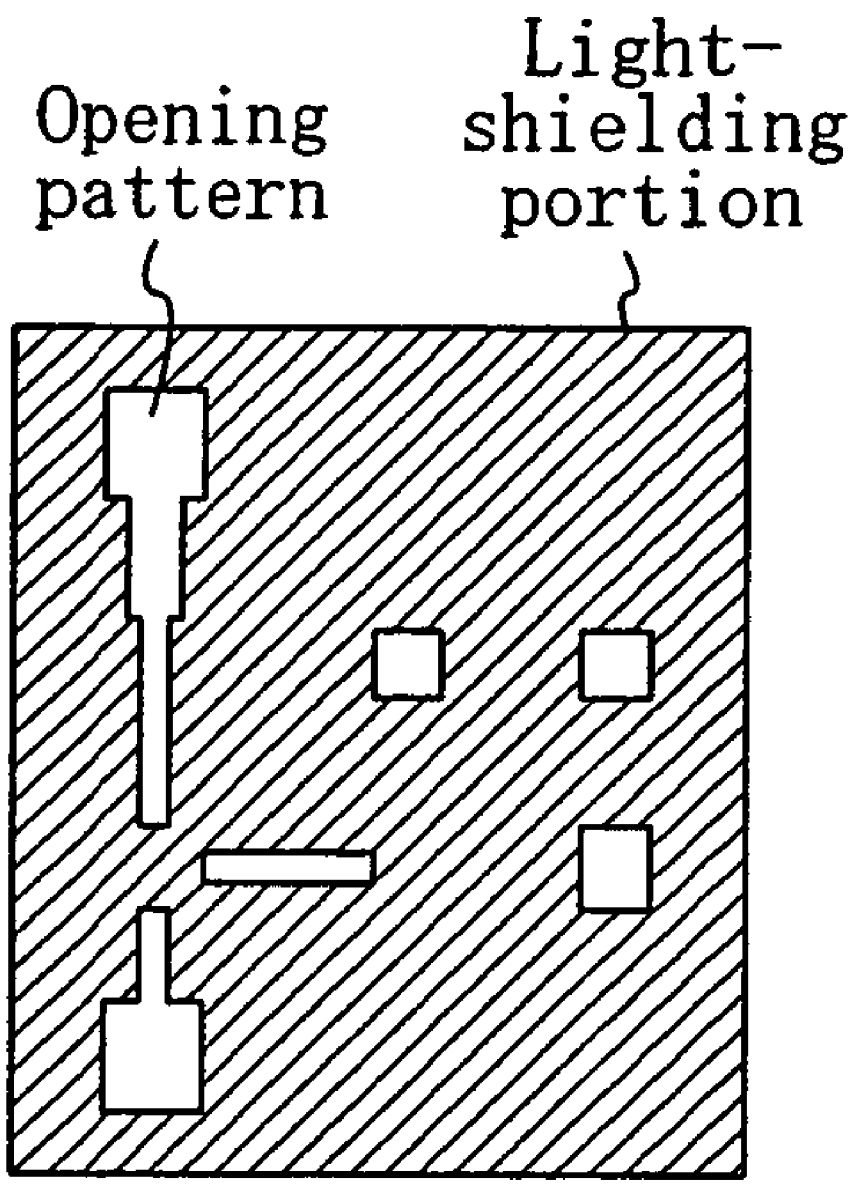
FIG. 47 is a diagram explaining of the mask pattern design method according to the first variation example of the fourth embodiment of the present invention.

Next, in the step S1, mask data indicating that the opening is disposed in portions in which the phase shifters (including the opening in the mask hanker) have been set up to the step S10, and a light-shielding portion is disposed in other portions in the photomask is created. This corresponds to a mask for evaluation for calculating the light intensity of the shifter transmitted light accurately. FIG. 47 shows an example of a mask for evaluation corresponding to the mask data created at the step S11. In exposure using this mask for evaluation, the light intensity Io(r) projected and transferred on the position corresponding to each evaluation point r on an exposed material is recalculated, for example with simulations of light intensity using the optical conditions of the exposure apparatus for actual use. Thus, the light intensity of the shifter transmitted light can be estimated accurately with T×Io(r), so that it can be determined accurately whether the light intensity (light intensity Ic(r)) of the mask pattern diffracted light can be cancelled sufficiently.

Next, in the step S12, it is checked whether or not the recalculated Io(r) in the step S11 is an appropriate intensity so as to realize the maximum light-shielding effect. Here, in a portion in which the size of the opening of the mask enhancer realizes an appropriate intensity so as to realize the maximum light-shielding effect, that size is determined for the opening of the mask enhancer. On the other hand, in a portion in which the above is not the case, the opening area ratio is set using only the ratio between the transmittance T of the phase shifter and the optimal transmittance Te($=Ic(r)/Io(r)$) that realize the maximum light-shielding effect in the mask enhancer at this point, and the size of the opening of the mask enhancer is determined based on the opening area ratio. More specifically, if the area of the opening obtained in the step S110 is So, the area So' that is defined by:

$$So \times Ic(r)/(Io(r) \times T)$$

is obtained as a new area of the opening. Here, it can be determined whether or not the size of the opening of the mask enhancer has realized the maximum light-shielding effect, by determining whether or not the mask pattern diffracted light is sufficiently cancelled by the shifter transmitted light, that is, whether or not T×Io(r)≈Ic(r) is satisfied. Therefore, according to So'=So×Ic(r)/(Io(r)×T), when the shifter transmitted light is excessive, a correction of making the opening small is added, and when the shifter transmitted light is too little, a correction of enlarging the opening is added.

Next, in the step S113, it is determined whether or not the opening area is corrected in the step S12, and when the opening area is corrected, in a step S14, the opening area So is updated by the opening are So', and then the procedure goes back to the step S11. In other words, based on the content of the correction of the opening area, mask data corresponding to a mask for evaluation for calculating the light intensity of the shifter transmitted light accurately is created again and the process of recalculating the light intensity Io(r) is repeated until the Ic(r) is cancelled sufficiently by Io(r). On the other hand, when the opening area is not updated, the procedure goes to a step S8 and the following steps.

According to the first variation example of the fourth embodiment, in addition to the effect of the fourth embodiment, the following effect can be obtained. Since it is checked whether or not the opening of the mask enhancer can realize sufficient light-shielding effect and the opening area is corrected based the results thereof, mask pattern data that can realize sufficient light-shielding properties by the mask enhancer can be created reliably.

Furthermore, in the first variation example of the fourth embodiment, the light-shielding film or the light-shielding portion provided in the mask pattern layout (including divided patterns) may have a transmittance of 15% or less with respect to exposure light and generate a phase difference of (−30+360×n) degrees or more and (30+360×n) degrees or less, where n=an integer, with respect to exposure light between the light-shielding film or the light-shielding portion and the light-transmitting portion.

SECOND VARIATION EXAMPLE OF THE FOURTH EMBODIMENT

Hereinafter, a method for designing a mask pattern according to a second variation example of the fourth embodiment of the present invention, more specifically, a method for designing a mask pattern for producing the photomask of the first or the second embodiment will be described with reference of the accompanying drawings.

Figure 48:
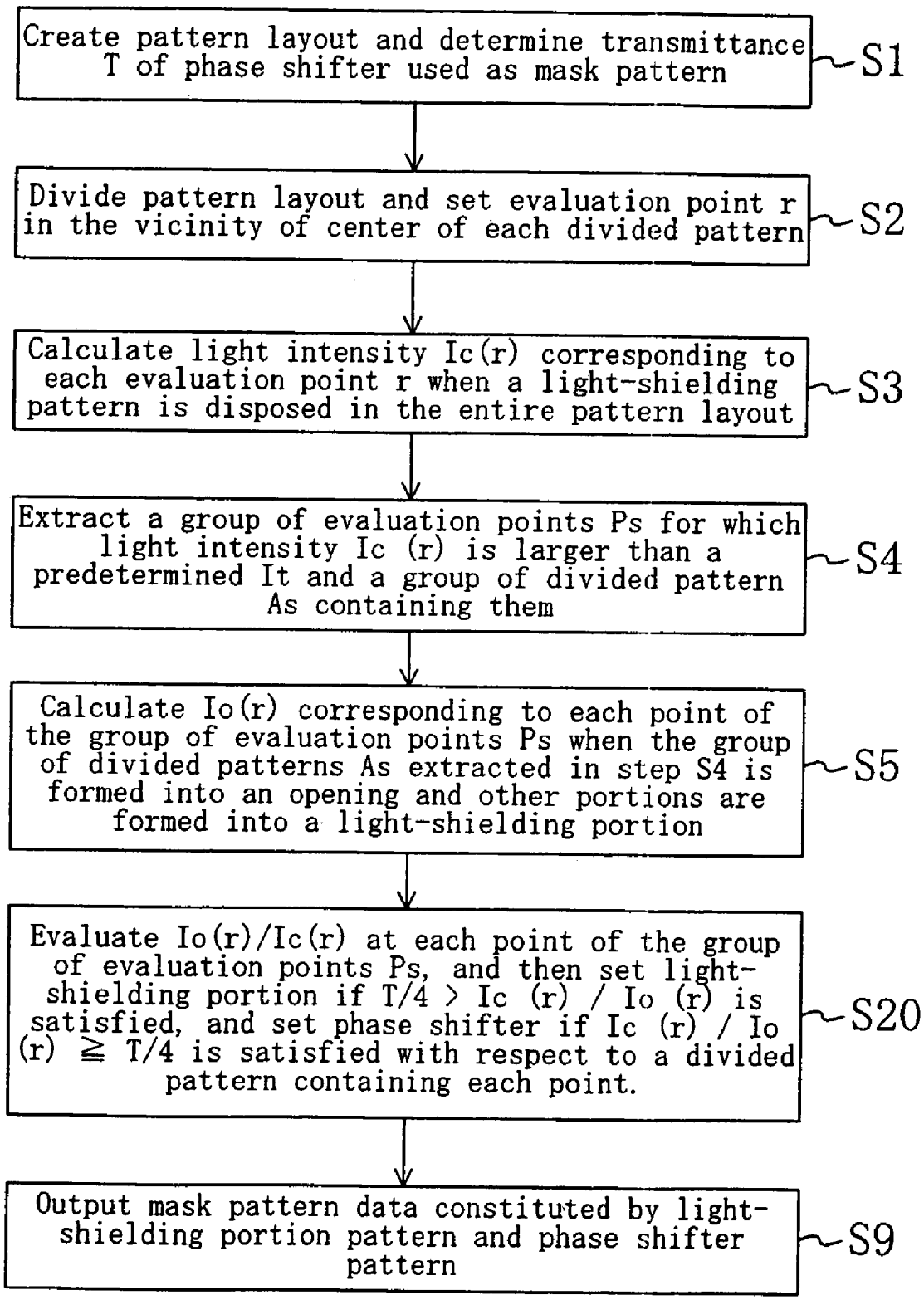
FIG. 48 is a flowchart showing each process of a mask pattern design method according to a second variation example of the fourth embodiment of the present invention.

FIG. 48 is a flowchart showing each process of the mask pattern design method according to the second variation example of the fourth embodiment.

The second variation example of the fourth embodiment is different from the fourth embodiment in the following aspects. In the fourth embodiment, the phase shifter, the mask enhancer and the light-shielding portion are used as the mask pattern, whereas in the second variation example of the fourth embodiment, only the phase shifter and the light-shielding portion are used as the mask pattern without using the mask enhancer.

As shown in FIG. 48, the processing of the steps S1 to S5 and the processing of the step S9 in the second variation example of the fourth embodiment are totally the same as the processing of the steps S1 to S5 and the processing of the step S9 in the fourth embodiment shown in FIG. 42. That is, in the second variation example of the fourth embodiment, the processing of the steps S6 to S8 in the fourth embodiment is replaced by the processing of the step S20. More specifically, in the step S6 in the fourth embodiment, the range of the transmittance Te generated effectively by the mask enhancer is set from Tmin to Tmax that is represented by $0<Tmin \geqq Tmax<T$, whereas in the second variation example of the fourth embodiment, a situation satisfying Tmin=Tmax=T is assumed.

Figure 49:
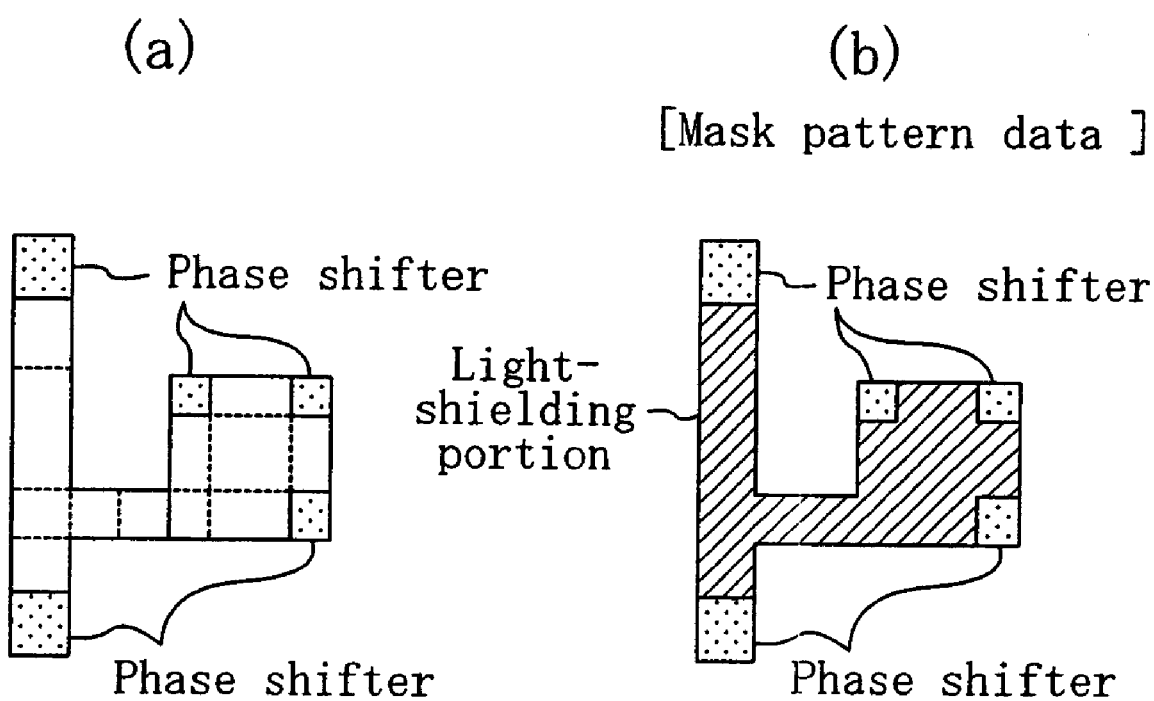
FIGS. 49(*a*) and (*b*) are diagrams explaining of the mask pattern design method according to the second variation example of the fourth embodiment of the present invention.

In the step S20, each of the light intensity of shifter transmitted light and the mask pattern diffracted light is evaluated using the value of the light intensity Io(r) and the value of the light intensity Ic(r) at each evaluation point r, so that a condition for improving the light-shielding properties is determined. In this case, in each divided pattern, if $T/4>Ic(r)/Io(r)$ is satisfied, the light-shielding portion is set, and if $Ic(r)/Io(r) \geqq T/4$ is satisfied, the phase shifter is set. Thus, the light-shielding properties of each divided pattern can be improved, based on a simple determination which case can provide higher light-shielding properties for each divided pattern, when the phase shifter is used or when the light-shielding portion is used. FIG. 49(*a*) shows the phase shifter set in the step S20 with respect to a divided pattern extracted in the step S4 in which the light-shielding properties are not sufficient.

In the second variation example of the fourth embodiment, the step of providing the opening of the mask enhancer (processing of the step S7 in the fourth embodiment) and the step of producing a light-shielding portion pattern by removing the phase shifter including the opening of the mask enhancer from the pattern layout (processing of the step S8 in the fourth embodiment) are not necessary.

FIG. 49(*b*) shows an example of mask pattern data created in the second variation example of the fourth embodiment.

According to the second variation example of the fourth embodiment, in addition to the advantages of the fourth embodiment, the following advantages can be obtained. Only the phase shifter and the light-shielding portion are used without using the mask enhancer as the mask pattern, mask pattern data that can realize sufficient light-shielding properties can be created in a simple manner.

Furthermore, in the second variation example of the fourth embodiment, the light-shielding film or the light-shielding portion provided in the mask pattern layout (including divided patterns) may have a transmittance of 15% or less with respect to exposure light and generate a phase difference of $(-30+360\times n)$ degrees or more and $(30+360\times n)$ degrees or less, where n=an integer, with respect to exposure light between the light-shielding film or the light-shielding portion and the light-transmitting portion.

THIRD VARIATION EXAMPLE OF THE FOURTH EMBODIMENT

Hereinafter, a method for designing a mask pattern according to a third variation example of the fourth embodiment of the present invention, more specifically, a method for designing a mask pattern for producing the photomask of the first or the second embodiment will be described with reference of the accompanying drawings.

Figure 50:
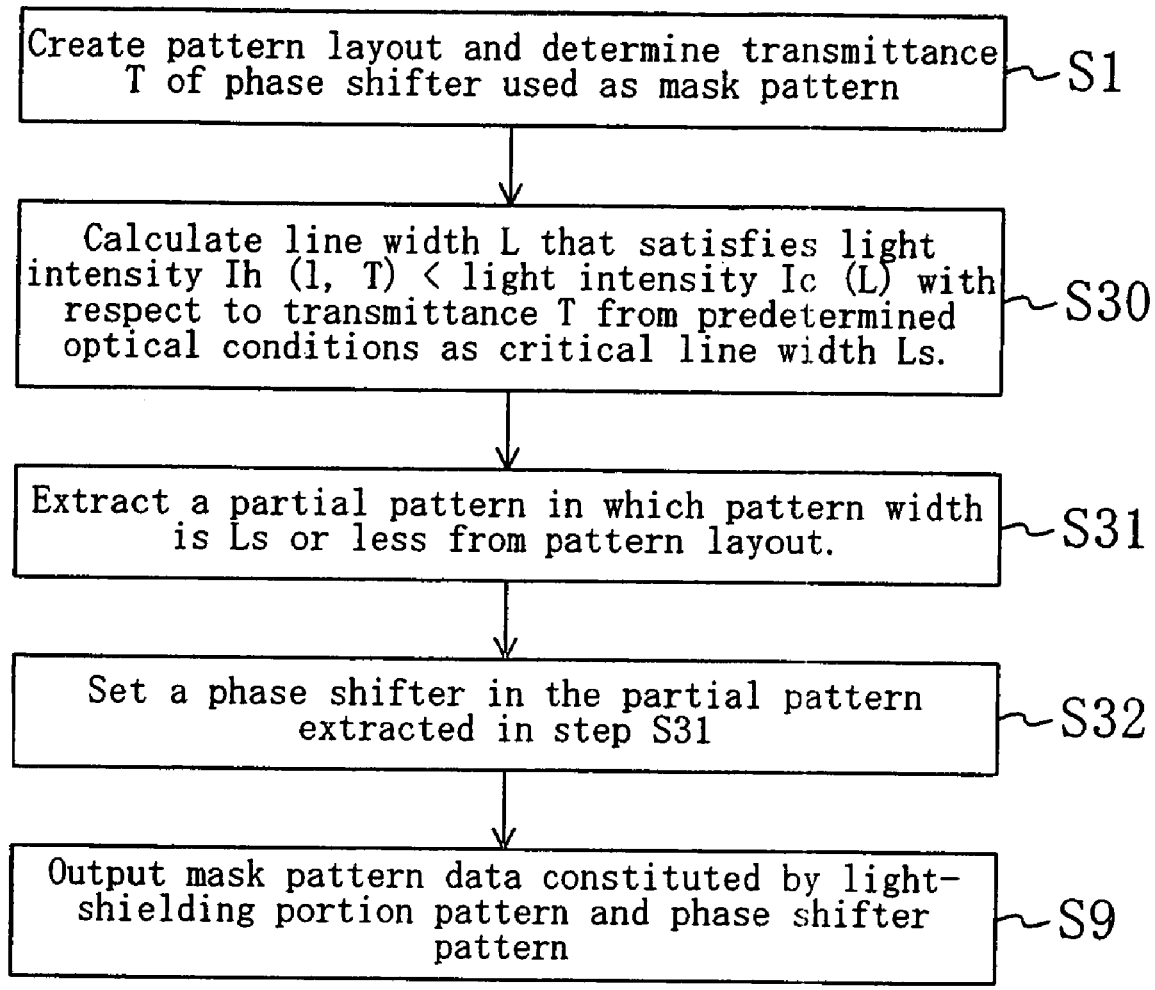
FIG. 50 is a flowchart showing each process of a mask pattern design method according to a third variation example of the fourth embodiment of the present invention.

FIG. 50 is a flowchart showing each process of a mask pattern design method according to a third variation example of the fourth embodiment.

The third variation example of the fourth embodiment is different from the fourth embodiment in the following aspects. In the fourth embodiment, the mask pattern is designed so as to improve the light-shielding properties based on the results of optical simulations using mask data. On the other hand, in the third variation example of the fourth embodiment, although the determination of a condition under which a phase shifter having a transmittance T can realize light-shielding properties higher than those of a light-shielding film is not perfect, a mask pattern that can improve the light-shielding properties is designed, based on the pattern layout width.

More specifically, first, in a step S1, as in the fourth embodiment, a pattern layout of a mask pattern for forming a desired pattern (resist pattern) is created and the transmittance T of a phase shifter provided in the mask pattern is determined.

Next, in a step S30, the light intensity Ih(T,L) projected and transferred on the position corresponding to the center of the mask pattern on an exposed material in exposure using a mask pattern constituted by a phase shifter having a transmittance T and a width L is calculated with, for example, optical simulations using an optical condition of the exposure for actual use. Furthermore, the light intensity Ic(L) projected and transferred on the position corresponding to the center of the mask pattern on an exposed material in exposure using a mask pattern constituted by a light-shielding film having a width L is calculated in the same manner. The minimum width L at which the light intensity Ih(T,L) is smaller than the light intensity Ic(L), in other words, the maximum width L at which the light-shielding effect of the phase shifter is higher than that of the light-shielding film, is obtained as the critical width Ls.

Next, in a step S31, a partial pattern whose width is the critical width Ls or less is extracted from the pattern layout.

Next, in a step S32, a phase shifter is provided in the partial pattern extracted in the step S31 and a light-shielding portion is provided in other portions than that.

Finally, in a step S9, as in the fourth embodiment, mask pattern data constituted by the light-shielding portion pattern and the phase shifter pattern are created. Thereafter, the mask pattern data are output and thus the mask pattern design is ended.

According to the third variation example of the fourth embodiment, the mask pattern design that can improve the light-shielding properties is performed, based on the pattern layout width, without using optical simulations using the mask data, so that the mask pattern design can be simple.

In the third variation example of the fourth embodiment, the light-shielding film or the light-shielding portion provided in the mask pattern layout (including divided patterns)

may have a transmittance of 15% or less with respect to exposure light and generate a phase difference of (−30+360×n) degrees or more and (30+360×n) degrees or less, where n=an integer, with respect to exposure light between the light-shielding film or the light-shielding portion and the light-transmitting portion.

FOURTH VARIATION EXAMPLE OF THE FOURTH EMBODIMENT

Hereinafter, a method for designing a mask pattern according to a fourth variation example of the fourth embodiment of the present invention, more specifically, a method for designing a mask pattern for producing the photomask of the first or the second embodiment will be described with reference of the accompanying drawings.

Figure 51:
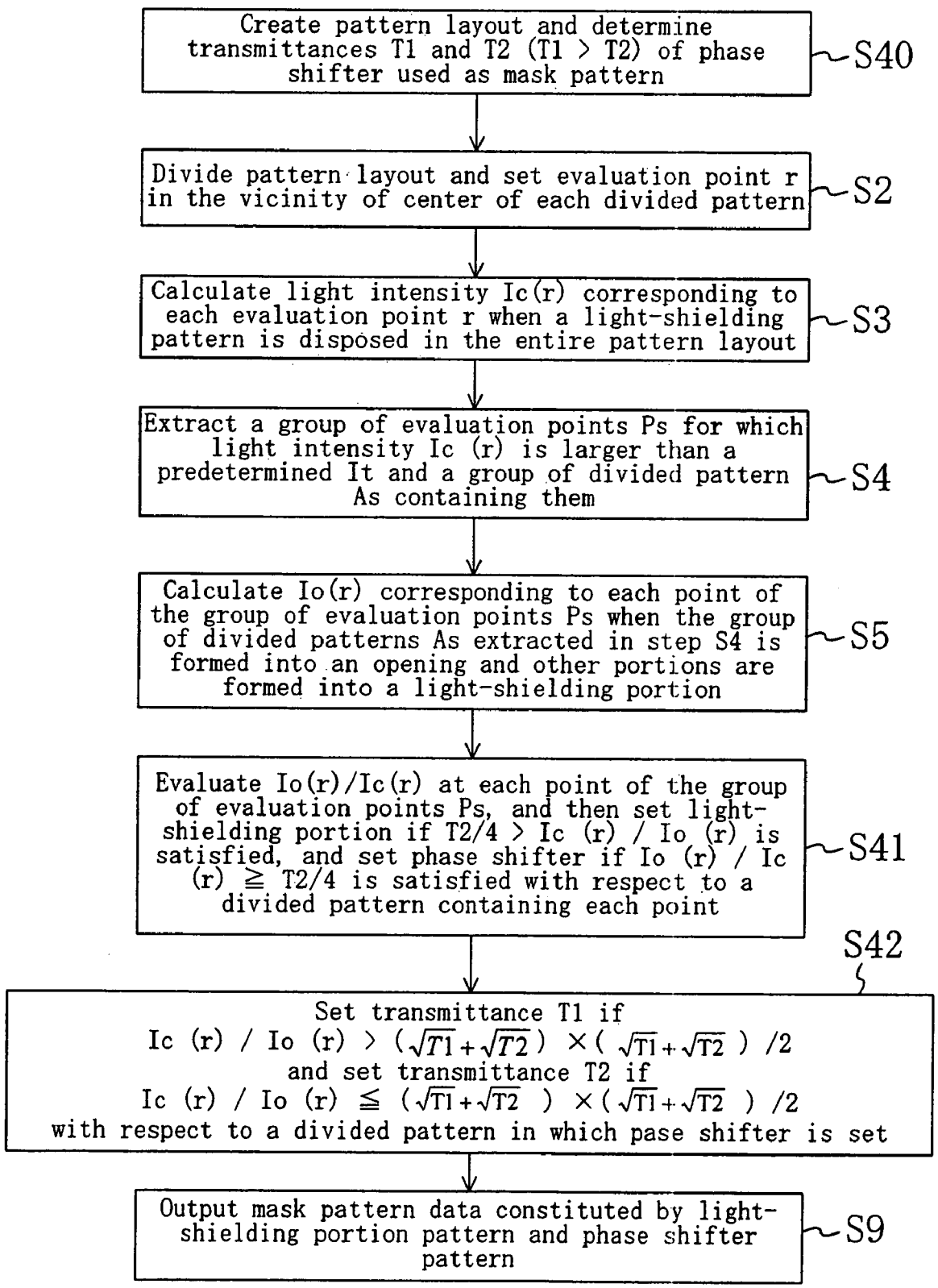
FIG. 51 is a flowchart showing each process of a mask pattern design method according to a fourth variation example of the fourth embodiment of the present invention.

FIG. 51 is a flowchart showing each process of a mask pattern design method according to a fourth variation example of the fourth embodiment.

The fourth variation example of the fourth embodiment is different from the fourth embodiment in the following aspects. In the fourth embodiment, one kind of transmittance T is used as the transmittance of the phase shifter, but in the fourth variation example of the fourth embodiment, two kinds of transmittances T1 and T2 (where T1>T2) are used as the transmittance of the phase shifter. Furthermore, in the fourth embodiment, the phase shifter, the mask enhancer and the light-shielding portion are used as the mask pattern, whereas in the fourth variation example of the fourth embodiment, only the phase shifter and the light-shielding portion are used as the mask pattern without using the mask enhancer, as in the second variation example of the fourth embodiment.

As shown in FIG. 51, the processing of the steps S2 to S5 and the processing of the step S9 in the fourth variation example of the fourth embodiment are totally the same as the processing of the steps S2 to S5 and the processing of the step S9 in the fourth embodiment shown in FIG. 42. That is, in the fourth variation example of the fourth embodiment, the processing of the step S1 in the fourth embodiment is replaced by the processing of the step S40, and the processing of the steps S6 to S8 in the fourth embodiment is replaced by the processing of the steps S41 and S42.

In other words, in a step S40, a pattern layout of a mask pattern for forming a desired pattern (resist pattern) is created and the two transmittances T1 and T2 (where T1>T2) of the phase shifter provided in the mask pattern are determined.

Furthermore, each processing of the steps S2 to S5 is performed, and then in a step S41, each of the light intensity of shifter transmitted light and the mask pattern diffracted light is evaluated using the value of the light intensity Io(r) and the value of the light intensity Ic(r) at each evaluation point r, so that a condition for improving the light-shielding properties is determined. In this case, in each divided pattern, if $T2/4 > Ic(r)/Io(r)$ is satisfied, the light-shielding portion is set, and if $Ic(r)/Io(r) \geq T2/4$ is satisfied, the phase shifter is set. In other words, a portion in which the light-shielding properties can be improved to be better than those of the light-shielding film by using a phase shifter having the lowest transmittance of the usable phase shifters is first extracted based on that phase shifter. This is because a portion in which the light-shielding properties can be improved to be better than those of the light-shielding film by using phase shifter having a high transmittance is limited to a portion inside the portion in which the light-shielding properties can be improved better than those of the light-shielding film by using phase shifter having a transmittance lower than that. The processing of the step S41 is the same as the processing the step 20 in the second variation example of the fourth embodiment shown in FIG. 48, except that the single transmittance T is replaced by the minimum value (T2) of the transmittances that can be used.

Next, in a step S42, in each divided pattern in which phase shifters are set, it is determined which phase shifter has an appropriate transmittance for use. In this case, as described in the first embodiment, in a mask pattern portion in which
$Ic/Io > (T1^{0.5} + T2^{0.5}) \times (T1^{0.5} + T2^{0.5})/2$ is satisfied, the phase shifter having a transmittance T1 can be selected, and in a mask pattern portion in which
$Ic/Io \leq (T1^{0.5} + T2^{0.5}) \times (T1^{0.5} + T2^{0.5})/2$ is satisfied, the phase shifter having a transmittance T2 can be selected. FIG. 52(a) shows the phase shifters having two kinds of transmittances T1 and T2 set in the steps S41 and S42 with respect to a divided pattern extracted in the step S4 in which the light-shielding properties are not sufficient.

In the fourth variation example of the fourth embodiment, the step of providing the opening of the mask enhancer (processing of the step S7 in the fourth embodiment) and the step of producing a light-shielding portion pattern by removing the phase shifter including the opening of the mask enhancer from the pattern layout (processing of the step S8 in the fourth embodiment) are not necessary.

FIG. 52(b) shows an example of mask pattern data created in the fourth variation example of the fourth embodiment.

According to the fourth variation example of the fourth embodiment, in addition to the advantages of the fourth embodiment, the following advantages can be obtained. Only the phase shifter and the light-shielding portion are used without using the mask enhancer as the mask pattern, mask pattern data that can realize sufficient light-shielding properties can be created in a simple manner. Furthermore, in a situation where phase shifters having a plurality of transmittances can be used, the phase shifters having different transmittances can be set so that higher light-shielding properties can be realized, so that phase shifters having different transmittances can be disposed at appropriated positions.

Furthermore, in the fourth variation example of the fourth embodiment, three or more kinds of transmittances for the phase shifters can be used.

Furthermore, in the fourth variation example of the fourth embodiment, the light-shielding film or the light-shielding portion provided in the mask pattern layout (including divided patterns) may have a transmittance of 15% or less with respect to exposure light and generate a phase difference of (−30+360×n) degrees or more and (30+360×n) degrees or less, where n=an integer, with respect to exposure light between the light-shielding film or the light-shielding portion and the light-transmitting portion.

The invention claimed is:

1. A method for forming a pattern using a photomask comprising a mask pattern having light-shielding properties with respect to exposure light provided on a transparent substrate having light-transmitting properties with respect to the exposure light, comprising the steps of:
    a) forming a resist film on a substrate,
    b) irradiating the resist film with the exposure light through the photomask, and
    c) forming a resist pattern by developing the resist film irradiated with the exposure light,
    wherein the mask pattern includes a phase shifter that generates a phase difference of (150+360×n) degrees or more and (210+360×n) degrees or less, where n=an integer, with respect to the exposure light between the phase shifter and a light-transmitting portion in which the mask pattern is not formed on the transparent substrate, and a first light intensity generated in a center of a light-shielded image formation region corresponding to the mask pattern on an exposed material by the exposure light transmitted through the phase shifter is not more than four times a second light intensity generated in the center of the light-shielded image formation region by the exposure light that is transmitted through a periphery of the mask pattern on the transparent substrate and goes into a back side of the mask pattern.

2. The method for forming a pattern according to claim 1, wherein the phase shifter in the photomask is obtained by forming a transparent film having a transmittance different from that of the transparent substrate with respect to the exposure light on the transparent substrate.

3. The method for forming a pattern according to claim 1, wherein the phase shifter in the photomask is obtained by etching the transparent substrate.

4. The method for forming a pattern according to claim 1, wherein the mask pattern in the photomask has a light-shielding film having a same outer shape, and the phase shifter is disposed in an opening provided in the light-shielding film.

5. The method for forming a pattern according to claim 4, wherein the light-shielding film having the same outer shape in the photomask has a transmittance of 15% or less with respect to the exposure light and generates a phase difference of $(-30+360 \times n)$ degrees or more and $(30+360 \times n)$ degrees or less, where n=an integer, with respect to the exposure light between the light-shielding film and the light-transmitting portion.

6. The method for forming a pattern according to claim 1, wherein the resist film is a positive resist film, in the step c), the resist pattern is formed as a result of the development which removes portions other than the portion corresponding to the mask pattern in the resist film, and when a width of the portion corresponding to the mask pattern in the resist film is L, $L \leq 0.4 \times \lambda/NA$ is satisfied, where $\lambda$ is a wavelength of the exposure light, and NA is a numerical aperture of a reduction projection optical system of an exposure apparatus.

7. The method for forming a pattern according to claim 6, wherein in the step b), an off axis illumination method is used.

8. The method for forming a pattern according to claim 7, wherein a direction in which the exposure light is incident to the photomask is set such that an intensity of the exposure light with which the resist film is irradiated has a minimum value in the portion corresponding to the mask pattern in the resist film.

9. The method for forming a pattern according to claim 7, wherein a direction in which the exposure light is incident to the photomask is set such that an intensity of the exposure light with which the resist film is irradiated has a minimum value in the portion corresponding to the mask pattern in the resist film and the minimum value is smaller at a defocus position than at a best focus position.

10. The method for forming a pattern according to claim 1, wherein the resist film is a negative resist film, in the step c), the resist pattern is formed as a result of the development which removes the portion corresponding to the mask pattern in the resist film, and when a width of the portion corresponding to the mask pattern in the resist film is L, $L \leq 0.4 \times \lambda/NA$ is satisfied, where $\lambda$ is a wavelength of the exposure light, and NA is a numerical aperture of a reduction projection optical system of an exposure apparatus.

11. The method for forming a pattern according to claim 10, wherein in the step b), an off-axis illumination method is used.

12. The method for forming a pattern according to claim 11, wherein a direction in which the exposure light is incident to the photomask is set such that an intensity of the exposure light with which the resist film is irradiated has a minimum value in the portion corresponding to the mask pattern in the resist film.

13. The method for forming a pattern according to claim 11, wherein a direction in which the exposure light is incident to the photomask is set such that an intensity of the exposure light with which the resist film is irradiated has a minimum value in the portion corresponding to the mask pattern in the resist film and the minimum value is smaller at a defocus position than at a best focus position.

14. A method for forming a pattern using a photomask comprising a mask pattern having light-shielding properties with respect to exposure light provided on a transparent substrate having light-transmitting properties with respect to the exposure light, comprising the steps of:

a) forming a resist film on a substrate, b) irradiating the resist film with the exposure light through the photomask, and c) forming a resist pattern by developing the resist film irradiated with the exposure light, wherein the mask pattern includes a phase shifter that generates a phase difference of $(150+360 \times n)$ degrees or more and $(210+360 \times n)$ degrees or less, where n=an integer, with respect to the exposure light between the phase shifter and a light-transmitting portion in which the mask pattern is not formed on the transparent substrate, and a first light intensity generated in a center of a light-shielded image formation region corresponding to the mask pattern on an exposed material by the exposure light transmitted through the phase shifter is between 0.5 times and 2 times a second light intensity generated in the center of the light-shielded image formation region by the exposure light that is transmitted through a periphery of the mask pattern on the transparent substrate and goes into a back side of the mask pattern.

15. The method for forming a pattern according to claim 14, wherein the phase shifter in the photomask is obtained by forming a transparent film having a transmittance different from that of the transparent substrate with respect to the exposure light on the transparent substrate.

16. The method for forming a pattern according to claim 14, wherein
the phase shifter in the photomask is obtained by etching the transparent substrate.

17. The method for forming a pattern according to claim 14, wherein
the mask pattern in the photomask has a light-shielding film having a same outer shape, and
the phase shifter is disposed in an opening provided in the light-shielding film.

18. The method for forming a pattern according to claim 17, wherein
the light-shielding film having the same outer shape in the photomask has a transmittance of 15% or less with respect to the exposure light and generates a phase difference of (−30+360×n) degrees or more and (30+360×n) degrees or less, where n=an integer, with respect to the exposure light between the light-shielding film and the light-transmitting portion.

19. The method for forming a pattern according to claim 14, wherein
the resist film is a positive resist film,
in the step c), the resist pattern is formed as a result of the development which removes portions other than the portion corresponding to the mask pattern in the resist film, and
when a width of the portion corresponding to the mask pattern in the resist film is L,
$L \leq 0.4 \times \lambda / NA$ is satisfied,
where $\lambda$ is a wavelength of the exposure light, and NA is a numerical aperture of a reduction projection optical system of an exposure apparatus.

20. The method for forming a pattern according to claim 19, wherein in the step b), an off-axis illumination method is used.

21. The method for forming a pattern according to claim 20, wherein
a direction in which the exposure light is incident to the photomask is set such that an intensity of the exposure light with which the resist film is irradiated has a minimum value in the portion corresponding to the mask pattern in the resist film.

22. The method for forming a pattern according to claim 20, wherein
a direction in which the exposure light is incident to the photomask is set such that an intensity of the exposure light with which the resist film is irradiated has a minimum value in the portion corresponding to the mask pattern in the resist film and the minimum value is smaller at a defocus position than at a best focus position.

23. The method for forming a pattern according to claim 14, wherein
the resist film is a negative resist film,
in the step c), the resist pattern is formed as a result of the development which removes the portion corresponding to the mask pattern in the resist film, and
when a width of the portion corresponding to the mask pattern in the resist film is L,
$L \leq 0.4 \times \lambda / NA$ is satisfied,
where $\lambda$ is a wavelength of the exposure light, and NA is a numerical aperture of a reduction projection optical system of an exposure apparatus.

24. The method for forming a pattern according to claim 23, wherein in the step of b), an off-axis illumination method is used.

25. The method for forming a pattern according to claim 24, wherein
a direction in which the exposure light is incident to the photomask is set such that an intensity of the exposure light with which the resist film is irradiated has a minimum value in the portion corresponding to the mask pattern in the resist film.

26. The method for forming a pattern according to claim 24, wherein
a direction in which the exposure light is incident to the photomask is set such that an intensity of the exposure light with which the resist film is irradiated has a minimum value in the portion corresponding to the mask pattern in the resist film and the minimum value is smaller at a defocus position than at a best focus position.

* * * * *